United States Patent
Misaka

(10) Patent No.: US 6,703,168 B1
(45) Date of Patent: Mar. 9, 2004

(54) PHOTOMASK

(75) Inventor: Akio Misaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 17 days.

(21) Appl. No.: 09/869,848
(22) PCT Filed: Nov. 2, 2000
(86) PCT No.: PCT/JP00/07772
§ 371 (c)(1), (2), (4) Date: Jul. 6, 2001
(87) PCT Pub. No.: WO01/35166
PCT Pub. Date: May 17, 2001

(30) Foreign Application Priority Data

Nov. 8, 1999 (JP) .................................. 11-316752

(51) Int. Cl.[7] .................................................. G03F 9/00
(52) U.S. Cl. .............................. 430/5; 430/22; 430/30
(58) Field of Search ............................. 430/5, 22, 30; 716/19; 382/144

(56) References Cited

U.S. PATENT DOCUMENTS

| | | | | |
|---|---|---|---|---|
| 5,718,829 A | * | 2/1998 | Pierrat | 430/5 |
| 5,733,687 A | * | 3/1998 | Tanaka et al. | 430/5 |
| 5,766,805 A | * | 6/1998 | Lee et al. | 430/5 |
| 5,824,438 A | * | 10/1998 | Choi et al. | 430/5 |
| 6,044,007 A | * | 3/2000 | Capodieci | 430/30 |
| 6,083,275 A | * | 7/2000 | Heng et al. | 716/19 |

FOREIGN PATENT DOCUMENTS

| JP | 3-11345 A | 1/1991 |
|---|---|---|
| JP | 7-72612 A | 3/1995 |
| JP | 10-326005 A | 12/1998 |

OTHER PUBLICATIONS

Interantional Search Reported dated Jan. 30, 2001.

* cited by examiner

Primary Examiner—Mark F. Huff
Assistant Examiner—Kripa Sagar
(74) Attorney, Agent, or Firm—McDermott, Will & Emery

(57) ABSTRACT

An isolated light-shielding pattern formed from a light-shielding film region 101 and a phase shift region 102 is formed on a transparent substrate 100 serving as a mask. The phase shift region 102 has a phase difference with respect to a light-transmitting region of the transparent substrate 100. Moreover, the width of the phase shift region 102 is set such that a light-shielding property of the phase shift region 102 becomes at least about the same as that of a light-shielding film having the same width.

23 Claims, 32 Drawing Sheets

Fig. 8(a)
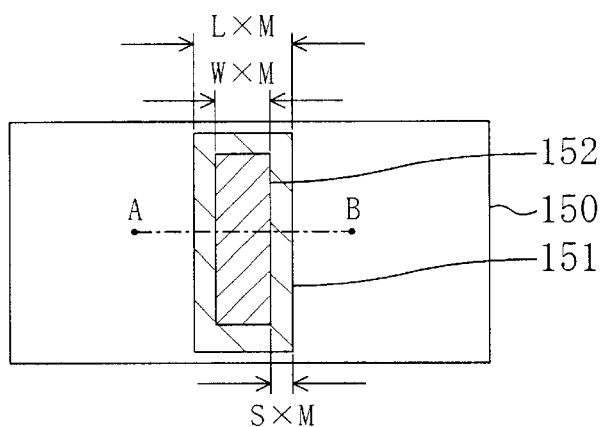
Fig. 8(b)     Fig. 8(c)     Fig. 8(d)
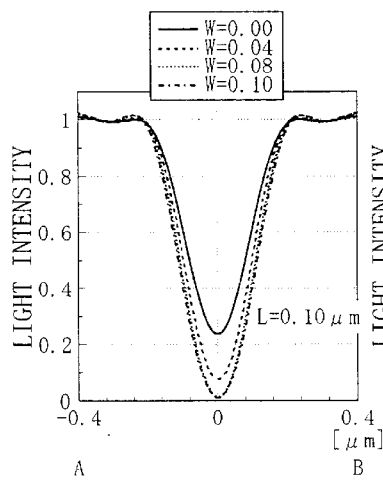 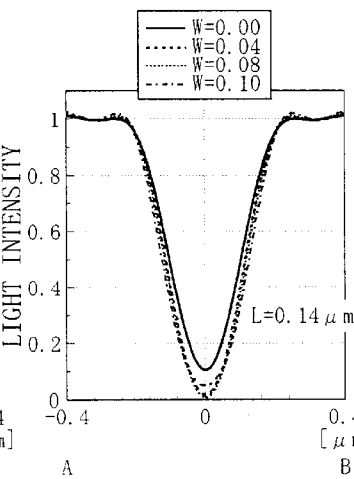 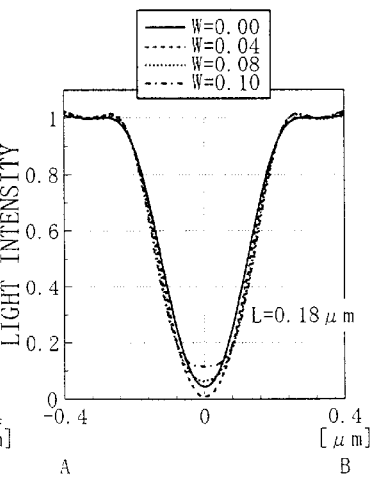
Fig. 8(e)
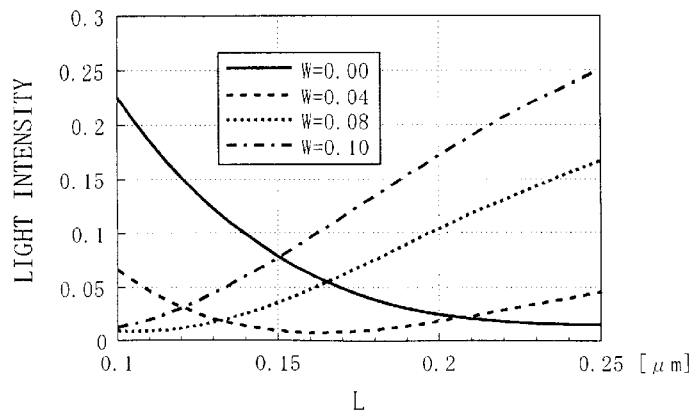

Fig. 20(a)
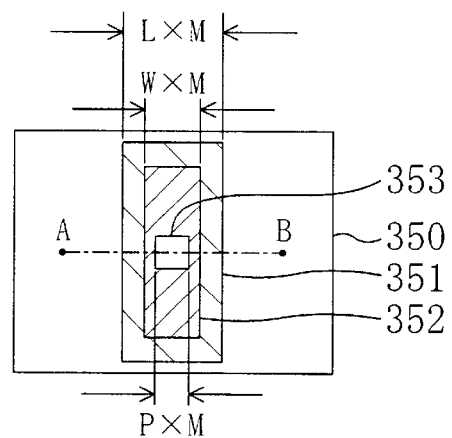
Fig. 20(b)    Fig. 20(c)    Fig. 20(d)
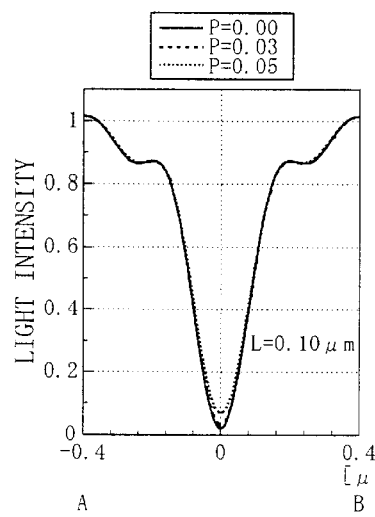 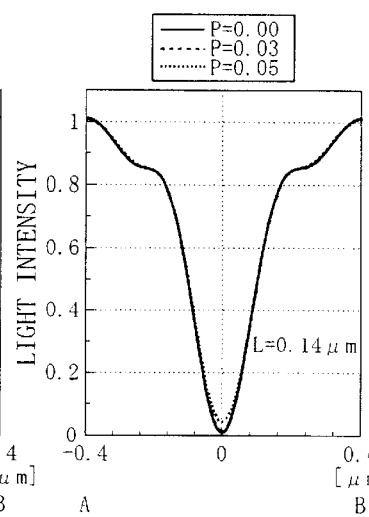 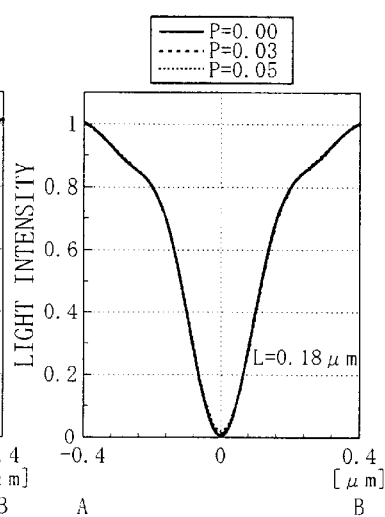

Fig. 21(a)
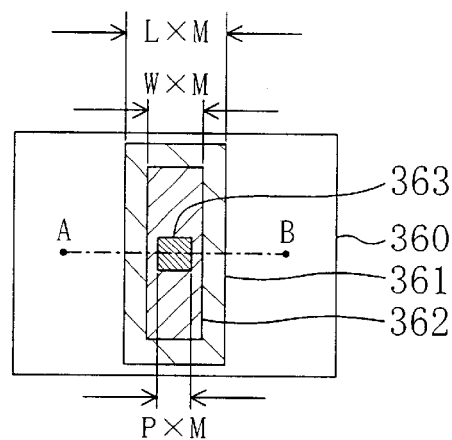
Fig. 21(b)  Fig. 21(c)  Fig. 21(d)
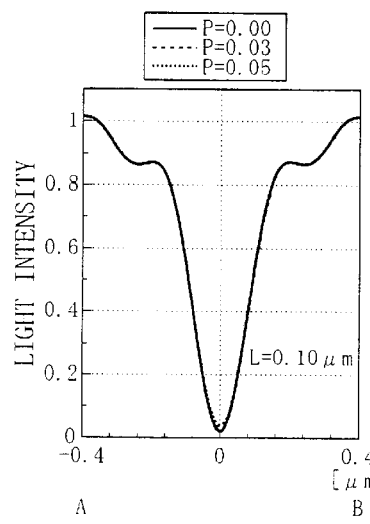 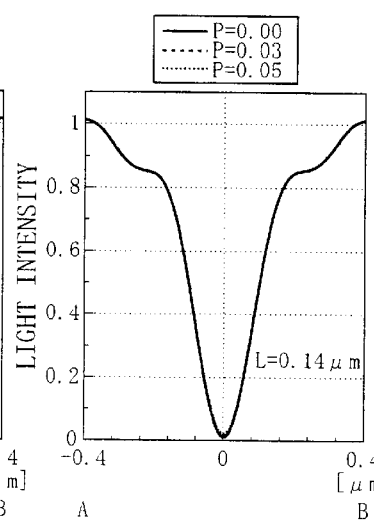 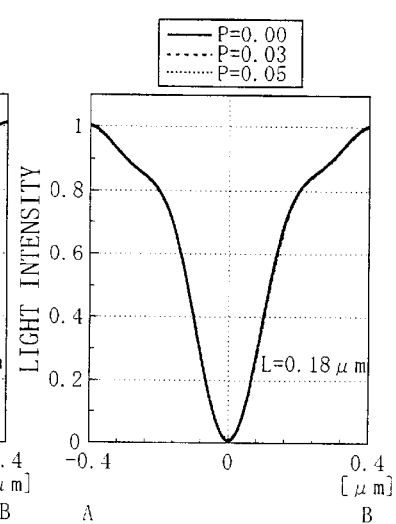

PHOTOMASK

TECHNICAL FIELD

The present invention relates to a pattern-exposure photomask for use in manufacturing semiconductor devices or liquid crystal display devices, a method for producing the same, and a patterning method using the photomask, and also relates to a method for producing photomask pattern layout, and a method for producing mask-writing data.

BACKGROUND ART

In recent years, a large-scale integrated circuit (hereinafter, referred to as LSI) implemented with a semiconductor has been increasingly reduced in size. As a result, a feature error or dimensional error between a mask pattern and a produced pattern (e.g., a resist pattern formed by pattern transfer for a resist film) have been increasingly regarded as important in a lithography process, one of the LSI manufacturing processes.

Moreover, reduction in pattern dimension in the LSI has reached about the resolution limit defined by a wavelength of a light source (hereinafter, referred to as wavelength λ), a numerical aperture of a projection optical system of an aligner (hereinafter, referred to as numerical aperture NA), and the like. As a result, a manufacturing margin associated with the yield in LSI manufacturing, e.g., a depth of focus, has also been significantly reduced.

In a conventional patterning method, a resist pattern having a prescribed feature is formed as follows: a light-shielding pattern of a prescribed feature, i.e., a mask pattern, is formed on a transparent substrate using a light-shielding film of a metal such as chromium. Then, a wafer having a resist film applied thereto is exposed to light using the transparent substrate having the mask pattern thereon as a mask, so that light intensity distribution having a profile similar to the mask pattern feature is projected to the resist film. Thereafter, the resist film is developed, whereby the resist pattern having the prescribed feature is produced.

A reduction projection aligner is generally used in such a patterning method as described above. For patterning, the reduction projection aligner conducts reduction projection exposure for a resist film of a photosensitive resin formed on a wafer, i.e., a substrate, by using a transparent substrate including a mask pattern with the dimension of a desired pattern magnified several times, i.e., by using a photomask.

FIG. 32(a) shows an example of a pattern whose minimum dimension is sufficiently larger than the resolution. FIG. 32(b) shows the simulation result of light intensity distribution projected to, e.g., a resist film upon forming the pattern of FIG. 32(a) using a conventional photomask.

More specifically, when the numerical aperture NA is 0.6 and the wavelength λ is 0.193 μm, the resolution is about 0.13 μm. However, the minimum dimension of the pattern of FIG. 32(a) is about 0.39 μm (about three times the resolution). The conventional photomask has a mask pattern having the dimension of the pattern of FIG. 32(a) magnified by the magnification M of the aligner (an inverse number of a reduction ratio). In this case, as shown in FIG. 32(b), the implemented light intensity distribution has a profile similar to the feature of the pattern of FIG. 32(a), i.e., the mask pattern. Note that FIG. 32(b) shows the light intensity distribution using contour lines of the relative light intensity in a two-dimensional relative coordinate system (i.e., the light intensity calculated with the exposure light intensity being regarded as 1).

FIG. 33(a) shows an example of a pattern whose minimum dimension corresponds to about the resolution. FIG. 33(b) shows the simulation result of light intensity distribution projected to, e.g., a resist film upon forming the pattern of FIG. 33(a) using a conventional photomask.

More specifically, when the numerical aperture NA is 0.6 and the wavelength λ is 0.193 μm, the resolution is about 0.13 μm. The minimum dimension of the pattern of FIG. 33(a) is also about 0.13 μm. The conventional photomask has a mask pattern having the dimension of the pattern of FIG. 33(a) magnified by the magnification M. In this case, as shown in FIG. 33(b), the implemented light intensity distribution is significantly distorted from the profile similar to the feature of the pattern of FIG. 32(a), i.e., the mask pattern. Note that FIG. 33(b) also shows the light intensity distribution using contour lines of the relative light intensity in a two-dimensional relative coordinate system.

More specifically, as the minimum dimension of the pattern is reduced to about the resolution, the line width of the mask pattern on the photomask is also reduced. Therefore, the exposure light is likely to be diffracted when passing through the photomask. More specifically, as the line width of the mask pattern is reduced, the exposure light is likely to reach the backside of the mask pattern. As a result, the mask pattern cannot sufficiently shield the exposure light, making it extremely difficult to form a fine pattern.

In order to form a pattern having a dimension equal to or smaller than about the resolution, H. Y. Liu et al. proposes a patterning method (first conventional example) (Proc. SPIE, Vol. 3334, P.2 (1998)). In this method, a light-shielding pattern of a light-shielding film is formed on a transparent substrate as a mask pattern, as well as a phase shifter for inverting the light transmitted therethrough by 180 degrees in phase is provided in a light-transmitting region (a portion having no light-shielding pattern) of the transparent substrate. This method utilizes the fact that a pattern having a dimension equal to or smaller than about the resolution can be formed by the light-shielding film located between the light-transmitting region and the phase shifter.

Hereinafter, the patterning method according to the first conventional example will be described with reference to FIGS. 34(a) to (d).

FIG. 34(a) is a plan view of a first photomask used in the first conventional example, and FIG. 34(b) is a cross-sectional view taken along line I—I of FIG. 34(a). As shown in FIGS. 34(a) and (b), a light-shielding film 11 is formed on a first transparent substrate 10 of the first photomask, and first and second openings 12 and 13 are formed in the light-shielding film 11 such that a light-shielding film region 11a having a width smaller than (resolution×magnification M) is interposed therebetween. The first transparent substrate 10 is recessed under the second opening 13 so as to provide a phase difference of 180 degrees between the light transmitted through the first transparent substrate 10 through the first opening 12 and the light transmitted through the first transparent substrate 10 through the second opening 13. Thus, the portion of the first transparent substrate 10 corresponding to the first opening 12 serves as a normal light-transmitting region, whereas the portion of the first transparent substrate 10 corresponding to the second opening 13 serves as a phase shifter. Therefore, a pattern having a desired line width equal to or smaller than about the resolution can be formed by the light-shielding film region 11a located between the first and second openings 12 and 13.

FIG. 34(c) is a plan view of a second photomask used in the first conventional example. As shown in FIG. 34(c), a light-shielding pattern 21 of a light-shielding film is formed on a second transparent substrate 20 of the second photomask.

In the first conventional example, a desired pattern is formed by combination of a line pattern formed by the light-shielding film region 11a of the first photomask of FIG. 34(a) and a pattern formed by the light-shielding pattern 21 of the second photomask of FIG. 34(c).

More specifically, in the first conventional example, a substrate having a positive resist film applied thereto is exposed to light using the first photomask of FIG. 34(a). Then, the substrate is adjusted in position so that a desired pattern is formed by a latent image resulting from exposure using the first photomask and a latent image resulting from exposure using the second photomask of FIG. 34(c). After exposure is subsequently conducted using the second photomask, the resist film is developed, whereby a resist pattern is formed. Thus, excessive patterns (patterns other than the desired pattern) resulting from development after exposure with the first photomask only can be removed by exposure with the second photomask. This enables formation of a pattern having a line width equal to or smaller than about the resolution, i.e., a pattern that cannot be formed by exposure with the second photomask only.

FIG. 34(d) shows a resist pattern formed by the patterning method of the first conventional example, i.e., the patterning method using the first and second photomasks of FIGS. 34(a) and 34(c).

As shown in FIG. 34(d), the exposed substrate 30 has a resist pattern 31 formed thereon, and the resist pattern 31 has a line pattern 31a having a line width equal to or smaller than about the resolution.

In addition to the method of H. Y. Liu et al., Watanabe et al. proposes another patterning method (second conventional example) (Proc. of the 51st Annual Meeting of JSAP, P490). In this method, a pattern having a line width smaller than the wavelength $\lambda$ is formed without providing a light-shielding film between a light-transmitting region and a phase shifter. This method utilizes the effect that a pattern is formed by the boundary between a normal transparent substrate portion, i.e., a light-transmitting region, and a phase shifter.

Hereinafter, the patterning method according to the second conventional example will be described with reference to FIG. 35.

FIG. 35 is a plan view of a photomask used in the second conventional example. As shown in FIG. 35, a plurality of phase shifters 41 are periodically arranged on a transparent substrate 40 of the photomask.

In the second conventional example, the use of the phase shifters 41 enables formation of a pattern in which a plurality of line patterns each having a line width smaller than the wavelength $\lambda$ are arranged periodically.

However, in order to form a pattern having a line width equal to or smaller than about the resolution, the first conventional example must use a phase shift mask (first photomask) in which a light-shielding film region having a width of (resolution×magnification M) or less is located between a phase shifter and a light-transmitting region both having a width of (resolution×magnification M) or more. In other words, the pattern formed with the first photomask has a line width equal to or smaller than about the resolution only when specific conditions are satisfied. Therefore, an arbitrary pattern feature cannot be implemented with the first photomask only.

Accordingly, in order to form a pattern having a complicated feature like in the pattern layout of a normal LSI, exposure with a mask (second photomask) different from the phase shift mask is essential in the first conventional example. This results in increase in mask costs, or reduction in throughput as well as increase in manufacturing costs due to an increased number of lithography steps.

Moreover, a normal mask, i.e., a non-phase-shift mask, is used as the second photomask. Therefore, even if the exposures using the first and second photomasks are combined, the pattern formed by the second photomask has a dimension equal to or larger than about the resolution, whereby the patterns capable of being formed with a dimension equal to or smaller than about the resolution are limited. In other words, the first conventional example is used only when the phase shifter and the light-transmitting region can be located adjacent to each other under the aforementioned conditions, e.g., when only a gate pattern on an active region is formed.

In contrast, the second conventional example, i.e., the method in which a pattern is formed without providing a light-shielding film between a light-transmitting region and a phase shifter, can be used only when the patterns each having a line width smaller than the wavelength $\lambda$ are repeated. Therefore, a pattern having an arbitrary feature or an arbitrary dimension cannot be formed by this method alone.

Moreover, in the second conventional example, a portion where the phase changes abruptly must be provided at the boundary between the light-transmitting region of the transparent substrate and the phase shifter. However, by the conventional mask formation method in which a phase shifter is formed by wet etching the transparent substrate, the transparent substrate cannot be etched vertically at the boundary of the phase shifter. Moreover, when the transparent substrate is etched, a lateral region of the phase shifter in the transparent substrate is also subjected to etching, making it difficult to control the dimension of the phase shifter. As a result, it is extremely difficult to produce a mask capable of forming a fine pattern with high precision.

In the second conventional example, the dimension of the pattern formed by utilizing the phase shift effect is limited to about half the wavelength $\lambda$. However, when a pattern having a larger dimension is formed with a mask pattern of a light-shielding film, the minimum possible dimension of the pattern corresponds to about the resolution. Accordingly, in the case where patterning is conducted using a single mask that simultaneously implements the phase shift effect and the light-shielding effect of the light-shielding film, a possible dimensional range of the pattern is discontinuous. This significantly reduces a process margin for forming a pattern of an arbitrary dimension with a single mask, and in some cases, makes it impossible to form a pattern with a single mask.

DISCLOSURE OF THE INVENTION

In view of the foregoing description, it is an object of the present invention to enable any pattern feature with any dimension including a dimension equal to or smaller than about the resolution to be formed by exposure using a single mask implementing a phase shift effect.

In order to achieve this object, the photomask according to the invention is a photomask including an isolated light-shielding pattern formed on a transparent substrate that is transparent to a light source. The light-shielding pattern is formed from a light-shielding film region formed from a light-shielding film, and a phase shift region having a phase difference with respect to a light-transmitting region of the transparent substrate which has no light-shielding pattern. A width of the phase shift region is set such that a light-shielding property of the phase shift region becomes at least about the same as that of the light-shielding film having the same width.

According to the photomask of the invention, the light-shielding pattern is formed from the light-shielding film region, and the phase shift region having a phase difference with respect to the light-transmitting region, and the width of the phase shift region is set such that the light-shielding property of the phase shift region becomes at least about the same as that of the light-shielding film having the same width. Therefore, the transmitted light reaching the backside of the light-shielding film region of the light-shielding pattern due to the diffraction phenomenon can be cancelled by the light transmitted through the phase shift region. Accordingly, even when a pattern having a dimension equal to or smaller than about the resolution is formed, light intensity distribution having a profile similar to the feature of the light-shielding pattern can be obtained. As a result, any pattern feature with any dimension including a dimension equal to or smaller than about the resolution can be formed by exposure using only the photomask of the invention implementing the phase shift effect.

In the photomask of the invention, a contour of the light-shielding film region is preferably the same as a feature of the light-shielding pattern, and the phase shift region is preferably provided inside the light-shielding film region.

Thus, the transmitted light reaching the backside of the periphery of the light-shielding pattern due to the diffraction phenomenon can be reliably cancelled by the light transmitted through the phase shift region.

In the photomask of the invention, the phase shift region is preferably provided at least at or inside a corner of the light-shielding pattern, or at or inside an end of the light-shielding pattern.

Thus, the transmitted light reaching the backside of the corner or end of the light-shielding pattern due to the diffraction phenomenon can be reliably cancelled by the light transmitted through the phase shift region.

Note that, in the specification, the term "corner" means a portion having an angle larger than zero degree and smaller than 180 degrees when measured on the pattern.

In the photomask of the invention, provided that the phase shift region has a width Wm, it is preferable that $Wm \cdot (0.4 \times \lambda/NA) \times M$ (where $\lambda$ is a wavelength of the light source, NA is a numerical aperture of a reduction projection optical system of an aligner, and M is a magnification of the reduction projection optical system).

This ensures that that the light-shielding property of the phase shift region becomes at least about the same as that of the light-shielding film having the same width.

In the photomask of the invention, provided that the light-shielding pattern in which the phase shift region is provided has a width Lm, it is preferable that $Lm \cdot (0.8 \times \lambda/NA) \times M$.

This enables a light-shielding effect of the light-shielding pattern to be improved by providing the phase shift region in the light-shielding pattern.

Provided that $Lm \cdot (0.8 \times \lambda/NA) \times M$ and the phase shift region has a width Wm, it is preferable that $Wm \cdot ((0.8 \times \lambda/NA) \times M) - Lm$ and $Wm \cdot Lm$.

This ensures improvement in the light-shielding effect of the light-shielding pattern.

Provided that $Lm \cdot (0.8 \times \lambda/NA) \times M$ and the phase shift region has a width Wm, it is preferable that $0.5 \times ((((0.8 \times \lambda/NA) \times M) - Lm)/2) \cdot Wm \cdot 1.5 \times ((((0.8 \times \lambda/NA) \times M) - Lm)/2)$ and $Wm \cdot Lm$.

This enables significant improvement in the light-shielding effect of the light-shielding pattern.

In the photomask of the invention, the phase difference of the phase shift region with respect to the light-transmitting region is preferably $(170+360 \times n)$ to $(190+360 \times n)$ degrees (where n is an integer) with respect to a wavelength of the light source.

This ensures improvement in the light-shielding effect of the light-shielding pattern.

In the photomask of the invention, the phase difference of the phase shift region with respect to the light-transmitting region is preferably provided by etching at least one of a portion corresponding to the light-transmitting region and a portion corresponding to the phase-shift region in the transparent substrate.

Thus, the phase difference can be reliably provided between the phase shift region and the light-transmitting region.

In the photomask of the invention, the phase difference of the phase shift region with respect to the light-transmitting region is preferably provided by forming a phase shifter layer either on a portion other than the light-transmitting region or a portion other than the phase-shift region in the transparent substrate.

Thus, the phase difference can be reliably provided between the phase shift region and the light-transmitting region. The phase shifter layer may either be formed under or above the light-shielding film region.

A patterning method according to the invention is a patterning method using the photomask of the invention, and includes the steps of: forming a resist film on a substrate; conducting pattern exposure to the resist film using the photomask; and developing the resist film subjected to the pattern exposure so as to form a resist pattern.

According to the patterning method of the invention, the photomask of the invention is used. Therefore, even when a pattern having a dimension equal to or smaller than about the resolution is formed, the resultant light-shielding effect of the light-shielding pattern is about the same as that obtained when a pattern having a dimension equal to or larger than about the resolution is formed. As a result, any pattern feature with any dimension including a dimension equal to or smaller than about the resolution can be formed by exposure using only the photomask of the invention.

In the patterning method of the invention, the step of conducting pattern exposure preferably uses an oblique incidence illumination method.

This enables improvement in a process margin such as a depth of focus for a fine pattern.

In the patterning method of the invention, the resist film is preferably formed from a positive resist.

Thus, a fine resist pattern can be reliably formed by pattern exposure using the photomask of the invention. A negative resist may be used in order to form a fine resist-removed region like a hole pattern.

A method for producing a photomask according to the invention is a method for producing a photomask including an isolated light-shielding pattern formed on a transparent substrate that is transparent to a light source, the isolated light-shielding pattern being formed from a light-shielding film region and a phase shift region. The method includes the steps of: forming a light-shielding film on the transparent substrate; patterning the light-shielding film so as to form a contour of the light-shielding film region; and removing a portion of the light-shielding film located in the phase shift region so as to form an opening. The phase shift region has a phase difference with respect to a light-transmitting region of the transparent substrate, and a width of the phase shift region is set such that a light-shielding property of the phase shift region becomes at least about the same as that of the light-shielding film having the same width.

According to the photomask producing method of the invention, the patterning step for forming the contour of the light-shielding film region is conducted independently of the patterning step for forming the opening serving as the phase shift region. This enables accurate dimensional control of the contour of the light-shielding film region, i.e., the light-shielding pattern, and the phase shift region. Thus, the photomask of the invention can be reliably produced.

In the photomask producing method of the invention, the step of forming the opening preferably includes the step of etching, after forming the opening, a portion of the transparent substrate located under the opening such that a phase difference of (170+360×n) to (190+360×n) degrees (where n is an integer) with respect to a wavelength of the light source is provided between the portion and the light-transmitting region.

Thus, the phase shift region can be formed so as to reliably improve the light-shielding effect of the light-shielding pattern. In this case, the step of forming the opening is preferably conducted prior to the step of forming the contour of the light-shielding film region. This enables the transparent substrate to be etched using the light-shielding film with the opening as a mask. This eliminates the need to conduct formation of the opening and etching of the substrate successively by using a resist pattern as in the case where the opening is formed after formation of the contour of the light-shielding film region. Accordingly, production of the photomask of the invention is facilitated.

In the photomask producing method of the invention, the step of forming the contour of the light-shielding film region preferably includes the step of etching, after forming the contour of the light-shielding film region, a portion of the transparent substrate located outside the light-shielding film region such that a phase difference of (170+360×n) to (190+360×n) degrees (where n is an integer) with respect to a wavelength of the light source is provided between the portion and the phase shift region.

Thus, the phase shift region can be formed so as to reliably improve the light-shielding effect of the light-shielding pattern. Moreover, production of the photomask of the invention is facilitated as compared to the case where the phase difference is provided between the light-transmitting region and the phase shift region by etching the transparent substrate located under the opening having a small area.

In the photomask producing method of the invention, the step of forming the light-shielding film preferably includes the step of forming under the light-shielding film a phase shifter layer that provides phase inversion of (170+360×n) to (190+360×n) degrees (where n is an integer) with respect to a wavelength of the light source, and the step of forming the opening preferably includes the step of removing, after forming the opening, a portion of the phase shifter layer located under the opening.

Thus, the phase shift region can be formed so as to reliably improve the light-shielding effect of the light-shielding pattern. Moreover, management of the etching step is facilitated as compared to the case where the phase difference is provided between the light-transmitting region and the phase shift region by etching the transparent substrate. Thus, the phase error is reduced as well as the phase shifter layer with a vertical edge can be easily formed. In this case, the step of forming the opening is preferably conducted prior to the step of forming the contour of the light-shielding film region. This enables the phase shifter layer to be etched using the light-shielding film with the opening as a mask. This eliminates the need to conduct formation of the opening and etching of the shifter layer successively by using a resist pattern as in the case where the opening is formed after formation of the contour of the light-shielding film. Accordingly, production of the photomask of the invention is facilitated.

In the photomask producing method of the invention, the step of forming the light-shielding film preferably includes the step of forming under the light-shielding film a phase shifter layer that provides phase inversion of (170+360×n) to (190+360×n) degrees (where n is an integer) with respect to a wavelength of the light source, and the step of forming the contour of the light-shielding film region preferably includes the step of removing, after forming the contour of the light-shielding film region, a portion of the phase shifter layer located outside the light-shielding film region.

Thus, the phase shift region can be formed so as to reliably improve the light-shielding effect of the light-shielding pattern. Moreover, management of the etching step is facilitated as compared to the case where the phase difference is provided between the light-transmitting region and the phase shift region by etching the transparent substrate. Thus, the phase error is reduced as well as the phase shifter layer with a vertical edge can be easily formed. Moreover, production of the photomask of the invention is facilitated as compared to the case where the phase difference is provided between the light-transmitting region and the phase shift region by removing the phase shifter layer located under the opening having a small area. In this case, the step of forming the contour of the light-shielding film region is preferably conducted prior to the step of forming the opening. This enables the phase shifter layer to be etched using as a mask the light-shielding film having the contour of the light-shielding film but having no opening. This eliminates the need to conduct formation of the contour of the light-shielding film region and etching of the shifter layer successively by using a resist pattern as in the case where the contour of the light-shielding film region is formed after formation of the opening. Accordingly, production of the photomask of the invention is facilitated.

In the photomask producing method of the invention, the step of forming the opening is preferably conducted prior to the step of forming the contour of the light-shielding film region, the method preferably further includes, between the step of forming the opening and the step of forming the contour of the light-shielding film region, the step of forming on the transparent substrate a phase shifter layer that provides phase inversion of (170+360×n) to (190+360×n) degrees (where n is an integer) with respect to a wavelength of the light source, and the step of forming the contour of the light-shielding film region preferably includes the step of removing, before forming the contour of the light-shielding film region, a portion of the phase shifter layer located outside the light-shielding film region.

Thus, the phase shift region can be formed so as to reliably improve the light-shielding effect of the light-shielding pattern. Moreover, management of the etching step is facilitated as compared to the case where the phase difference is provided between the light-transmitting region and the phase shift region by etching the transparent substrate. Thus, the phase error is reduced as well as the phase shifter layer with a vertical edge can be easily formed.

Moreover, if defects are produced in the step of patterning the phase shifter layer, it is possible to repair the defects by forming the phase shifter layer again. Therefore, the steps earlier than the step of forming the phase shifter layer need not be repeated, improving the throughput.

In the photomask producing method of the invention, the step of forming the contour of the light-shielding film region is preferably conducted prior to the step of forming the opening, the method preferably further includes, between the step of forming the contour of the light-shielding film region and the step of forming the opening, the step of forming on the transparent substrate a phase shifter layer that provides phase inversion of (170+360×n) to (190+360×n) degrees (where n is an integer) with respect to a wavelength of the light source, and the step of forming the opening preferably includes the step of removing, before forming the opening, a portion of the phase shifter layer located in the phase shift region.

Thus, the phase shift region can be formed so as to reliably improve the light-shielding effect of the light-shielding pattern. Moreover, management of the etching step is facilitated as compared to the case where the phase difference is provided between the light-transmitting region and the phase shift region by etching the transparent substrate. Thus, the phase error is reduced as well as the phase shifter layer with a vertical edge can be easily formed. Moreover, if defects are produced in the step of patterning the phase shifter layer, it is possible to repair the defects by forming the phase shifter layer again. Therefore, the steps earlier than the step of forming the phase shifter layer need not be repeated, improving the throughput.

In the photomask producing method of the invention, provided that the phase shift region has a width Wm, it is preferable that Wm·(0.4×λ/NA)×M (where λ is a wavelength of the light source, NA is a numerical aperture of a reduction projection optical system of an aligner, and M is a magnification of the reduction projection optical system).

This ensures that that the light-shielding property of the phase shift region becomes at least about the same as that of the light-shielding film having the same width.

In the photomask producing method of the invention, provided that the light-shielding pattern in which the phase shift region is provided has a width Lm, it is preferable that Lm·(0.8×λ/NA)×M.

This enables a light-shielding effect of the light-shielding pattern to be improved by providing the phase shift region in the light-shielding pattern.

Provided that Lm·(0.8×λ/NA)×M and the phase shift region has a width Wm, it is preferable that Wm·((0.8×λ/NA)×M)−Lm and Wm·Lm.

This ensures improvement in the light-shielding effect of the light-shielding pattern.

Provided that Lm·(0.8×λ/NA)×M and the phase shift region has a width Wm, it is preferable that 0.5×((((0.8×λ/NA)×M)−Lm)/2)·W·1.5×((((0.8×λ/NA)×M)−Lm)/2) and Wm·Lm.

This enables significant improvement in the light-shielding effect of the light-shielding pattern.

A method for producing pattern layout according to the invention is a method for producing pattern layout of a photomask including an isolated light-shielding pattern formed on a transparent substrate that is transparent to a light source, the isolated light-shielding pattern being formed from a light-shielding film region and a phase shift region. The method includes the steps of: extracting from the patter layout corresponding to the light-shielding pattern a line pattern having a width L×M equal to or smaller than (0.8×λ/NA)×M (where λ is a wavelength of the light source, NA is a numerical aperture of a reduction projection optical system of an aligner, and M is a magnification of the reduction projection optical system); and providing inside the extracted line pattern a phase shift region having a width W×M equal to or smaller than ((0.8×λ/NA)−L)×M (where W·L).

According to the pattern-layout producing method of the invention, a line pattern having a width L×M equal to or smaller than (0.8×λ/NA)×M is extracted from the pattern layout corresponding to the light-shielding pattern, and then a phase shift region having a width W×M equal to or smaller than ((0.8×λ/NA)−L)×M (where W·L) is provided inside the extracted line pattern. Therefore, the phase shift region, i.e., mask enhancer, capable of enhancing the light-shielding effect can be provided in the portion of the light-shielding pattern having a degraded light-shielding effect, whereby the light intensity distribution can be projected onto the wafer with a less distorted profile with respect to the pattern layout. This enables production of the pattern layout of the photomask capable of forming any pattern feature with any dimension including a dimension equal to or smaller than about the resolution.

In the pattern layout producing method of the invention, it is preferable that 0.5×(((0.8×λ/NA)−L)/2) W·1.5×(((0.8×λ/NA)−L)/2) and W·L.

This enables significant improvement in the light-shielding effect of the light-shielding pattern.

In the pattern layout producing method of the invention, the step of extracting the line pattern preferably includes the step of extracting a pattern corner or a pattern end from the pattern layout, and the step of providing the phase shift region preferably includes the step of providing at or inside the extracted pattern corner, or at or inside the extracted pattern end, the phase shift region with four sides of (0.5×λ/NA)×M or less.

Thus, the transmitted light reaching the backside of the corner or end of the light-shielding pattern due to the diffraction phenomenon can be reliably cancelled by the light transmitted through the phase shift region.

A method for producing mask-writing data according to the invention is a method for producing mask-writing data of a photomask including an isolated light-shielding pattern formed on a transparent substrate that is transparent to a light source, the isolated light-shielding pattern being formed from a light-shielding film region and a phase shift region having a phase difference with respect to a light-transmitting region of the transparent substrate. The method includes the step of: extracting from pattern layout corresponding to the light-shielding pattern a line pattern having a width L×M equal to or smaller than (0.8×λ/NA)×M) (where λ is a wavelength of the light source, NA is a numerical aperture of a reduction projection optical system of an aligner, and M is a magnification of the reduction projection optical system), and providing inside the extracted line pattern the phase shift region having a width W×M equal to or smaller than ((0.8×λ/NA)−L)×M (where W·L) so as to maximize a light-shielding effect of the light-shielding pattern, and thereafter, adjusting a dimension of the phase shift region based on a result of test exposure or exposure simulation.

According to the mask-writing data producing method of the invention, the dimension of the phase shift region is adjusted based on the result of test exposure or exposure simulation after the phase shift region is provided so as to maximize the light-shielding effect of the light-shielding pattern. Therefore, the dimension of the phase shift region can be adjusted so that the dimension of the pattern resulting from exposure with the photomask becomes equal to the design value. Accordingly, mask-writing data capable of preventing withdrawal of the pattern and the like can be produced, whereby a fine pattern can be accurately formed by exposure with the photomask formed according to the mask-writing data.

In the mask-writing data producing method of the invention, the step of adjusting the dimension of the phase shift region preferably includes the step of reducing a width of the phase shift region corresponding to a portion having a pattern width larger than a design value as a result of exposure with the photomask, and increasing a width of the phase shift region corresponding to a portion having a pattern width smaller than the design value as a result of exposure with the photomask.

This ensures that the pattern resulting from exposure with the photomask has a dimension equal to the design value.

BRIEF DESCRIPTION OF THE DRAWINGS

FIG. 8(a) is a plan view of a photomask of the first embodiment of the invention, FIGS. 8(b) to (d) are diagrams showing the simulation result of light intensity distribution of the light transmitted between two points A and B of the mask of FIG. 8(a), using the width L of 0.10$\mu$m, 0.14 $\mu$m and 0.18 $\mu$m, respectively, and various widths W, and FIG. 8(e) is a diagram showing the simulation result of a change in light intensity of the light transmitted through the center of a light-shielding pattern on the mask of FIG. 8(a), using various widths L and various widths W;

FIG. 20(a) is a diagram showing the state where a defect causing no phase inversion is present within the mask enhancer of the photomask of the first embodiment of the invention, and FIGS. 20(b) to (d) are diagrams showing the simulation result of light intensity distribution of the light transmitted between two points A and B of the mask of FIG. 20(a), wherein the width L was 0.10 μm, 0.14 μm and 0.18 μm, respectively;

FIG. 21(a) is a diagram showing the state where an etching residue of the light-shielding film is left within the mask enhancer of the photomask of the first embodiment of the invention, and FIGS. 21(b) to (d) are diagrams showing the simulation result of light intensity distribution of the light transmitted between two points A and B of the mask of FIG. 21(a), wherein the width L was 0.10 μm, 0.14 μm and 0.18 μm, respectively;

BEST MODE FOR CARRYING OUT THE INVENTION

First Embodiment

Hereinafter, a photomask according to the first embodiment of the invention will be described with reference to the figures. Note that, in the first embodiment, NA indicates a numerical aperture (e.g., 0.6) of a reduction projection optical system of an aligner, λ indicates a wavelength (e.g., 0.193 μm) of exposure light, i.e., a light source, and M indicates a magnification (e.g., 4 or 5) of the reduction projection optical system of the aligner.

Figure 1:
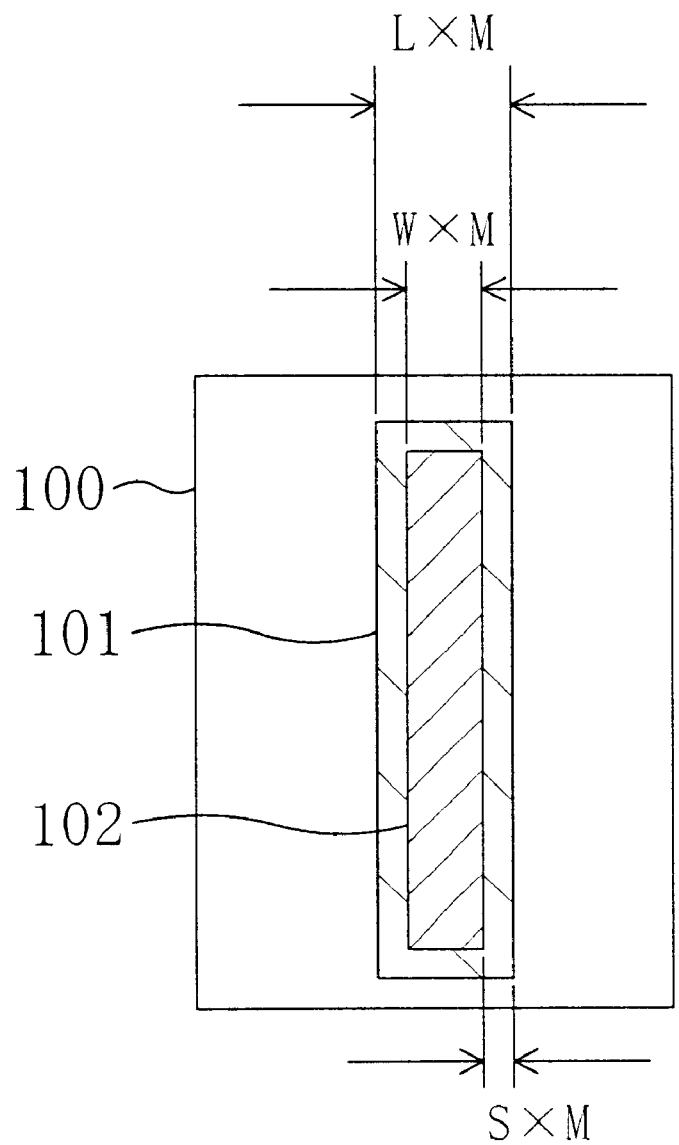
FIG. 1 is a diagram showing the basic structure of a photomask according to a first embodiment of the invention.

FIG. 1 shows the basic structure of the photomask according to the first embodiment.

As shown in FIG. 1, a light-shielding film region 101 of a light-shielding film is formed on a transparent substrate 100, and a phase shift region 102 is provided inside the light-shielding film region 101. The width of the light-shielding film region 101 including the phase shift region 102 is L×M, the width of the phase shift region 102 is W×M, and the width of the portion of the light-shielding film region 101 surrounding the phase shift region 102 is S×M. The phase shift region 102 is formed as follows: for example, an opening having the same contour as that of the phase shift region 102 is formed in the light-shielding film of the light-shielding film region 101, and the transparent substrate 100 located under the opening is removed down to such a depth that produces an optical path difference corresponding to half the wavelength (converted based on the wavelength λ) of the transmitted light. Thus, light transmitted through the phase shift region 102 has a phase difference of about 180 degrees from the light transmitted through the light-transmitting region (the portion including neither the light-shielding film region 101 nor the phase shift region 102) of the transparent substrate 100.

The first embodiment is characterized in that a light-shielding pattern is formed from the light-shielding film region 101 and the phase-shift region 102. In other words, by using, e.g., the photomask of FIG. 1, a pattern having a width L can be formed on the wafer. For example, it is now assumed that the dimension of a desired pattern (or a design value) on the wafer is 0.1 μm, L=0.1 μm. When an aligner with magnification M=4 is used, the dimension of the light-shielding pattern on the photomask is M×L=0.1×4=0.4 μm.

Figure 2:
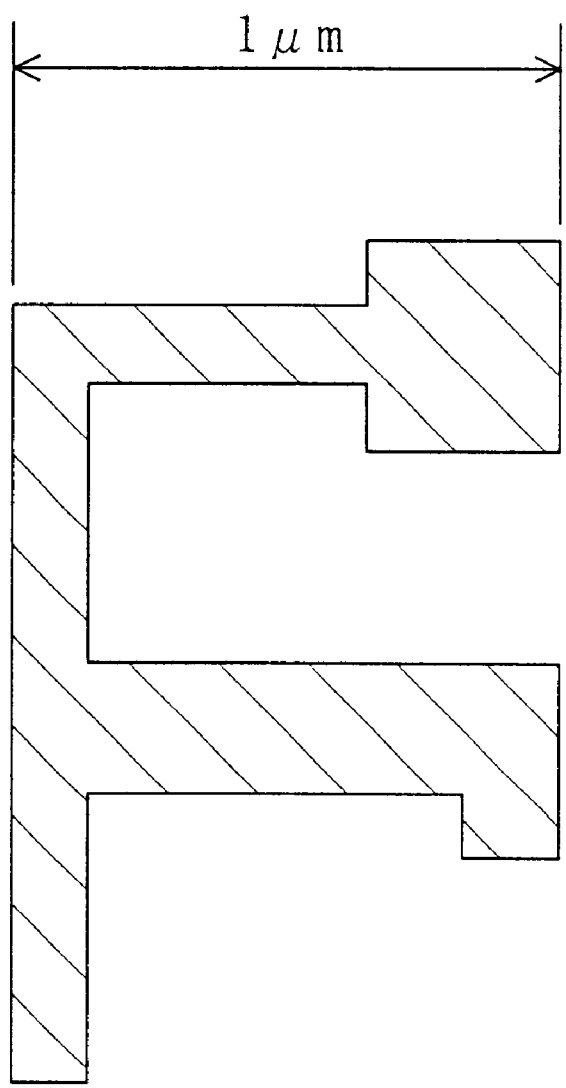
FIG. 2 is a plan view of a desired design pattern to be formed on a substrate to be exposed.

FIG. 2 is a plan view of a desired design pattern to be formed on the substrate to be exposed.

Figure 3A:
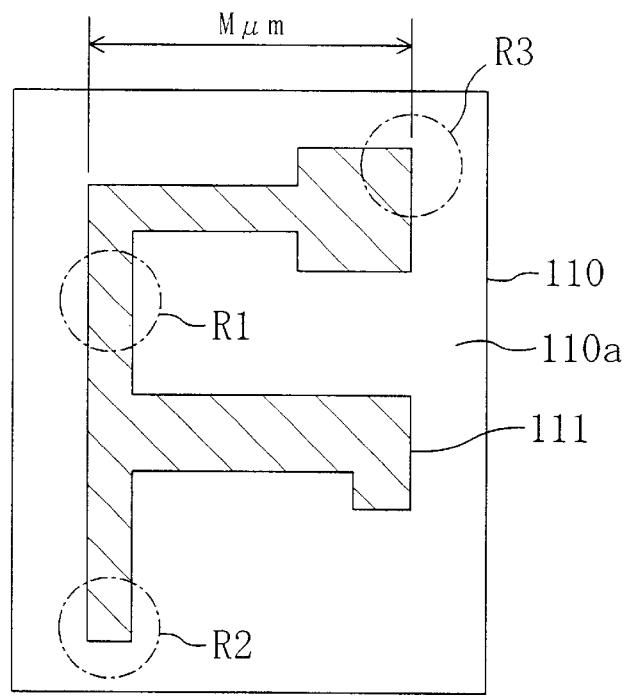
FIG. 3(a) is a plan view of a photomask of a first comparative example for forming the pattern of FIG. 2.

FIG. 3(a) is a plan view of a photomask of a first comparative example for forming the pattern of FIG. 2.

As shown in FIG. 3(a), in the photomask of the first comparative example, a light-shielding pattern 111 formed only from a light-shielding film such as a chromium film is formed on a transparent substrate 110 of a material that is highly transparent to an exposure light source, such as glass.

The light-shielding pattern 111 has the dimension of a desired pattern (normally, a design value) multiplied by M. For example, when the outer width of the desired pattern is 1 μm, the outer width of the light-shielding pattern 111 is M μm. Note that, a region 110a located outside the light-shielding pattern 111 in the transparent substrate 110 serves as a light-transmitting region. As the exposure light source, i-line (365 nm), KrF excimer laser light (248 nm), ArF excimer laser light (193 nm), or F2 excimer laser light (157 nm) or the like can be used.

Figure 3B:
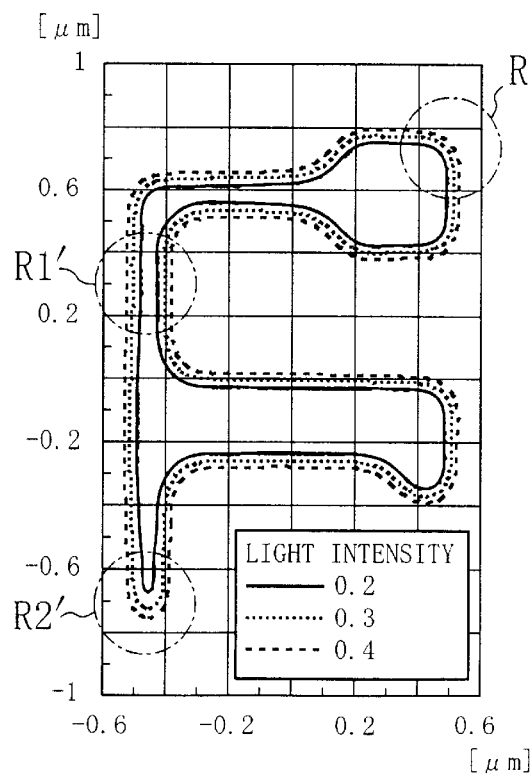
FIG. 3(b) is a diagram showing the simulation result of light intensity distribution projected to a resist film when the resist film is subjected to exposure using the photomask of the first comparative example.

FIG. 3(b) shows the simulation result of light intensity distribution projected to a resist film when the resist film is subjected to exposure using the photomask of FIG. 3(a). Note that the simulation of light intensity distribution was conducted under the following optical conditions: wavelength λ=0.193 μm; numerical aperture NA=0.6; and coherence σ=0.8. FIG. 3(b) shows the light intensity distribution using contour lines of the relative light intensity in a two-dimensional relative coordinate system.

When the photomask of FIG. 3(a) is used, light reaches the backside of the light-shielding film of the light-shielding pattern 111 at locations such as a portion having a narrow line width (e.g., region R1), a line end (e.g., region R2) or a pattern corner (corner; e.g., region R3), due to the diffraction phenomenon. Accordingly, the exposure light cannot sufficiently be shielded using the light-shielding pattern 111 as a mask. As a result, as shown in FIG. 3(b), the light intensity distribution is significantly deformed from the profile similar to the feature of the light-shielding pattern 111, i.e., desired pattern. Moreover, in a region where a pattern having a line width equal to or smaller than about the resolution determined by the aforementioned optical conditions, specifically, a line width of about 0.13 μm or less, is to be formed (e.g., region R1' or R2'), the light intensity distribution has an increased distance between contour lines of the relative light intensity. As a result, variation in pattern dimension resulting from variation in exposure energy is increased. Thus, an exposure margin of the resist film is reduced, making it extremely difficult to obtain a stable pattern feature.

Figure 3C:
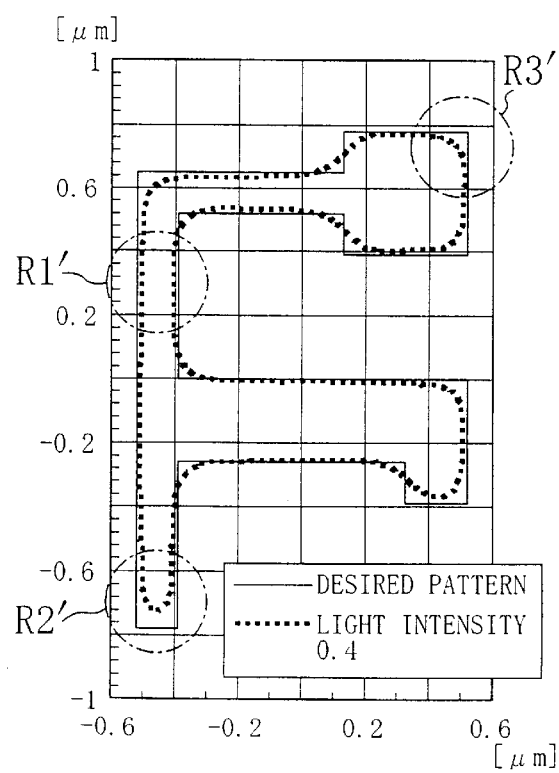
FIG. 3(c) is a diagram showing the comparison result between a desired pattern feature and a profile of a contour line of the light intensity that represents the resist pattern feature in the simulation result of FIG. 3(b)

FIG. 3(c) shows the comparison result between the desired pattern feature and the profile of a contour line of the relative light intensity of FIG. 3(b), i.e., a contour line that is considered to represent the resist pattern feature produced by development of the resist film.

As shown in FIG. 3(c), in the expected resist pattern feature, a line end (e.g., region R2') or a pattern corner (e.g., region R3') is withdrawn from the desired pattern feature, and a portion having a line width of about 0.13 μm (resolution) or less (e.g., region R1') is narrower than the desired pattern feature.

Therefore, the inventor produced a photomask of the first embodiment, i.e., a photomask having a phase shift region within a light-shielding pattern, for example, inside a portion of the light-shielding pattern having a line width of about (M×resolution) or less, at a line end, or at a pattern corner. These phase shift regions provide the light transmitted therethrough with a phase difference of about 180 degrees with respect to the light transmitted through a normal light-transmitting region.

Figure 4A:
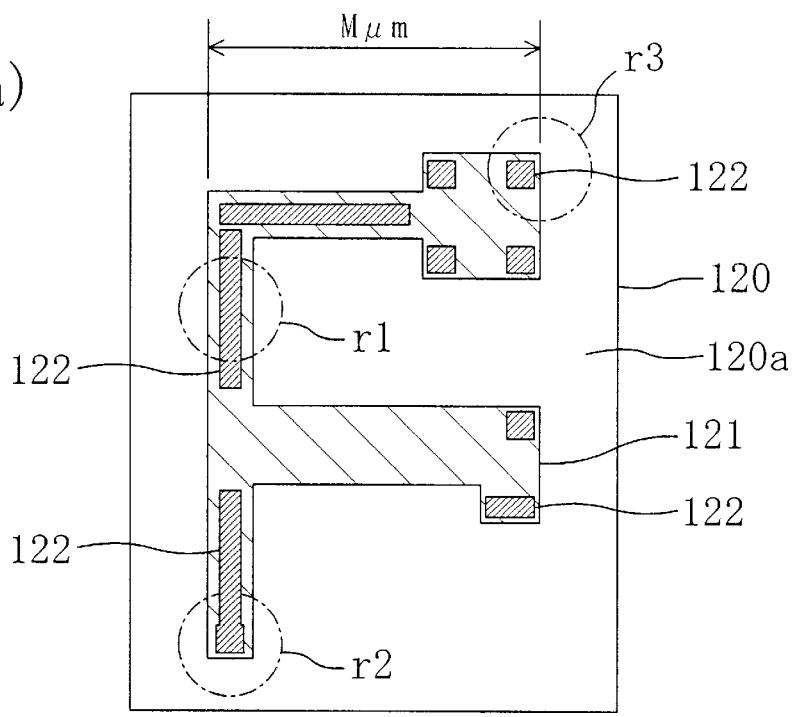
FIG. 4(a) is a plan view of the photomask of the first embodiment of the invention for forming the pattern of FIG. 2.

FIG. 4(a) is a plan view of the photomask of the first embodiment for forming the pattern of FIG. 2.

As shown in FIG. 4(a), in the photomask of the first embodiment, a light-shielding film region 121 formed from a light-shielding film such as a chromium film is formed on a transparent substrate 120. The outer dimension of the light-shielding film region 121 corresponds to the dimension of a desired pattern multiplied by M. For example, when the outer width of the desired pattern is 1 μm, the outer width of the light-shielding film region 121 is M μm. Note that, a region 120a located outside the light-shielding film region 121 in the transparent substrate 120 serves as a light-transmitting region. Moreover, phase shift regions 122 are formed inside the light-shielding region 121. The phase shift regions 122 provide the light transmitted therethrough with a phase difference of about 180 degrees from the light transmitted through the light-transmitting region 120a and have an approximately equivalent transmittance to that of the light-transmitting region 120a. Moreover, a light-shielding pattern is formed from the light-shielding film region 121 and the phase shift regions 122.

More specifically, the phase shift regions 122 are provided in the light-shielding pattern at locations such as inside a portion having a line width of about M×0.13 μm (resolution) or less (e.g., region r1), at a line end (e.g., region r2) or at a pattern corner (e.g., region r3). The phase shift region 122 is formed as follows: for example, an opening having the same contour as that of the phase shift region 122 is formed in the light-shielding film of the light-shielding film region 121, and the transparent substrate 120 located under the opening is removed down to such a depth that produces an optical path difference corresponding to half the wavelength (converted based on the wavelength λ) of the transmitted light.

Figure 4B:
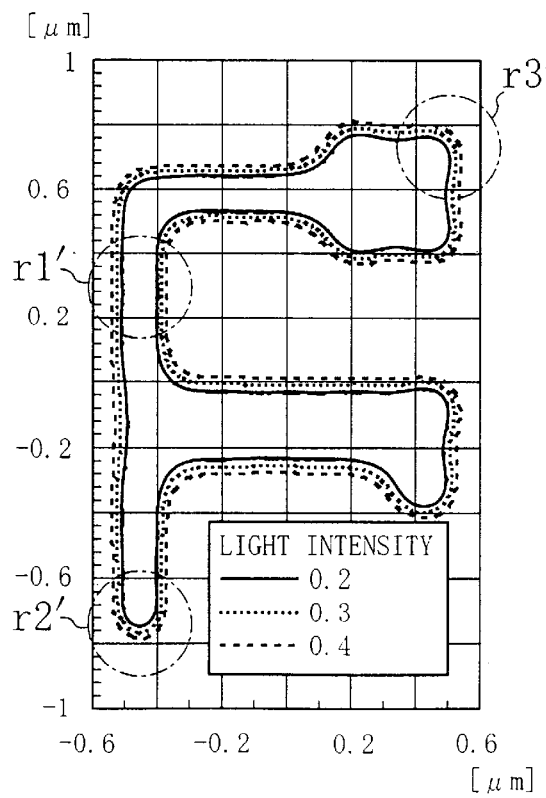
FIG. 4(b) is a diagram showing the simulation result of light intensity distribution projected to a resist film when the resist film is subjected to exposure using the photomask of the first embodiment.

FIG. 4(b) shows the simulation result of light intensity distribution projected to a resist film when the resist film is subjected to exposure using the photomask of FIG. 4(a). Note that the simulation of light intensity distribution was conducted under the following optical conditions: wavelength $\lambda=0.193$ μm; numerical aperture NA=0.6; and coherence σ=0.8. FIG. 4(b) shows the light intensity distribution using contour lines of the relative light intensity in a two-dimensional relative coordinate system.

As shown in FIG. 4(b), the light intensity distribution obtained by the photomask of FIG. 4(a) has a profile similar to the feature of a light-shielding pattern formed from the light-shielding film region 121 and the phase shift regions 122, i.e., a desired pattern. As a whole, the light intensity distribution has a small distance between contour lines of the relative light intensity. As a result, variation in pattern dimension resulting from variation in exposure energy is reduced. Thus, an exposure margin of the resist film is increased, thereby facilitating formation of a stable pattern feature.

Figure 4C:
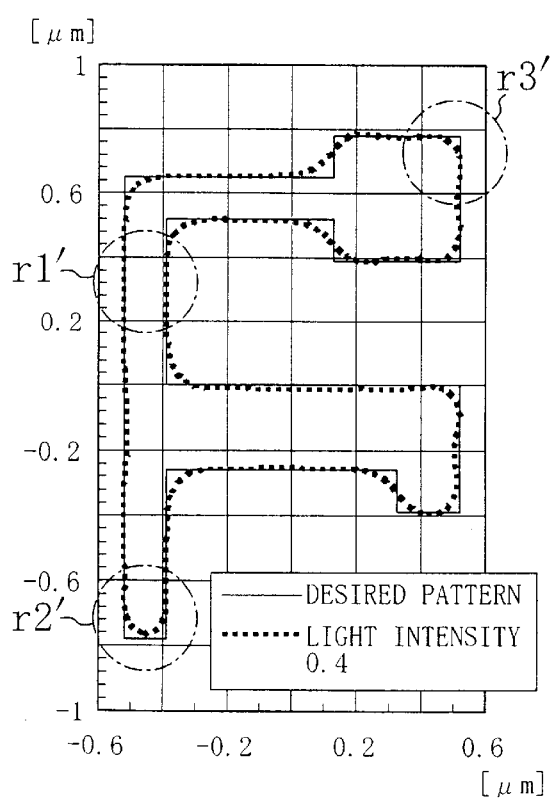
FIG. 4(c) is a diagram showing the comparison result between a desired pattern feature and a profile of a contour line of the light intensity that represents the resist pattern feature in the simulation result of FIG. 4(b)

FIG. 4(c) shows the comparison result between the desired pattern feature and the profile of a contour line of the relative light intensity of FIG. 4(b), i.e., a contour line that is considered to represent the resist pattern feature produced by development of the resist film.

As shown in FIG. 4(c), in the expected resist pattern feature, a line end (e.g., region r2') or a pattern corner (e.g., region r3') is not withdrawn from the desired pattern feature, or a portion having a line width of about 0.13 μm (resolution) or less (e.g., region r1') does not become narrower than the desired pattern feature, as opposed to the case where the photomask of the first comparative example is used. In other words, the use of the photomask of the first embodiment enables formation of a desired pattern feature.

From the aforementioned results, the inventor found the principle that the phase shift region exhibits a better light-shielding property than that of the light-shielding film region when the light-transmitting region and the phase shift region having a phase difference of 180 degrees with respect to the light-transmitting region are arranged on the photomask so as to satisfy prescribed conditions.

In order to specify the prescribed conditions, the light-shielding property of the structure using only the light-shielding film or phase shifter as a light-shielding pattern will now be described with reference to the figures.

Figure 5A:
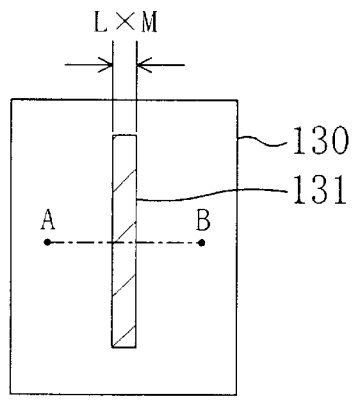
FIG. 5(a) is a plan view of a photomask of a second comparative example.

FIG. 5(a) is a plan view of a mask with a light-shielding pattern formed on a transparent substrate, wherein the light-shielding pattern is formed only from a light-shielding film (hereinafter, this mask is referred to as a photomask of the second comparative example). As shown in FIG. 5(a), an isolated line pattern 131 having a width of (L×M) is formed from a light-shielding film such as a chromium film on a transparent substrate 130.

Figure 5B:
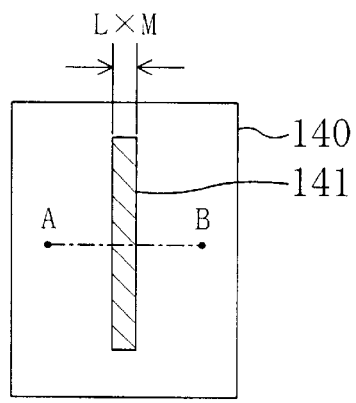
FIG. 5(b) is a plan view of a photomask of a third comparative example.

FIG. 5(b) is a plan view of a mask with a light-shielding pattern formed on a transparent substrate, wherein the light-shielding pattern is formed only from a phase shifter (hereinafter, this mask is referred to as a photomask of the third comparative example). As shown in FIG. 5(b), an isolated line pattern 141 having a width of (L×M) is formed from a phase shifter on a transparent substrate 140.

Figure 5C:
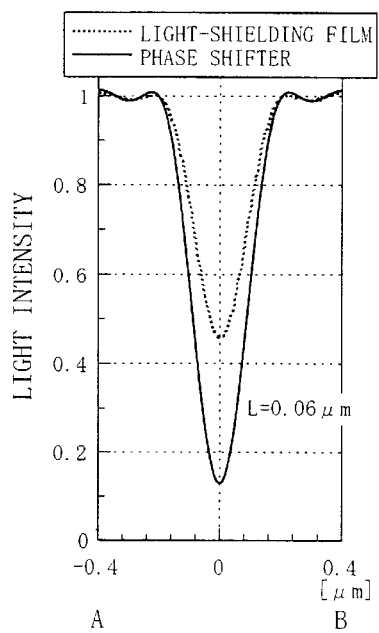
FIGS. 5(c) to (e) are diagrams showing the simulation result of light intensity distribution of the light transmitted between two points A and B of the photomasks of the second and third comparative examples, wherein the width L was 0.06 $\mu$m, 0.10 $\mu$m and 0.16 $\mu$m, respectively.
Figure 5D:
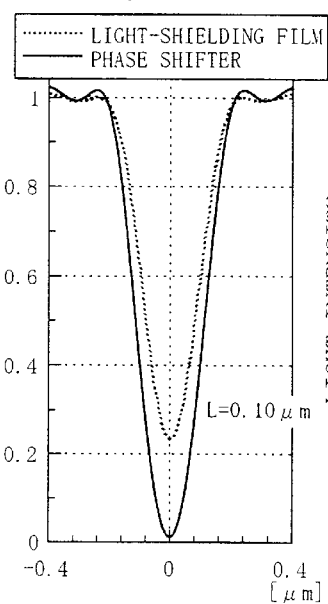
Figure 5E:
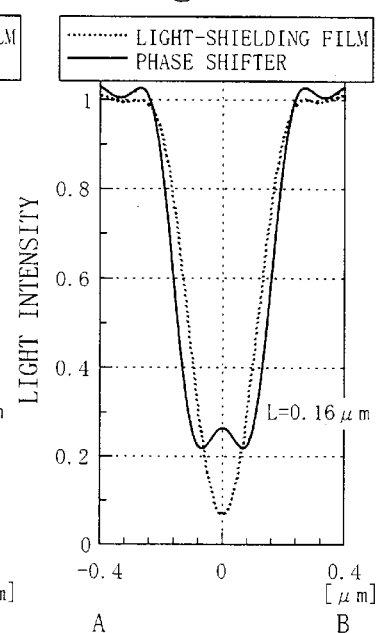

FIGS. 5(c) to (e) show the simulation result of light intensity (relative light intensity) distribution of the light transmitted between two points A and B of the photomasks of the second and third comparative examples, wherein the width L was 0.06 μm, 0.10 μm and 0.16 μm, respectively (optical conditions: wavelength $\lambda=0.193$ μm; numerical aperture NA=0.6; and coherence σ=0.8). Note that, in FIGS. 5(c) to (e), the dotted line indicates the light intensity distribution of the light transmitted between two points A and B of the photomask of the second comparative example, and the solid line indicates the light intensity distribution of the light transmitted between two points A and B of the photomask of the third comparative example. In FIGS. 5(c) to (e), it can be determined that each mask has a greater light-shielding effect as the light intensity at the origin of the abscissa, i.e., in the center of the isolated line pattern 131 or isolated line pattern 141 is lower.

Figure 5F:
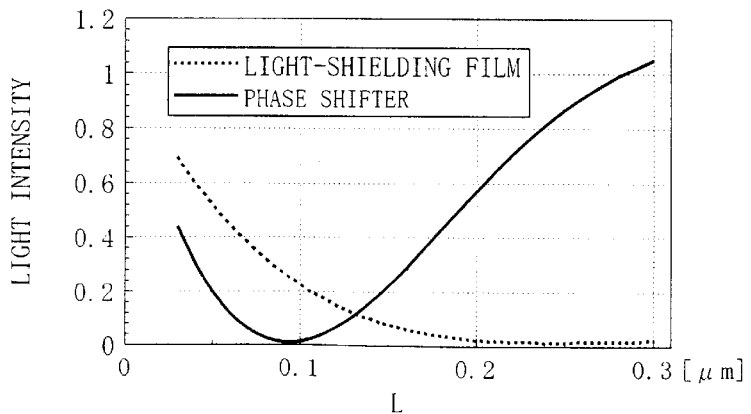
FIG. 5(f) is a diagram showing the simulation result of a change in light intensity of the light transmitted through the center of respective isolated line patterns of the photomasks of the second and third comparative examples, wherein the width L is varied continuously.

FIG. 5(f) shows the simulation result of a change in light intensity (relative light intensity) of the light transmitted through the center of the isolated line pattern 131 (the photomask of the second comparative example) and the isolated line pattern 141 (the photomask of the third comparative example), wherein the width L was varied continuously (optical conditions: wavelength $\lambda=0.193$ μm; numerical aperture NA=0.6; and coherence σ=0.8). Note that, in FIG. 5(f), the dotted line indicates a change in light intensity of the light transmitted through the center of the isolated line pattern 131, and the solid line indicates a change in light intensity of the light transmitted through the center of the isolated line pattern 141.

As shown in FIGS. 5(c) to (e) and FIG. 5(f), when the width L is smaller than about the resolution, i.e., about 0.13 μm, the phase shifter has a greater light-shielding effect than that of the light-shielding film. However, when the width L exceeds about 0.13 μm, the phase shifter has a poorer light-shielding effect than that of the light-shielding film. In other words, the maximum width L causing the phase shifter to have a greater light-shielding effect than that of the light-shielding film is about 0.13 μm.

As shown in FIG. 5(f), the maximum light-shielding effect of the phase shifter is obtained with the width of around 0.10 μm.

Figure 6:
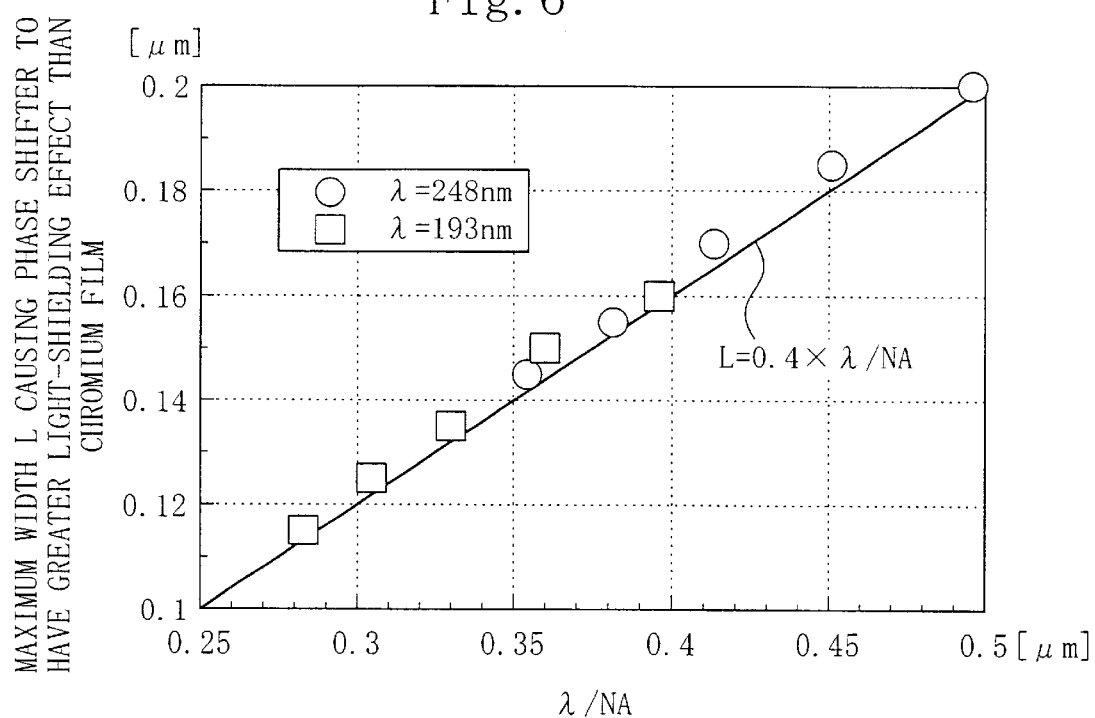
FIG. 6 is a plot of the simulation result at various wavelengths $\lambda$ and numerical apertures NA, wherein the maximum width L causing a phase shifter to have a greater light-shielding effect than that of a light-shielding film is plotted with respect to $\lambda$/NA.

FIG. 6 shows the simulation result at various wavelengths $\lambda$ and numerical apertures NA, wherein the maximum width L causing the phase shifter to have a greater light-shielding effect than that of the light-shielding film (chromium film) is plotted with respect to $\lambda$/NA.

As shown in FIG. 6, the approximate relation as given by L=0.4×$\lambda$/NA is established between $\lambda$/NA and the maximum width L causing the phase shifter to have a greater light-shielding effect than that of the light-shielding film. In other words, when the isolated line pattern of the phase shifter formed on the transparent substrate has a width (L×M) equal to or smaller than (0.4×$\lambda$/NA)×M, this isolated line pattern has a greater light-shielding effect than that of the isolated line pattern of the light-shielding film.

Figure 7:
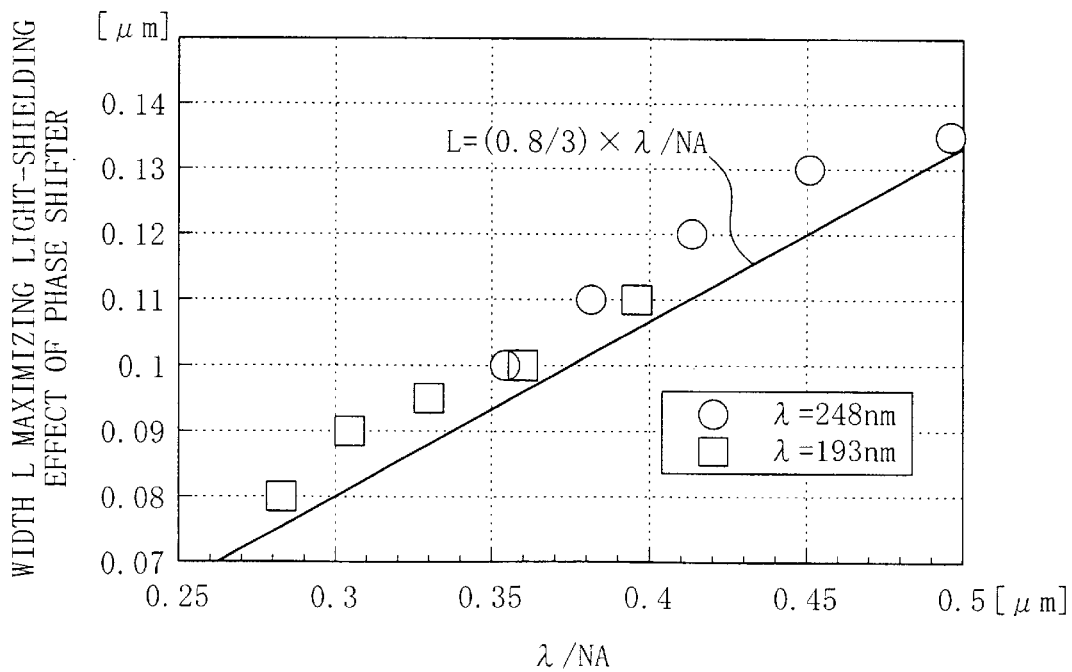
FIG. 7 is a plot of the simulation result at various wavelengths $\lambda$ and numerical apertures NA, wherein the width L maximizing the light-shielding effect of the phase shifter is plotted with respect to $\lambda$/NA.

FIG. 7 shows the simulation result at various wavelengths $\lambda$ and numerical apertures NA, wherein the width L maximizing the light-shielding effect of the phase shifter is plotted with respect to $\lambda$/NA.

As shown in FIG. 7, the approximate relation as given by L=(0.8/3)×$\lambda$/NA is established between $\lambda$/NA and the width L maximizing the light-shielding effect of the phase shifter. In other words, when the isolated line pattern of the phase shifter formed on the transparent substrate has a width (L×M) of about (0.8/3)×$\lambda$/NA)×M, this isolated line pattern has the maximum light-shielding effect.

From the aforementioned results, the inventor found that a light-shielding pattern having an excellent light-shielding property can be implemented by the structure having a phase shifter of a prescribed dimension or less surrounded by a light-shielding film, i.e., the structure having a phase shift region surrounded by a light-shielding film region.

In order to specify the conditions capable of enhancing the light-shielding property of the light-shielding film by the phase shifter, the light-shielding property of a light-shielding pattern formed from combination of a phase shift region and a light-shielding film region will now be described with reference to the figures.

FIG. 8(a) is a plan view of a mask having a light-shielding pattern formed from combination of a phase-shift region and a light-shielding film region, i.e., a photomask of the first embodiment. As shown in FIG. 8(a), a light-shielding film region 151 is formed on a transparent substrate 150 so as to surround a phase shift region 152, and the light-shielding pattern is formed from the light-shielding film region 151 and the phase-shift region 152. The width of the light-shielding film region 151 including the phase shift region 152 is (L×M), the width of the phase shift region 152 is (W×M), and the width of the portion surrounding the phase shift region 152 in the light-shielding film region 151 is (S×M). Thus, L=W+2S.

FIGS. 8(b) to (d) show the simulation result of light intensity (relative light intensity) distribution of the light transmitted between two points A and B of the mask of FIG. 8(a), using the width L of 0.10 $\mu$m, 0.14 $\mu$m and 0.18 $\mu$m, respectively, and various widths W (optical conditions: wavelength $\lambda$=0.193 $\mu$m; numerical aperture NA=0.6; and coherence $\sigma$=0.8).

FIG. 8(e) shows the simulation result of a change in light intensity (relative light intensity) of the light transmitted through the center of the light-shielding pattern on the mask of FIG. 8(a), using various widths L and various widths W (optical conditions: wavelength $\lambda$=0.193 $\mu$m; numerical aperture NA=0.6; and coherence $\sigma$=0.8).

Figure 9:
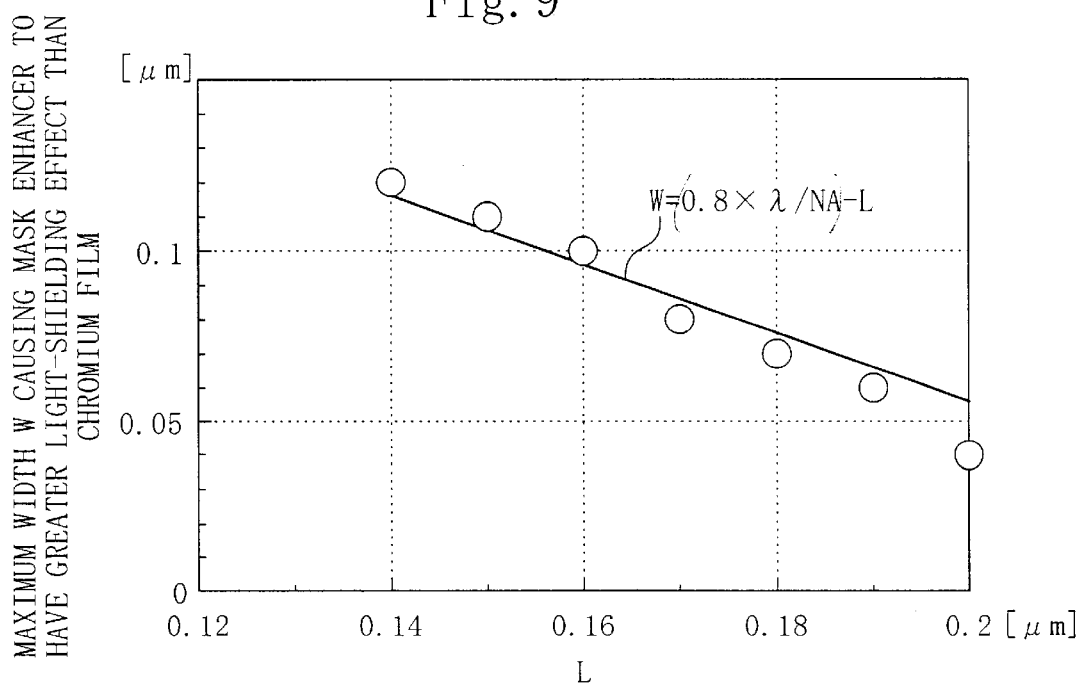
FIG. 9 is a plot of the simulation result, wherein the maximum width W causing a mask enhancer to have a greater light-shielding effect than that of a light-shielding film is plotted with respect to the width L.

FIG. 9 shows the simulation result obtained based on FIGS. 8(b) to (d) and FIG. 8(e), wherein the maximum width W causing the structure formed from combination of the phase shift region and the light-shielding film region to have a greater light-shielding effect (lower light intensity) than that of the structure formed only from the light-shielding film (chromium film) (corresponding to W=0) is plotted with respect to the width L.

According to the aforementioned property of the light-shielding effect resulting only from the phase shifter, it is expected that, provided that the phase shifter is provided inside the light-shielding film so as to be surrounded by the light-transmitting region (the region of the transparent substrate having no light-shielding pattern) at a distance of 0.4×$\lambda$/NA or less, that is, so as to satisfy W+S·0.4×$\lambda$/NA, this light-shielding pattern would implement a greater light-shielding effect than that of a light-shielding pattern having the same dimension but formed only from the light-shielding film. Note that, when W+S·0.4×$\lambda$/NA is satisfied, L·(0.8×$\lambda$/NA)−W. Therefore, L·(0.8×$\lambda$/NA) is satisfied.

On the other hand, as shown in FIG. 9, the approximate relation as given by W=(0.8×$\lambda$/NA)−L is established between the width L and the maximum width W causing the structure formed from combination of the phase shift region and the light-shielding film region to have a greater light-shielding effect than that of the structure using only the light-shielding film. In other words, it is assumed that an opening having a width of (W×M) is formed inside a light-shielding film having a width of (L×M) for use as a phase shift region. In this case, as long as W·(0.8×$\lambda$/NA)−L is satisfied, the light-shielding effect can be improved over the case where the light-shielding film having a width of (L×M) is directly used. Note that, when W·(0.8×$\lambda$/NA)−L is satisfied, W+S·0.4×$\lambda$/NA. Therefore, the result of FIG. 9 corresponds to the expectation described above. Provided that L·0.4×$\lambda$/NA, even the light-shielding pattern formed only from the phase shifter, i.e., W=L, can improve the light-shielding effect over the light-shielding pattern formed only from the light-shielding film.

From the aforementioned results, the inventor found that the light-shielding effect of a light-shielding pattern having a width (L×M) of (0.8×$\lambda$/NA)×M or less is improved by forming therein a phase shift region, i.e., an opening, having a width (W×M) of ((6.8×$\lambda$/NA)−L)×M or less. Hereinafter, a phase shift region formed inside a light-shielding pattern so as to satisfy the aforementioned conditions is referred to as a mask enhancer.

Figure 10:
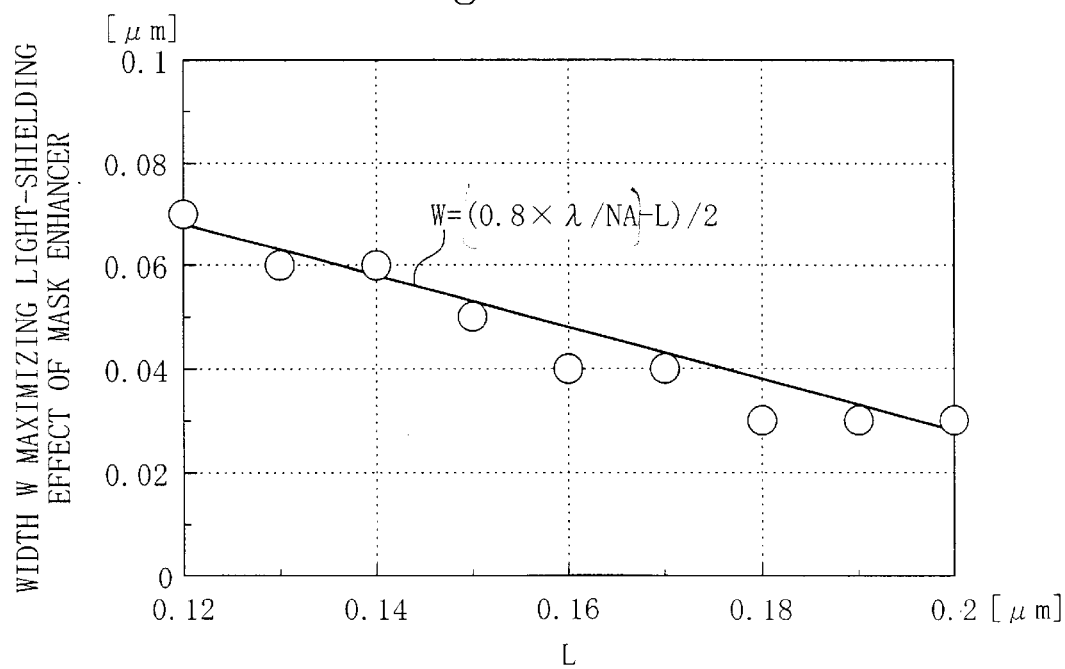
FIG. 10 is a plot of the simulation result, wherein the width W maximizing the light-shielding effect of the mask enhancer is plotted with respect to the width L.

FIG. 10 shows the simulation result obtained based on FIGS. 8(b) to (d) and FIG. 8(e), wherein the width W maximizing the light-shielding effect of the mask enhancer is plotted with respect to the width L.

As shown in FIG. 10, the approximate relation as given by W=((0.8×$\lambda$/NA)−L)/2 is established between the width L and the width W maximizing the light-shielding effect of the mask enhancer. In other words, it is assumed that an opening having a width of (W×M) is formed within a light-shielding film having a width of (L×M) for use as a mask enhancer. In this case, when W=((0.8×$\lambda$/NA)−L)/2, the mask enhancer has the maximum light-shielding effect.

The inventor also found that, provided that a light-shielding pattern formed from a light-shielding film and a mask enhancer located therein has a width of (L×M) and the mask enhancer has a width of (W×M) as well as W·(0.8×$\lambda$/NA)−L, the mask enhancer improves the light-shielding effect even if the mask enhancer is not located in the center of the light-shielding pattern.

Figure 11A:
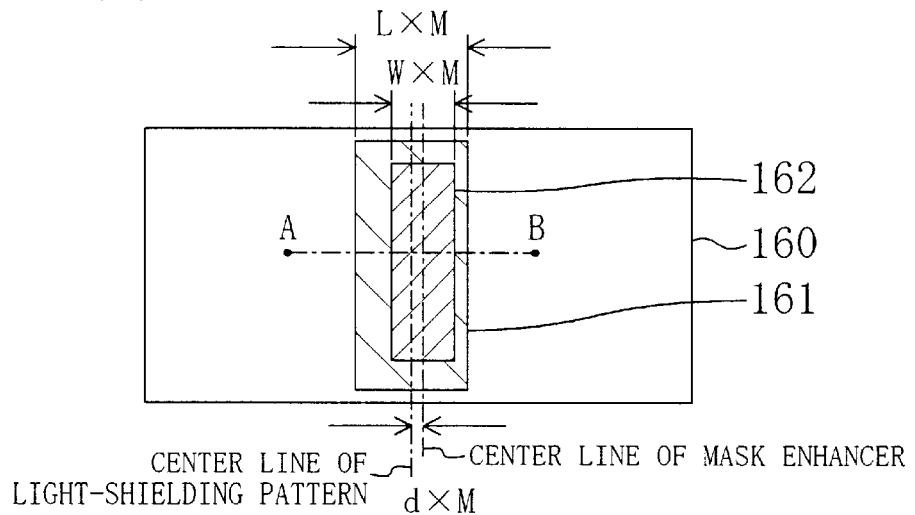
FIG. 11(a) is a plan view of a mask having a mask enhancer displaced from the center of a light-shielding pattern.

FIG. 11(a) is a plan view of a mask having a mask enhancer displaced from the center of a light-shielding pattern. As shown in FIG. 11(a), a light-shielding film region 161 is formed on a transparent substrate 160 so as to surround a mask enhancer 162. The light-shielding pattern is formed from the light-shielding film region 161 and the mask enhancer 162. The width of the light-shielding film region 161 including the mask enhancer 162, i.e., the width of the light-shielding pattern, is (L×M), the width of the mask enhancer 162 is (W×M), and the offset width between the respective center lines of the light-shielding pattern and the mask enhancer 162 is (d×M).

Figure 11B:
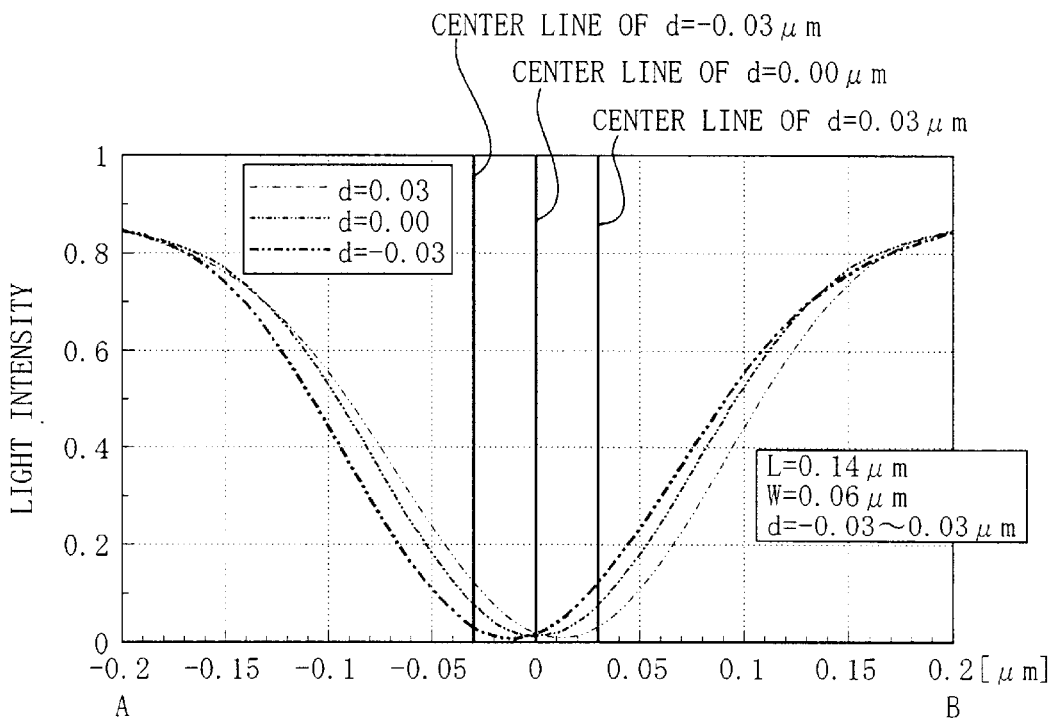
FIG. 11(b) is a diagram showing the simulation result of light intensity distribution of the light transmitted between two points A and B of the mask of FIG. 11(a), wherein the offset width of the mask enhancer was varied.

FIG. 11(b) shows the simulation result of light intensity (relative light intensity) distribution of the light transmitted between two points A and B of the mask of FIG. 11(a), wherein the width L was 0.14 $\mu$m, the width W was 0.06 $\mu$m, and the offset width d was varied in the range of 0.03 $\mu$m to 0.03 $\mu$m (optical conditions: wavelength $\lambda$=0.193 $\mu$m; numerical aperture NA=0.6; and coherence $\sigma$=0.8).

As shown in FIG. 11(b), the mask enhancer has substantially the same light-shielding effect regardless of its position on the light-shielding pattern. Although the displacement amount of the mask enhancer is 0.06 $\mu$m×M (which is the displacement amount between d=−0.03 $\mu$m and d=0.03 $\mu$m), the displacement amount of the light intensity distribution itself is about 0.02 $\mu$m. Thus, displacement of the mask enhancer has a slight effect on the light intensity distribution. Accordingly, it can be appreciated that the positional control of the mask enhancer is not so important in the light-shielding pattern structure using the mask enhancer.

As has been described above, according to the first embodiment, a mask enhancer having a width (W×M) of ((0.8×$\lambda$/NA)−L)×M or less is provided inside a light-shielding pattern having a width (L×M) of (0.8×λ/NA)×M or less. Therefore, the transmitted light reaching the backside of the light-shielding film region of the light-shielding pattern due to the diffraction phenomenon is cancelled by the light transmitted through the mask enhancer. As a result, the light-shielding effect of the light-shielding pattern is improved. In this case, by providing the mask enhancer so as to satisfy W=((0.8×λ/NA)−L)/2, the light-shielding effect of the light-shielding pattern can be maximized. Provided that L·0.4×λ/NA, even the light-shielding pattern formed only from the phase shifter, i.e., W=L, can improve the light-shielding effect over the light-shielding pattern formed only from the light-shielding film.

Hereinafter, the light-shielding property obtained by the mask enhancer with an optimized width will be described with reference to the figures.

Figure 12A:
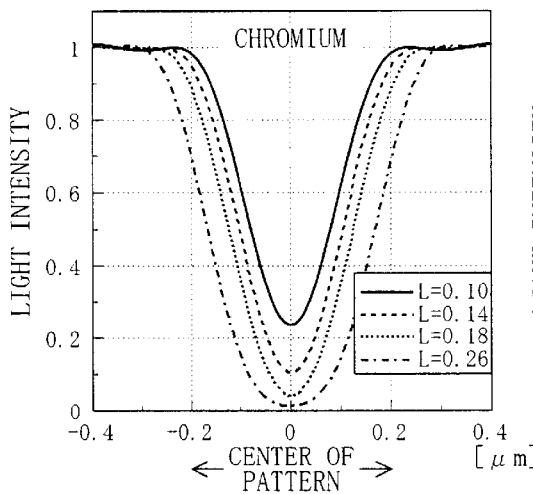
FIGS. 12(a) to (c) are diagrams respectively showing the simulation result of light intensity distribution obtained by a photomask of a fourth comparative example, a photomask of a fifth comparative example and a photomask of the first embodiment of the invention including an optimized mask enhancer, wherein the width of a light-shielding pattern was varied.
Figure 12D:
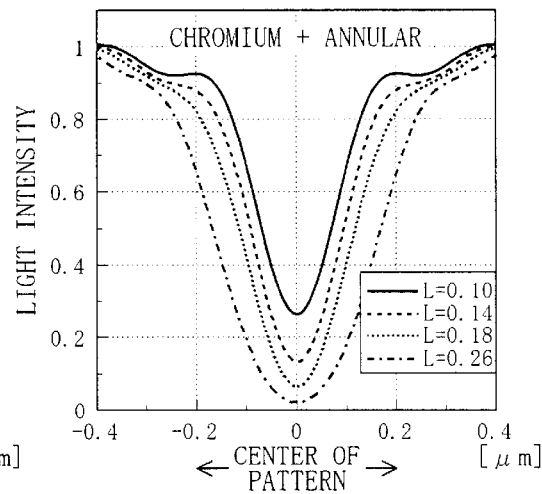
FIGS. 12(d) to (f) are diagrams respectively showing the simulation result of light intensity distribution obtained by combining each of the photomasks of the fourth and fifth comparative examples and the photomask of the first embodiment of the invention including the optimized mask enhancer with annular exposure, wherein the width of the light-shielding pattern was varied.
Figure 12B:
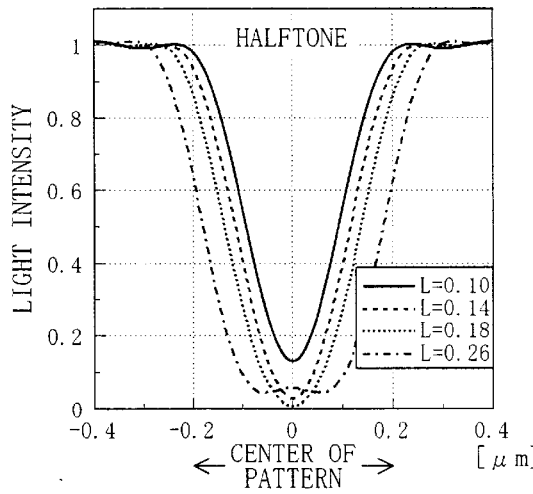
Figure 12E:
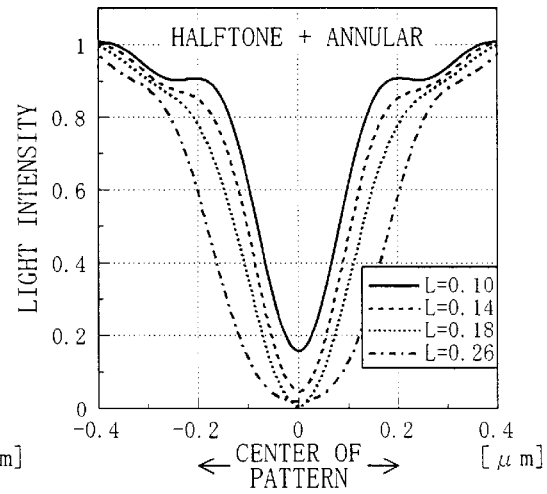
Figure 12C:
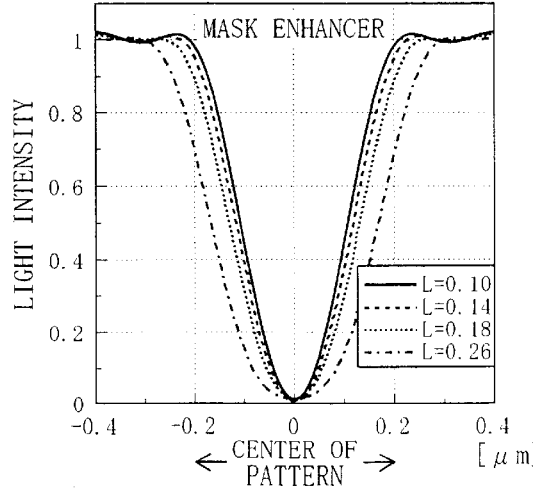

FIGS. 12(a) to (c) show the simulation result of light intensity distribution obtained by the following masks: a simple light-shielding film mask whose light-shielding pattern is formed only from a light-shielding film (hereinafter, referred to as a photomask of the fourth comparative example); a halftone phase shit mask (hereinafter, referred to as a photomask of the fifth comparative example); and a mask of the present embodiment including a mask enhancer with an optimized width in the light-shielding pattern, wherein the light-shielding pattern has a width of (L×M) and L was varied in the range of 0.26 μm to 0.10 μm.

Figure 12F:
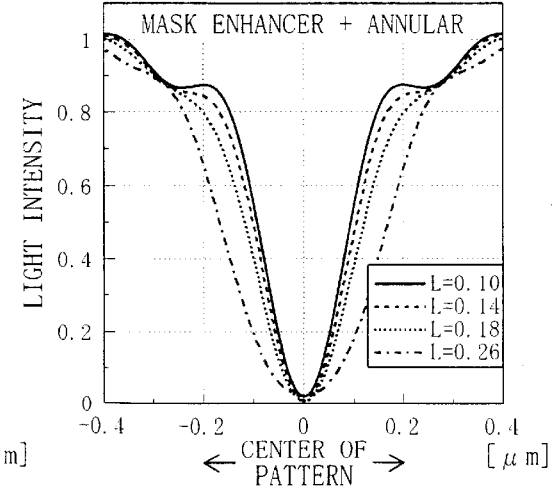
Figure 13:
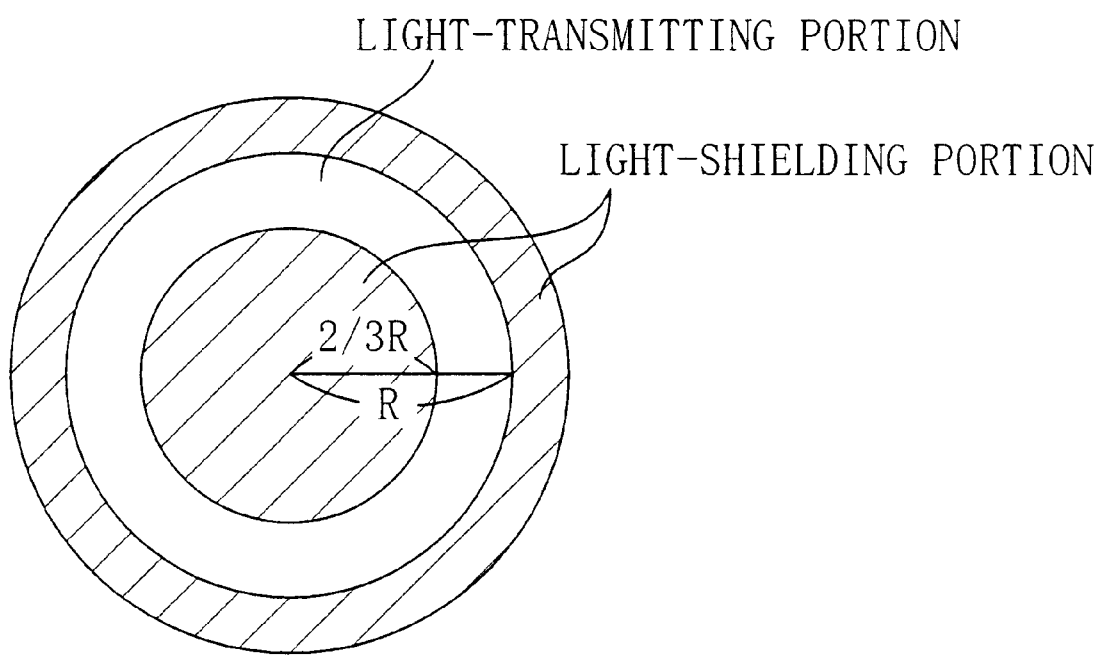
FIG. 13 is a diagram showing a light-source feature of the annular exposure.

FIGS. 12(d) to (f) show the simulation result of light intensity distribution obtained by combination of the photomasks of the fourth and fifth comparative examples and the present embodiment with annular exposure as shown in FIG. 13 (a light-shielding filter having a radius equal to two-thirds of the radius of the light source is provided in the center of the light source of the aligner), wherein the light-shielding pattern has a width of (L×M) and L is varied in the range of 0.26 μm to 0.10 μm.

Note that the simulation of light intensity distribution of FIGS. 12(a) to (f) was conducted under the following optical conditions: wavelength λ0.193 μm; numerical aperture NA=0.6; and coherence σ=0.8, and thus 0.8×λ/NA≈0.26 μm and (0.8/3)×λ/NA≈0.09 μm. The light intensity distribution shown in FIGS. 12(a) to (f) is calculated along the transverse direction of the light-shielding pattern using the center of the light-shielding pattern as the origin.

As shown in FIG. 12(a), in the case of the simple light-shielding film mask, the light-shielding effect of the light-shielding pattern is degraded as L becomes smaller than 0.8×λ/NA (0.26 λm), whereby an exposure margin is abruptly reduced.

As shown in FIG. 12(b), in the case of the halftone phase shift mask as well, the light-shielding effect of the light-shielding pattern is degraded as L becomes smaller, whereby an exposure margin is abruptly reduced.

As shown in FIG. 12(c), in the case of the mask of the present embodiment having the optimized mask enhancer structure, approximately the same light-shielding effect is obtained with any width L in the range of 0.8×λ/NA to (0.8/3)×λ/NA (about 0.10 μm). Note that, as described before, when L is 0.8×λ×/NA or more, a sufficient light-shielding effect is obtained by a normal light-shielding pattern formed only from the light-shielding film. Therefore, with the mask enhancer structure, a sufficient light-shielding effect can be realized with any width L of (0.8/3)×λ/NA or more. It is clearly understood that, in the present embodiment, L=(0.8/3)×λ/NA does not mean the resolution limit, and a pattern can be formed with the mask enhancer even if L is (0.8/3)×λ/NA or less.

As shown in FIGS. 12(a) and 12(d) or FIGS. 12(b) and 12(e), the simple light-shielding film mask or the halftone phase shift mask has a degraded light-shielding property when combined with annular exposure. In contrast, as shown in FIGS. 12(c) and 12(f), the mask of the present embodiment does not have a degraded light-shielding property even in combination with annular exposure.

Note that the effects resulting from combining the mask of the present embodiment with annular exposure will be described later.

Hereinafter, the relation between L and W will be described with reference to the figures. It is herein assumed that the width of the light-shielding pattern including the mask enhancer is (L×M) and the width of the mask enhancer is (W×M).

Figure 14A:
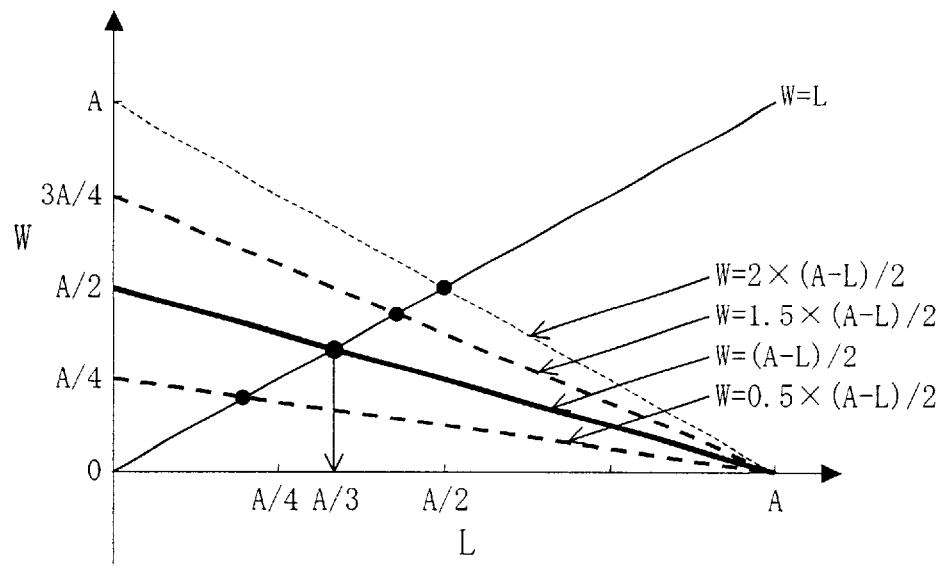
FIG. 14(a) is a graphic representation of W=L and W=·(0.8×$\lambda$/NA)×Max(A−L)/2 (where A=0.8×$\lambda$/NA, and $\alpha$=0.5, 1.0, 1.5 and 2.0)

FIG. 14(a) is a graphic representation of W=L and W=α×(A−L)/2 (where A=0.8×λ/NA, and α=0.5, 1.0, 1.5 and 2.0), wherein the abscissa is L and the ordinate is W. Herein, W=α×(A−L)/2 satisfies the condition relating to the width (W×M) of the mask enhancer: W·(0.8×λ/NA)−L=A−L (where W·L). Disregarding the minimum possible dimension to be implemented on the photomask, W·L for the width (W×M) of the mask enhancer.

In FIG. 14(a), the intersection of W=L and W=α×(A−L)/2 is marked with "·", and the value L at the intersection is α×A/(2+α).

As described before, the mask enhancer is provided in the light-shielding pattern satisfying L<A. As shown in FIG. 14(a), when L<A, the value W=α×(A−L)/2 is increased as L is decreased, and becomes equal to L at the point "·". Thus, when L is smaller than this value, the light-shielding pattern can be formed only from the phase shifter. For example, when α=1, the light-shielding pattern of L<A/3 may be formed only from the phase shifter.

Figure 14B:
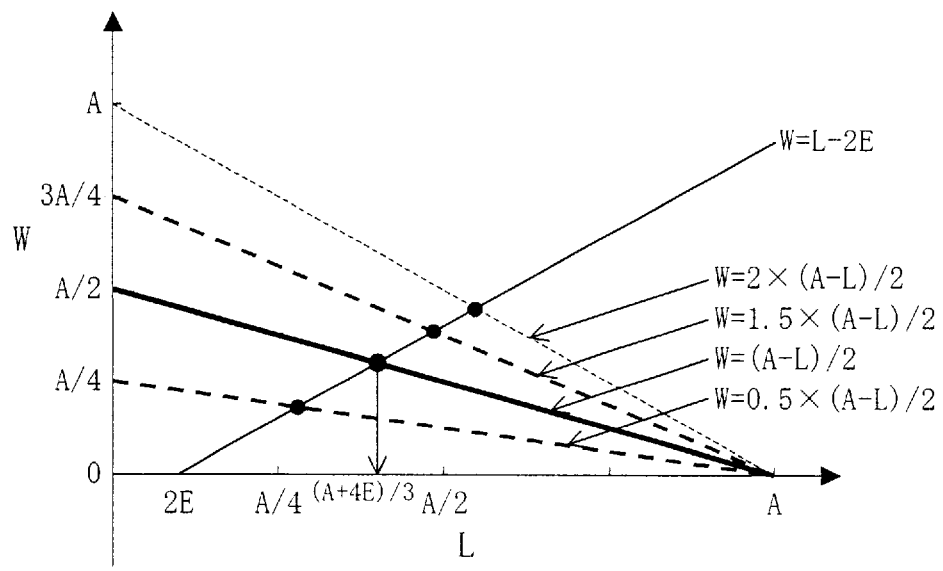
FIG. 14(b) is a graphic representation of W=L−2E and W=$\alpha$×(A−L)/2 (where A=0.8×$\lambda$/NA, and $\alpha$=0.5, 1.0, 1.5 and 2.0)

FIG. 14(b) is a graphic representation of W=L−2E and W=α×(A−L)/2 (where A=0.8×λ/NA, and α=0.5, 1.0, 1.5 and 2.0), wherein the abscissa is L and the ordinate is W. Herein, (E×M) is the minimum possible dimension to be implemented on the photomask, and for example, means a value approximately corresponding to the alignment accuracy of a photomask writing apparatus. It should be understood that the width (L×M) of the light-shielding pattern including the mask enhancer and the width (W×M) of the mask enhancer are both equal to or larger than the minimum possible dimension (E×M). Since the light-shielding film having a width of at least (E×M) must be left on both sides of the mask enhancer, W·L−2E for the width (W×M) of the mask enhancer.

In FIG. 14(b), the intersection of W=L−2E and W=α×(A−L)/2 is marked with "·", and the value L at the intersection is (α×A+4×E)/(2+α).

As shown in FIG. 14(b), when L<A, the value W=α×(A−L)/2 is increased as L is decreased, and becomes equal to L−2E at the point "·" as in the case of FIG. 14(a). Thus, when L is smaller than this value, only the width of the mask enhancer is reduced. That is, only the width of the mask enhancer is reduced as L is decreased, so that the light-shielding film of the width (E×M) is left on both sides of the mask enhancer. For example, when α=1, only the width of the mask enhancer is varied in the light-shielding pattern of L<(A+4×E)/3.

As shown in FIG. 14(a) and FIG. 14(b), if the width (W×M) of the mask enhancer is determined within the range of W·2×(A−L)/2=A−L and W·L or W·L−2E, the light-shielding property can be improved by the mask enhancer. The light-shielding property of the mask enhancer is maximized when both W=(A−L)/2 and L·A/3 are satisfied. However, the light-shielding property can be sufficiently improved by the mask enhancer as long as 0.5×(A−L)/2·W·1.5×(A−L)/2 and W·L or W·L−2E are satisfied.

Hereinafter, the relation between the transmittance and phase of the mask enhancer and the light-shielding effect thereof will be described.

Figure 15:
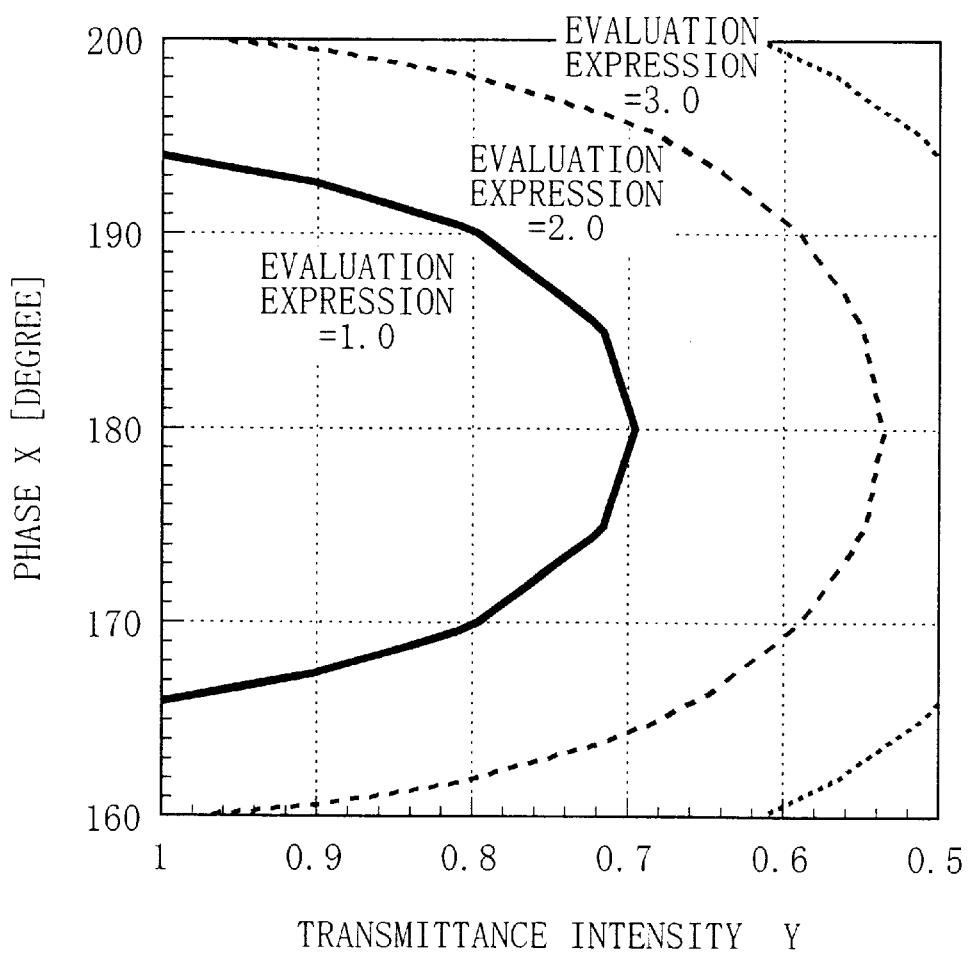
FIG. 15 is a diagram showing the simulation result of a change in the light-shielding effect obtained while varying the transmittance and phase of a phase shift region serving as a mask enhancer in the photomask of the first embodiment of the invention.

FIG. 15 shows the simulation result of a change in the light-shielding effect in the mask of the present embodiment having a mask enhancer with a width optimized at L=0.10 μm, wherein the width of the light-shielding pattern is (L×M), that is, the simulation result of a change in the light-shielding effect obtained while varying the transmittance and phase of a phase shift region serving as mask enhancer. Note that the light-shielding effect was evaluated by the following expression: (F(X, Y)−F(180, 1.0))/F(180, 1.0) (where X is a phase, Y is transmittance intensity (the square of phase transmittance; the transmittance intensity of the light-transmitting region is 1), and F(X, Y) is the light intensity at the center of the light-shielding pattern). In FIG. 15, the transmittance and phase values are plotted for the evaluation expressions of the light-shielding effect of 1.0, 2.0 and 3.0.

Provided that the condition where the evaluation expression of the light-shielding effect becomes equal to 1, i.e., the condition where a change in light intensity becomes equal to the minimum light intensity F(180, 1.0) according to a change in transmittance and phase, is the allowable limit of the light-shielding effect of the mask enhancer, the phase difference of the mask enhancer with respect to the light-transmitting region is preferably in the range of (170+360×n) to (190+360×n) degrees (where n is an integer), as shown in FIG. 15. The transmittance intensity of the mask enhancer is preferably 80% or more of the transmittance intensity of the light-transmitting region.

Note that the foregoing description is given assuming that the light-shielding pattern is a line pattern. However, the mask enhancer has the effect of improving the light-shielding property when it is provided inside the light-shielding film so as to be surrounded by the light-transmitting region from at least two directions at a distance of 0.4×λ/NA or less. Accordingly, the mask enhancer improves the light-shielding effect even when it is provided at or inside a corner of the light-shielding pattern, or at or inside an end of the light-shielding pattern formed as a line pattern. This enables formation of a fine pattern with a feature truly similar to that of a desired light-shielding pattern.

Second Embodiment

Hereinafter, a patterning method according to the second embodiment of the invention will be described with reference to the figures. Note that the patterning method of the second embodiment is a patterning method using the photomask of the first embodiment. In the second embodiment, M indicates a magnification of a reduction projection optical system of an aligner.

FIGS. 16(a) to (e) are cross-sectional views illustrating the steps of the patterning method of the second embodiment, respectively.

Figure 16A:
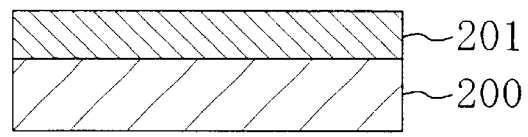
FIGS. 16(a) to (e) are cross-sectional views illustrating the steps of a patterning method of a second embodiment of the invention, respectively.

First, as shown in FIG. 16(a), a film 201 to be etched of a metal film or insulating film is formed on a substrate 200. An underlying insulating film, underlying wirings, active elements such as transistors, or the like may be formed in advance on the substrate 200.

Figure 16B:
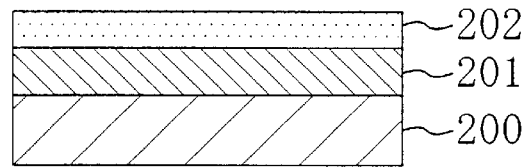

Then, as shown in FIG. 16(b), a resist film 202 is formed on the etching film 201.

Note that the present embodiment uses a positive resist, a resist whose exposed portion is removed by development, as a material of the resist film 202. However, a negative resist may alternatively be used in order to form a fine resist-removed region like a hole pattern.

Figure 16C:
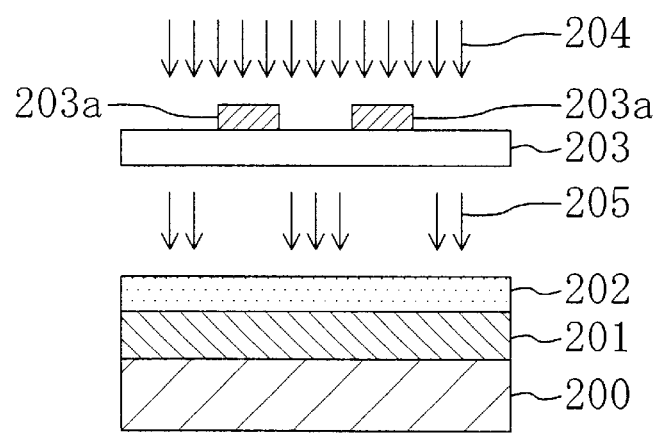

Then, as shown in FIG. 16(c), the resist film 202 is subjected to pattern exposure using the photomask of the first embodiment, i.e., a photomask 203 having a light-shielding pattern 203a of the mask enhancer structure. More specifically, exposure light 204 is directed to the photomask 203, so that the light 205 transmitted therethrough is incident on a prescribed portion of the resist film 202.

Figure 16D:
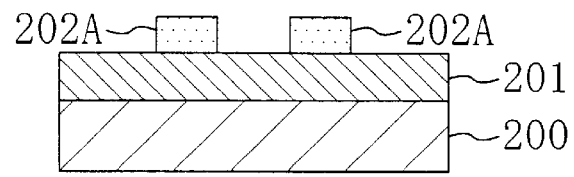

Then, as shown in FIG. 16(d), the exposed resist film 202 is developed to form a resist pattern 202A.

Figure 16E:
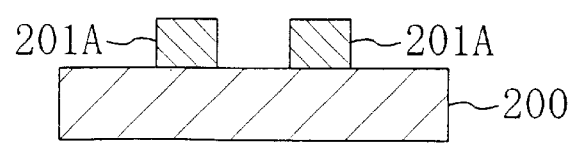

Thereafter, as shown in FIG. 16(e), the etching film 201 is etched using the resist pattern 202A as an etching mask, thereby forming a pattern 201A of the etching film 201.

According to the second embodiment, pattern exposure is conducted using the photomask of the first embodiment. Therefore, even when the resist pattern 202A or pattern 201A having a dimension equal to or smaller than about the resolution is formed, the light-shielding pattern 203a provides approximately the same light-shielding effect as that provided when a pattern having a dimension equal to or larger than about the resolution is formed. Accordingly, the resist pattern 202A or pattern 201A having any feature and any dimension including a dimension equal to or smaller than about the resolution can be formed by exposure using only the photomask of the first embodiment.

The inventor found that, in addition to the improved light-shielding property, a unique effect, i.e., an improved process margin such as focus characteristics, can be obtained by the use of the mask enhancer. Hereinafter, this effect of improved process margin will be described with reference to the figures.

Figure 17A:
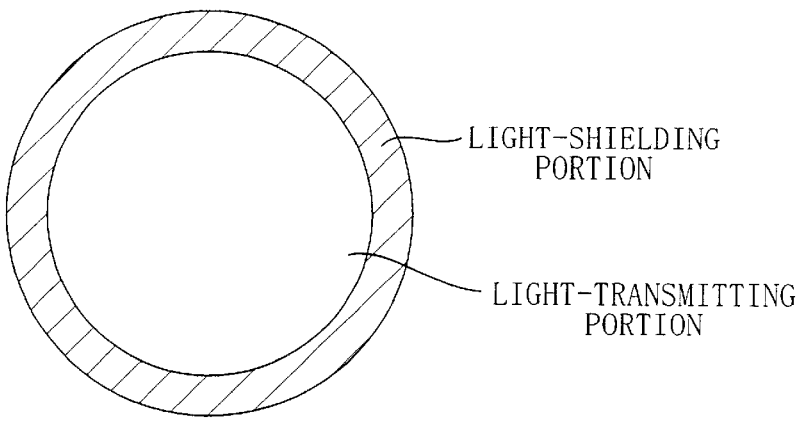
FIGS. 17(a) to (c) are diagrams showing light-source features of normal exposure, annular exposure and quadrupole exposure, respectively.
Figure 17B:
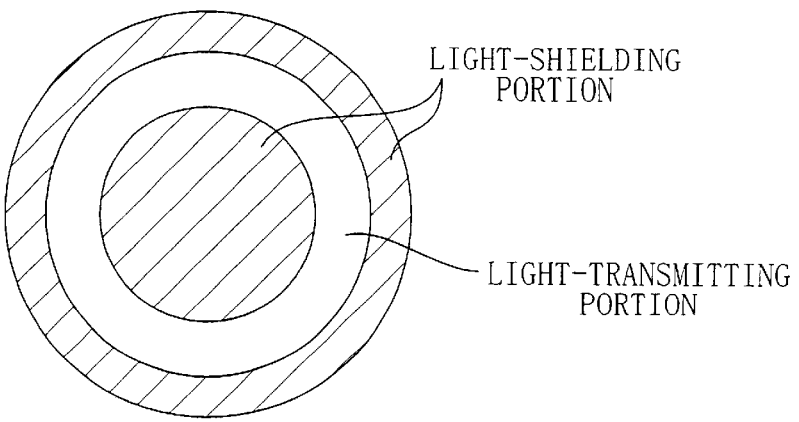
Figure 17C:
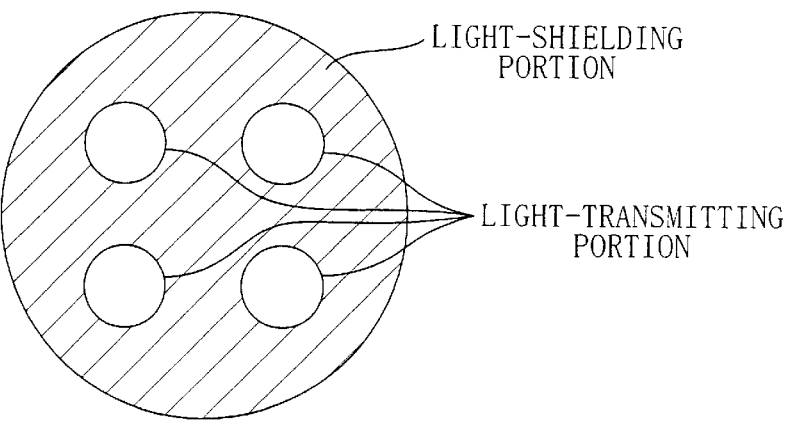

FIGS. 17(a) to (c) shows light-source features of normal exposure, annular exposure and :quadrupole exposure, respectively. The annular exposure and quadrupole exposure are examples of oblique-incidence exposure.

Figure 18A:
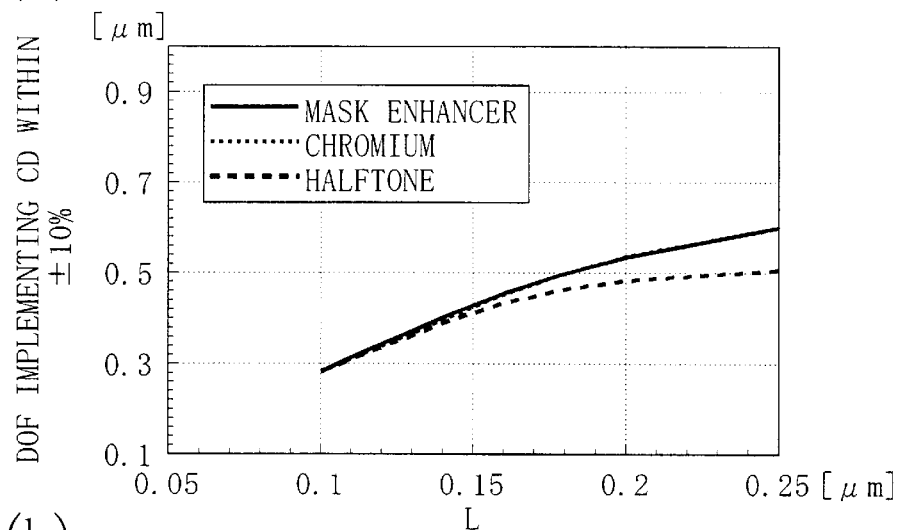
FIG. 18(a) is a diagram showing the simulation result of the DOF value upon normal exposure with the photomask of the first embodiment of the invention.

FIG. 18(a) shows the simulation result of the DOF (Depth of Focus) values of the following three photomasks upon normal exposure of FIG. 17(a): a simple light-shielding film mask (the photomask of the fourth comparative example); a halftone phase shift mask (the photomask of the fifth comparative example); and a photomask of the first embodiment having the mask enhancer with optimized width (hereinafter, referred to as the photomask of the invention), wherein the light-shielding pattern has a width (L×M) and L was varied in the range from 0.10 μm to 0.25 μm.

Figure 18B:
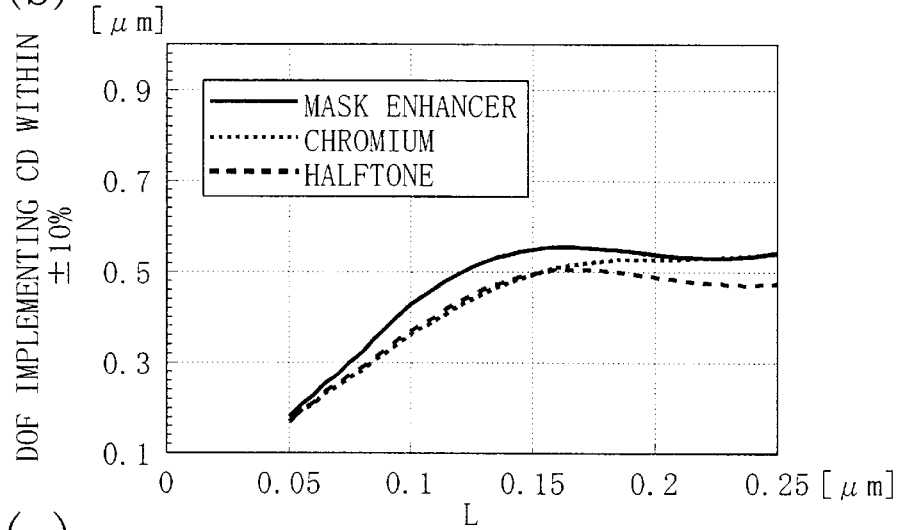
FIG. 18(b) is a diagram showing the simulation result of the DOF value upon annular exposure with the photomask of the first embodiment of the invention.

FIG. 18(b) shows the simulation result of the DOF values of the photomasks of the fourth and fifth comparative examples and the photomask of the invention upon annular exposure of FIG. 17(b), wherein the light-shielding pattern has a width (L×M) and L was varied in the range from 0.05μm to 0.25 μm.

Figure 18C:
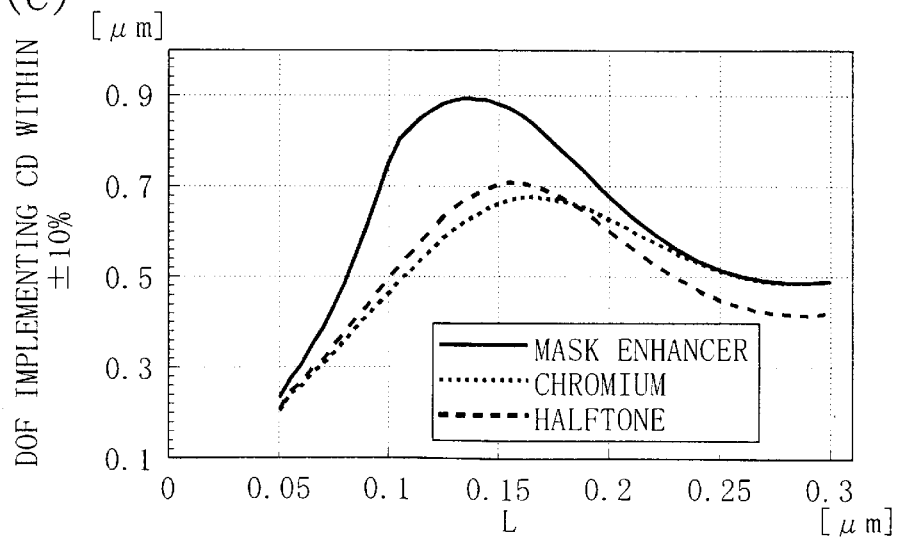
FIG. 18(c) is a diagram showing the simulation result of the DOF value upon quadrupole exposure with the photomask of the first embodiment of the invention.

FIG. 18(c) shows the simulation result of the DOF values of the photomasks of the fourth and fifth comparative examples and the photomask of the invention upon quadrupole exposure of FIG. 17(c), wherein the light-shielding pattern has a width (L×M) and L was varied in the range from 0.05 μm to 0.30 μm.

Note that, in FIGS. 18(a) to (c), a line width varying depending on a focus position (Critical Dimension; hereinafter, referred to as CD) was simulated under the conditions to realize an arbitrary value L. Thus, an allowable range of the focus position in which the CD varies within ±10% of the CD value at the focus position=0 was obtained as a DOF value.

As shown in FIGS. 18(a) to (c), the halftone phase shift mask combined with an oblique incidence illumination method such as an annular illumination or quadrupole illumination method improves the DOF (over the normal exposure) only to about the same degree as that of the simple light-shielding film mask. In contrast, by using the oblique incidence illumination method, the photomask of the invention having the mask enhancer structure significantly improves the DOF as L is decreased.

Thus, the mask enhancer has not only the effect of improving the light-shielding property, but also the effect of improving a process margin such as DOF when combined with the oblique-incidence illumination method. In other words, the mask enhancer adjusted to maximize the light-shielding effect has very good exposure-energy characteristics and focus characteristics when combined with the oblique-incidence illumination method. Accordingly, in order to form a pattern having an arbitrary dimension of $0.8\times\lambda/NA$ or less, the mask enhancer is provided in the light-shielding pattern on the photomask, and oblique-incidence exposure is conducted. As a result, a fine pattern that cannot be produced with a conventional photomask can be realized as well as a high yield can be implemented in the LSI manufacturing with a high process margin.

Third Embodiment

Hereinafter, a method for producing a photomask according to the third embodiment of the invention will be described with reference to the figures. Note that the photomask producing method of the third embodiment is a method for producing the photomask of. the first embodiment, i.e., a photomask including an isolated light-shielding pattern formed from a light-shielding film region and a mask enhancer on a transparent substrate. In the third embodiment, NA is a numerical aperture of a reduction projection optical system of an aligner, $\lambda$ is a wavelength of exposure light, i.e., a light source, and M is a magnification of the reduction projection optical system of the aligner.

FIGS. 19(a) to (g) are cross-sectional views illustrating the steps of the photomask producing method of the third embodiment, respectively. FIGS. 19(h) to (l) are plan views corresponding to FIGS. 19(b), (c), (e), (f) and (g), respectively.

Figure 19A:
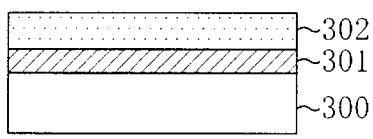
FIGS. 19(a) to (g) are cross-sectional views illustrating the steps of a photomask producing method of a third embodiment of the invention, respectively.

First, as shown in FIG. 19(a), a light-shielding film 301 of, e.g., a chromium compound is deposited on a transparent substrate 300 of, e.g., quartz glass. Then, a resist is applied to the light-shielding film 301 to form a first resist film 302.

Figure 19B:
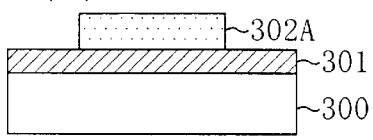
Figure 19H:
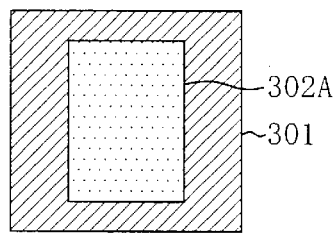
FIGS. 19(h) to (l) are plan views corresponding to FIGS. 19(b), (c), (e), (f) and (g), respectively.

Then, a pattern is written on the first resist film 302 by using a mask writing apparatus such as an electron-beam (EB) lithography system. The first resist film 302 is then developed, whereby a first resist pattern 302A covering a mask-pattern formation region is produced as shown in FIG. 19(b) or FIG. 19(h).

Figure 19C:
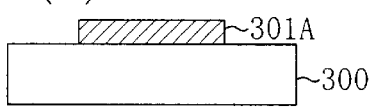
Figure 19I:
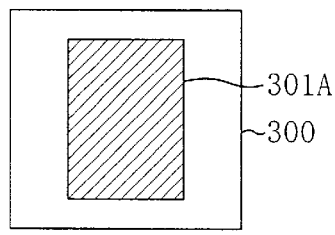

Thereafter, the light-shielding film 301 is etched using the first resist pattern 302A as a mask. As a result, as shown in FIG. 19(c) or FIG. 19(i), a mask pattern 301A of the light-shielding film 301 is formed, and then the first resist pattern 302A is removed. If there are any defects in the mask pattern 301A after completion of the step of FIG. 19(c), a repairing step or the like in the conventional mask manufacturing method is conducted.

Figure 19D:
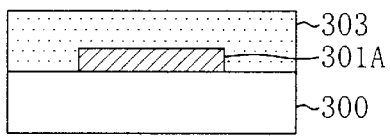

Then, as shown in FIG. 19(d), a resist is applied to the transparent substrate 300 with the mask pattern 301A so as to form a second resist film 303.

Figure 19E:
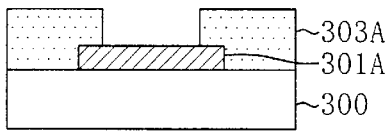
Figure 19J:
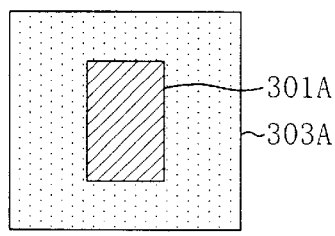

Thereafter, a pattern is written on the second resist film 303 by using the mask writing apparatus. The second resist film 303 is then developed, whereby a second resist pattern 303A having an opening in the mask-enhancer formation region is formed as shown in FIG. 19(e) or FIG. 19(j). Note that the mask-enhancer formation region is always located inside the mask pattern 301A. Therefore, the opening of the second resist pattern 303A is always formed on the mask pattern 301A.

Figure 19F:
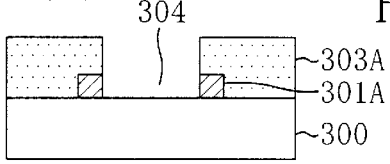
Figure 19K:
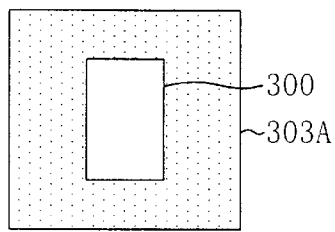

As shown in FIG. 19(f) or FIG. 19(k), the mask pattern 301A is then etched using the second resist pattern 303A as a mask, thereby forming an opening 304 in the mask pattern 301A.

Figure 19G:
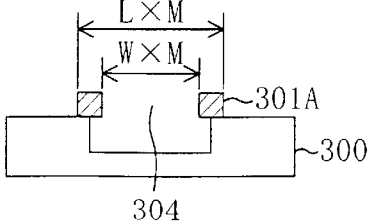
Figure 19L:
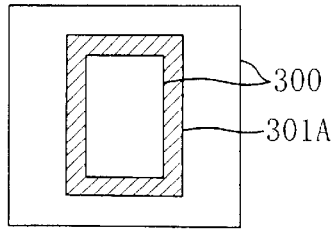

Thereafter, the transparent substrate 300 is etched using the second resist pattern 303A as a mask. Thus, as shown in FIG. 19(g) or FIG. 19(l), the transparent substrate 300 located under the opening 304 is removed down to such a depth that provides the light transmitted therethrough with phase inversion of 180 degrees with respect to the exposure light. The second resist pattern 303A is then removed. At this time, the transparent substrate 300 is etched so that the mask pattern 301A slightly overhangs the etched portion of the transparent substrate 300.

As has been described above, according to the third embodiment, the mask pattern 301A is first formed by patterning the light-shielding film 301 on the transparent substrate 300, and then the opening 304 located in the mask-enhancer formation region is formed in the mask pattern 301A. Thereafter, the transparent substrate 300 located under the opening 304 is etched. This enables the phase difference to be provided between the mask enhancer and the transparent substrate 300 located outside the mask pattern 301A, i.e., the light-transmitting region. Therefore, the photomask of the first embodiment can be formed by setting the width of the opening 304, i.e., the width of the mask enhancer, such that the light-shielding property of the mask enhancer becomes at least about the same as that of the light-shielding film having the same width.

Important parameters in the photomask of the first embodiment are the width of the light-shielding pattern including the mask enhancer, i.e., the width (L×M) of the mask pattern 301A including the opening 304, and the width of the mask enhancer, i.e., the width (W×M) of the opening 304 (see FIG. 19(g)).

According to the third embodiment, the patterning step for forming the mask pattern 301A is conducted independently of the patterning step for forming the opening 304. This enables accurate dimensional control of the light-shielding pattern and the mask enhancer, whereby the photomask of the first embodiment can be reliably produced.

Note that, although the third embodiment uses quartz glass as a material of the transparent substrate 300, the present invention is not limited to this, and calcium fluoride or the like may alternatively be used.

Although the third embodiment uses a chromium compound as a material of the light-shielding film 301, the present invention is not limited to this, and a metal such as chromium, silicon or zirconium, a compound thereof or the like may alternatively be used.

In the third embodiment, it is preferable that W·0.4×λ/NA, when the width of the opening 304, i.e., the width of the mask enhancer, is (W×M). In this case, it is ensured that the mask enhancer has at least about the same light-shielding property as that of the light-shielding film having the same width.

In the third embodiment, it is preferable that L·0.8×λ/NA, when the width of the mask pattern 301A including the opening 304, i.e., the width of the light-shielding pattern, is (L×M). In this case, the effect of improving the light-shielding property is obtained by the opening 304, i.e., the mask enhancer, formed in the mask pattern 301A. When W·(0.8×λ/NA)−L and W·L or W·L−2E (where (E×M) is the minimum possible dimension to be implemented on the photomask), the effect of improving the light-shielding property is reliably obtained. When $0.5 \times (((0.8 \times \lambda/NA) L)/2) \cdot W \cdot 1.5 \times (((0.8 \times \lambda/NA)-L)/2)$ and W·L or W·L 2E, the effect of improving the light-shielding property can be enhanced. Moreover, when $W=((0.8 \times \lambda/NA)-L)/2$ (where $L \cdot (0.8 \times \lambda/NA)/3$), the effect of improving the light-shielding property can be maximized.

In the third embodiment, the transparent substrate 300 located under the opening 304 is removed down to such a depth that provides the light transmitted therethrough with phase inversion of 180 degrees with respect to the exposure light. Alternatively, the transparent substrate 300 located under the opening 304 may be removed down to such a depth that provides the light transmitted therethrough with phase inversion of (170+360×n) to (190+360×n) degrees (where n is an integer) with respect to the exposure light.

In the third embodiment, the entire transparent substrate 300 may be subjected to etching after the step of FIG. 19(g) so that the transmittance can be adjusted with the transparent substrate 300 having an equivalent surface condition both in the light-transmitting region and the mask enhancer portion.

In the third embodiment, the patterning step for forming the opening 304 (FIG. 19(f)) is conducted after the patterning step for forming the mask pattern 301A (FIG. 19(c)). Alternatively, the patterning step for forming the mask pattern 301A may be conducted after the patterning step for forming the opening 304.

Hereinafter, advantages of the photomask producing method of the third embodiment over the conventional photomask producing method, i.e., advantages obtained by the characteristics of the mask enhancer, will be described.

First, in the case where the transparent substrate is etched by the conventional photomask producing method so as to form a groove serving as a phase shifter, it is difficult to form the groove with a vertical wall surface. Therefore, it is impossible to provide the transmitted light with an abrupt phase change at the boundary between the light-transmitting region and the phase shifter. As a result, a sufficient phase shift effect cannot be obtained. In contrast, in the third embodiment, the transparent substrate 300 located under the opening 304 is etched so as to form a groove serving as a mask enhancer. The dimension of the mask enhancer can be controlled by the width of the opening 304. Therefore, as shown in FIG. 19(g), the transparent substrate 300 located under the opening 304 is etched such that the mask pattern 301A slightly overhangs the etched portion of the substrate 300. In other words, the groove serving as the mask enhancer is formed so as to extend under the mask pattern 301A. In this case, the resultant effect is the same as that obtained when a groove having a completely vertical wall surface is formed under the opening 304 as a mask enhancer. In other words, the light-shielding effect of the mask enhancer can be realized without being affected by the wall surface profile of the groove formed by etching of the transparent substrate 300.

Second, in producing a phase shift mask, it is generally impossible to repair the etching residues, defects or the like resulting from etching of the substrate for forming a phase shifter. Therefore, a sufficient phase shift effect cannot be obtained. In the third embodiment as well, defects or the like may possibly be produced by etching the substrate for forming a mask enhancer. However, the mask enhancer is intended to provide the effect of improving the light-shielding property, and it is less likely that the defects in the mask enhancer significantly affect the effect of improving the light-shielding property. Accordingly, repairing of the defects in the mask enhancer is less likely to be required, and thus reduction in yield is less likely to occur in the production of the phase shift mask.

FIG. 20(a) shows the state where a defect (white defect) causing no phase inversion is present within the mask enhancer of the photomask of the first embodiment. As shown in FIG. 20(a), a light-shielding film region 351 is formed on a transparent substrate 350 so as to surround a mask enhancer 352, and the light-shielding pattern is formed from the light-shielding film region 351 and the mask enhancer 352. A defect 353 causing no phase inversion has been produced in the mask enhancer 352. The width of the light-shielding film region 351 including the mask enhancer 352 is (L×M), the width of the mask enhancer 352 is (W×M), and the width of the defect 353 is (P×M).

FIGS. 20(b) to (d) show the simulation result of light intensity (relative light intensity) distribution of the light transmitted between two points A and B of the mask of FIG. 20(a), wherein the width L was 0.10 μm, 0.14 μm and 0.18 μm, respectively, and the width P was varied with respect to the width W that maximizes the light-shielding effect of the mask enhancer 352 (optical conditions: wavelength λ=0.193 μm; numerical aperture NA=0.6; and coherence σ=0.8).

As shown in FIGS. 20(b) to (d), even if the defect 353 having a width P of about 0.05 μm or less is present within the mask enhancer 352, the resultant light intensity distribution is approximately the same as that obtained when there is no defect 353. Thus, the effect of improving the light-shielding property is not degraded. In other words, the mask enhancer structure is immune to the defects of no phase inversion having a width of up to about 0.05 μm.

FIG. 21(a) shows the state where an etching residue of the light-shielding film (black defect or debris defect) is left within the mask enhancer of the photomask of the first embodiment. As shown in FIG. 21(a), a light-shielding film region 361 is formed on a transparent substrate 360 so as to surround a mask enhancer 362, and the light-shielding pattern is formed from the light-shielding film region 361 and the mask enhancer 362. An etching residue 363 of the light-shielding film is left within the mask enhancer 362. The width of the light-shielding film region 361 including the mask enhancer 362 is (L×M), the width of the mask enhancer 362 is (W×M), and the width of the etching residue 363 is (P×M).

FIGS. 21(b) to (d) show the simulation result of light intensity (relative light intensity) distribution of the light transmitted between two points A and B of the mask of FIG. 21(a), wherein the width L was 0.10 μm, 0.14 μm and 0.18 μm, respectively, and the width P was varied with respect to the width W that maximizes the light-shielding effect of the mask enhancer 362 (optical conditions: wavelength λ=0.193 μm; numerical aperture NA=0.6; and coherence σ=0.8).

As shown in FIGS. 21(b) to (d), even if the etching residue 363 having a width P of about 0.05 μm or less is present within the mask enhancer 362, the resultant light intensity distribution is approximately the same as that obtained when there is no etching residue 363. Thus, the effect of improving the light-shielding property is not degraded. In other words, the mask enhancer structure is immune to the etching residues having a width of up to about 0.05 μm.

Third, the minimum line width of the light-shielding pattern capable of being directly formed with a mask writing apparatus such as an EB lithography system is generally limited. In contrast, in the third embodiment, the patterning step for forming the mask pattern 301A is conducted independently of the patterning step for forming the opening 304, i.e., the mask enhancer. Therefore, a fine line width up to the alignment margin of the mask writing apparatus can be used as the line width of the mask pattern 301A surrounding the opening 304, i.e., the line width of the light-shielding film pattern (light-shielding film region) surrounding the mask enhancer. For example, the alignment margin of the EB lithography system is smaller than the minimum possible pattern width to be formed by the EB lithography system. Therefore, in the third embodiment in which the mask pattern and the mask enhancer are respectively formed in two separate patterning steps, a narrower light-shielding film pattern can be formed as compared to the conventional example. It should be noted that, since the mask pattern and the mask enhancer are respectively formed in separate patterning steps in the third embodiment, the mask enhancer may possibly be displaced, i.e., may not be located in the center of the mask pattern. However, as described in the first embodiment in connection with FIG. 11, exposure with the photomask having a displaced mask enhancer hardly affects the light intensity distribution.

First Modification of Third Embodiment

Hereinafter, a method for producing a photomask according to the first modification of the third embodiment of the invention will be described with reference to the figures.

Note that the first modification of the third embodiment is different from the third embodiment in the following point: in the third embodiment, the patterning step for forming the opening is conducted after the patterning step for forming the mask pattern. However, in the first modification of the third embodiment, the patterning step for forming the opening is conducted prior to the patterning step for forming the mask pattern.

FIGS. 22(a) to (g) are cross-sectional views illustrating the steps of the photomask producing method of the first modification of the third embodiment, respectively. FIGS. 22(h) to (k) are plan views corresponding to FIGS. 22(b), (c), (f) and (g), respectively.

Figure 22A:
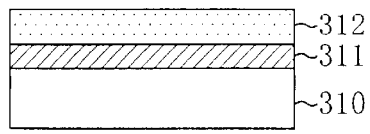
FIGS. 22(a) to (g) are cross-sectional views illustrating the steps of a photomask producing method of a first modification of the third embodiment of the invention, respectively.

First, as shown in FIG. 22(a), a light-shielding film 311 of, e.g., a chromium compound is deposited on a transparent substrate 310 of, e.g., quartz glass. Then, a resist is applied to the light-shielding film 311 to form a first resist film 312.

Figure 22B:
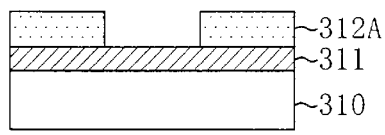
Figure 22H:
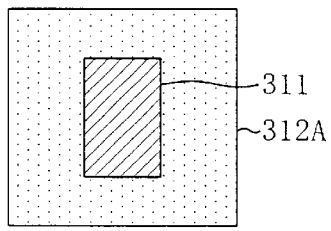
FIGS. 22(h) to (k) are plan views corresponding to FIGS. 22(b), (c), (f) and (g), respectively.

Then, a pattern is written on the first resist film 312 by using a mask writing apparatus. The first resist film 312 is then developed, whereby a first resist pattern 312A having an opening in the mask-enhancer formation region is produced as shown in FIG. 22(b) or FIG. 22(h).

Figure 22C:
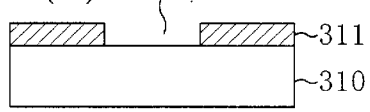
Figure 22I:
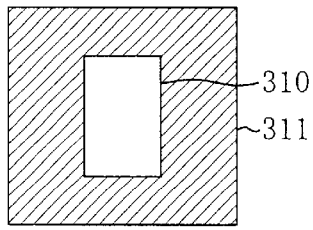

Thereafter, the light-shielding film 311 is etched using the first resist pattern 312A as a mask. As a result, as shown in FIG. 22(c) or FIG. 22(i), an opening 313 is formed in the light-shielding film 311, and then the first resist pattern 312A is removed.

Figure 22D:
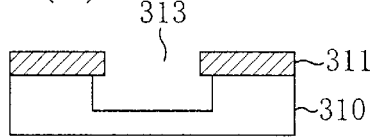

As shown in FIG. 22(d), the transparent substrate 310 is then etched using the light-shielding film 311 with the opening 313 as a mask. Thus, the transparent substrate 310 located under the opening 313 is removed down to such a depth that provides the light transmitted therethrough with phase inversion of 180 degrees with respect to the exposure light. At this time, the transparent substrate 310 is etched so that the light-shielding film 311 slightly overhangs the etched portion of the transparent substrate 310.

Figure 22E:
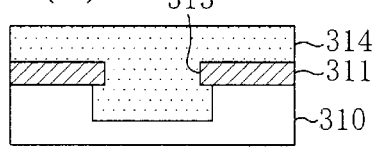

Then, as shown in FIG. 22(e), a resist is applied to the light-shielding film 311 including the opening 313 so as to form a second resist film 314.

Figure 22F:
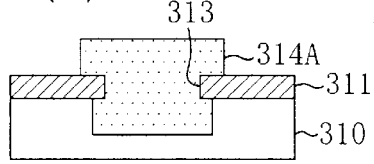
Figure 22J:
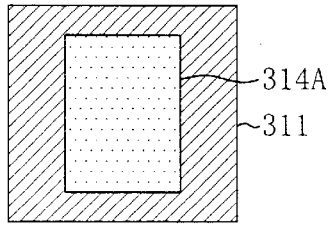

Thereafter, a pattern is written on the second resist film 314 by using the mask writing apparatus. The second resist film 314 is then developed, whereby a second resist pattern 314A covering the mask-pattern formation region is produced as shown in FIG. 22(f) or FIG. 22(j).

Figure 22G:
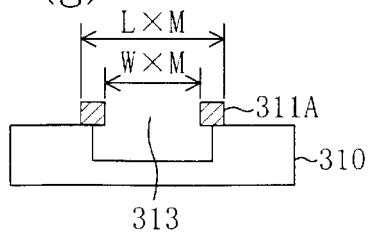
Figure 22K:
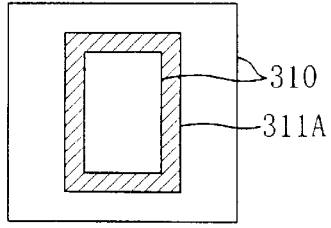

The light-shielding film 311 is then etched using the second resist pattern 314A as a mask. Thus, as shown in FIG. 22(g) or FIG. 22(k), a mask pattern 311A formed from the light-shielding film 311 and having the opening 313 is formed, and then the second resist pattern 314A is removed.

As has been described above, according to the first modification of the third embodiment, the opening 313 located in the mask-enhancer formation region is first formed in the light-shielding film 311 on the transparent substrate 310, and then the transparent substrate 310 located under the opening 313 is etched. Thereafter, the mask pattern 311A having the opening 313 is formed by patterning the light-shielding film 311. This enables the phase difference to be provided between the mask enhancer and the transparent substrate 310 located outside the mask pattern 311A, i.e., the light-transmitting region. Therefore, the photomask of the first embodiment can be formed by setting the width of the opening 313, i.e., the width of the mask enhancer, such that the light-shielding property of the mask enhancer becomes at least about the same as that of the light-shielding film having the same width.

Moreover, according to the first modification of the third embodiment, the patterning step for forming the mask pattern 311A is conducted independently of the patterning step for forming the opening 313. This enables accurate dimensional control of the mask pattern 311A including the opening 313, i.e., the light-shielding pattern, as well as the mask enhancer, whereby the photomask of the first embodiment can be reliably produced.

Moreover, according to the first modification of the third embodiment, the patterning step for forming the opening 313 is conducted prior to the patterning step for forming the mask pattern 311A. Therefore, the transparent substrate 310 can be etched using the light-shielding film 311 with the opening 313 as a mask. This eliminates the need to conduct formation of the opening and etching of the substrate successively by using a resist pattern as in the case where the opening is formed after formation of the mask pattern (e.g., the third embodiment). Accordingly, production of the photomask of the first embodiment is facilitated.

Moreover, according to the first modification of the third embodiment, the substrate is etched before the mask pattern 311A is formed. Therefore, no problem will occur even if the light-shielding film region surrounding the opening 313 is eliminated upon forming the mask pattern 311A due to misalignment of the mask writing apparatus. The reason for this is as follows: in the case of the dimension with which the light-shielding film region may be eliminated by misalignment, the effect of improving the light-shielding property is obtained even if the light-shielding pattern is formed only from the phase shifter.

Advantages of the photomask producing method of the first modification of the third embodiment over the conventional photomask producing method, i.e., advantages obtained by the characteristics of the mask enhancer, are the same as those of the third embodiment.

Note that, although the first modification of the third embodiment uses quartz glass as a material of the transparent substrate 310, the present invention is not limited to this, and calcium fluoride or the like may alternatively be used.

Although the first modification of the third embodiment uses a chromium compound as a material of the light-shielding film 311, the present invention is not limited to this, and a metal such as chromium, silicon or zirconium, a compound thereof or the like may alternatively be used.

In the first modification of the third embodiment, it is preferable that W·0.4×λ/NA, when the width of the opening 313, i.e., the width of the mask enhancer, is (W×M).

In the first modification of the third embodiment, it is preferable that L·0.8×λ/NA, when the width of the mask pattern 311A including the opening 313, i.e., the width of the light-shielding pattern, is (L×M). In this case, it is preferable that: W·(0.8×λ/NA)−L and W·L or W·L 2E; or 0.5×(((0.8× λ/NA)−L)/2)·W·1.5×(((0.8×λ/NA)−L)/2) and W·L or W·L− 2E.

In the first modification of the third embodiment, the transparent substrate 310 located under the opening 313 is removed down to such a depth that provides the light transmitted therethrough with phase inversion of 180 degrees with respect to the exposure light. Alternatively, the transparent substrate 310 located under the opening 313 may be removed down to such a depth that provides the light transmitted therethrough with phase inversion of (170+360× n) to (190+360×n) degrees (where n is an integer) with respect to the exposure light.

In the first modification of the third embodiment, the entire transparent substrate 310 may be subjected to etching after the step of FIG. 22(g) so that the transmittance can be adjusted with the transparent substrate 310 having an equivalent surface condition both in the light-transmitting region and the mask enhancer portion.

Second Modification of Third Embodiment

Hereinafter, a method for producing a photomask according to the second modification of the third embodiment of the invention will be described with reference to the figures.

Note that the second modification of the third embodiment is different from the third embodiment in the following point: in the third embodiment, the transparent substrate located under the opening is removed. However, in the second modification of the third embodiment, the transparent substrate located outside the mask pattern is removed.

FIGS. 23(a) to (h) are cross-sectional views illustrating the steps of the photomask producing method of the second modification of the third embodiment, respectively. FIGS. 23(i) to (m) are plan views corresponding to FIGS. 23(b), (c), (f), (g) and (h), respectively.

Figure 23A:
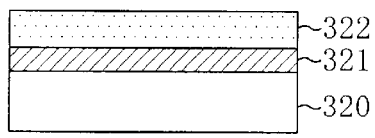
FIGS. 23(a) to (h) are cross-sectional views illustrating the steps of a photomask producing method of a second modification of the third embodiment of the invention, respectively.

First, as shown in FIG. 23(a), a light-shielding film 321 of, e.g., a chromium compound is deposited on a transparent substrate 320 of, e.g., quartz glass. Then, a resist is applied to the light-shielding film 321 to form a first resist film 322.

Figure 23B:
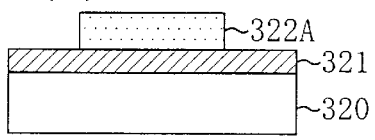
Figure 23C:
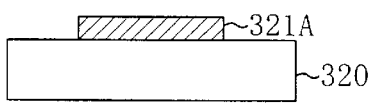

Then, a pattern is written on the first resist film 322 by using a mask writing apparatus. The first resist film 322 is then developed, whereby a first resist pattern 322A covering the mask-pattern formation region is produced as shown in FIG. 23(b) or FIG. 23(i).

Thereafter, the light-shielding film 321 is etched using the first resist pattern 322A as a mask. As a result, as shown in FIG. 23(c) or FIG. 23(j), a mask pattern 321A of the light-shielding film 321 is formed, and then the first resist pattern 322A is removed.

Figure 23D:
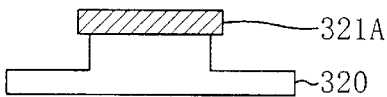

As shown in FIG. 23(d), the transparent substrate 320 is then etched using the mask pattern 321A. Thus, the transparent substrate 320 located outside the mask pattern 321A is removed down to such a depth that provides the light transmitted therethrough with phase inversion of 180 degrees with respect to the exposure light. At this time, the transparent substrate 320 is etched so that the mask pattern 321A slightly overhangs the etched portion of the transparent substrate 320.

Figure 23E:
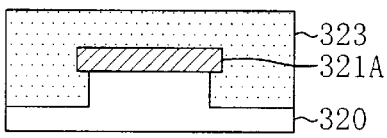

Then, as shown in FIG. 23(e), a resist is applied to the transparent substrate 320 including the mask pattern 321A so as to form a second resist film 323.

Figure 23F:
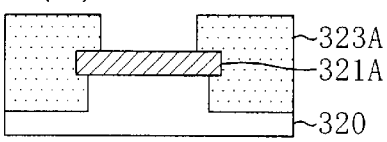

Thereafter, a pattern is written on the second resist film 323 by using the mask writing apparatus. The second resist film 323 is then developed, whereby a second resist pattern 323A having an opening in the mask-enhancer formation region is produced as shown in FIG. 23(f) or FIG. 23(k).

Figure 23G:
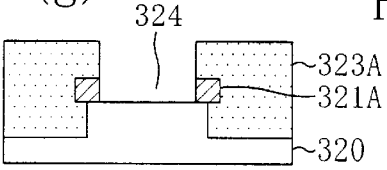
Figure 23H:
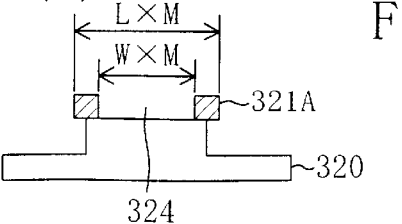
Figure 23I:
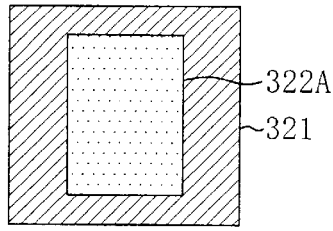
FIGS. 23(i) to (m) are plan views corresponding to FIGS. 23(b), (c), (f), (g) and (h), respectively.
Figure 23J:
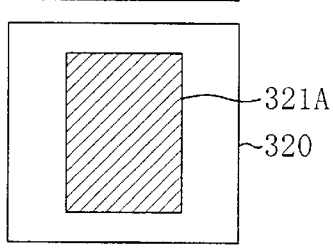
Figure 23K:
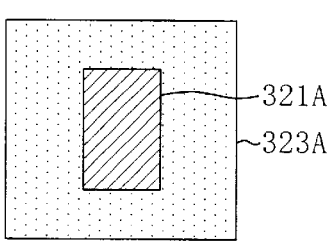
Figure 23L:
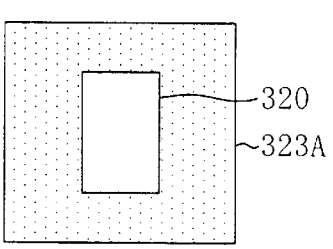
Figure 23M:
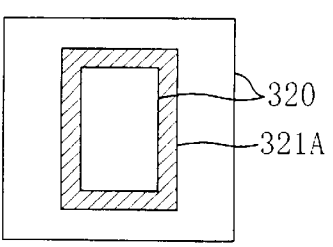

As shown in FIG. 23(g) or FIG. 23(l), the mask pattern 321A is then etched using the second resist pattern 323A as a mask. Thus, an opening 324 is formed in the mask pattern 321A, and then the second resist pattern 323A is removed as shown in FIG. 23(h) or FIG. 23(m).

As has been described above, according to the second modification of the third embodiment, the mask pattern 321A is formed by patterning the light-shielding film 321 on the transparent substrate 320, and then the transparent substrate 320 located outside the mask pattern 321A is etched. Thereafter, the opening 324 located in the mask-enhancer formation region is formed in the mask pattern 321A. This enables the phase difference to be provided between the mask enhancer and the transparent substrate 320 located outside the mask pattern 321A, i.e., the light-transmitting region. Therefore, the photomask of the first embodiment can be formed by setting the width of the opening 324, i.e., the width of the mask enhancer, such that the light-shielding property of the mask enhancer becomes at least about the same as that of the light-shielding film having the same width.

Moreover, according to the second modification of the third embodiment, the patterning step for forming the mask pattern 321A is conducted independently of the patterning step for forming the opening 324. This enables accurate dimensional control of the mask pattern 321A including the opening 324, i.e., the light-shielding pattern, as well as the mask enhancer, whereby the photomask of the first embodiment can be reliably produced.

Moreover, according to the second modification of the third embodiment, the phase difference is provided between the mask enhancer and the light-transmitting region by etching the transparent substrate 320 located outside the mask pattern 321A. Therefore, production of the photomask of the first embodiment is facilitated as compared to the case where the phase difference is provided by etching the transparent substrate located under the opening having a small area (the third embodiment or the first modification thereof).

Moreover, according to the second modification of the third embodiment, the substrate is etched before the opening 324 is formed. Therefore, no problem will occur even if the light-shielding film region surrounding the opening 324 is eliminated upon forming the opening 324 due to misalignment of the mask writing apparatus. The reason for this is as follows: in the case of the dimension with which the light-shielding film region may be eliminated by misalignment, the effect of improving the light-shielding property is obtained even if the light-shielding pattern is formed only from the phase shifter.

Advantages of the photomask producing method of the second modification of the third embodiment over the conventional photomask producing method, i.e., advantages obtained by the characteristics of the mask enhancer, are the same as those of the third embodiment.

Note that, although the second modification of the third embodiment uses quartz glass as a material of the transparent substrate 320, the present invention is not limited to this, and calcium fluoride or the like may alternatively be used.

Although the second modification of the third embodiment uses a chromium compound as a material of the light-shielding film 321, the present invention is not limited to this, and a metal such as chromium, silicon or zirconium, a compound thereof or the like may alternatively be used.

In the second modification of the third embodiment, it is preferable that W·0.4×λ/NA, when the width of the opening 324, i.e., the width of the mask enhancer, is (W×M).

In the second modification of the third embodiment, it is preferable that L·0.8×λ/NA, when the width of the mask pattern 321A including the opening 324, i.e., the width of the light-shielding pattern, is (L×M). In this case, it is preferable that: W·(0.8×λ/NA) L and W·L or W·L−2E; or 0.5×(((0.8×λ/NA)−L)/2)·W·1.5×(((0.8×λ/NA)−L)/2) and W·L or W·L−2E.

In the second modification of the third embodiment, the transparent substrate 320 located outside the mask pattern 321A is removed down to such a depth that provides the light transmitted therethrough with phase inversion of 180 degrees with respect to the exposure light. Alternatively, the transparent substrate 320 located outside the mask pattern 321A may be removed down to such a depth that provides the light transmitted therethrough with phase inversion of (170+360×n) to (190+360×n) degrees (where n is an integer) with respect to the exposure light.

In the second modification of the third embodiment, the entire transparent substrate 320 may be subjected to etching after the step of FIG. 23(h) so that the transmittance can be adjusted with the transparent substrate 320 having an equivalent surface condition both in the light-transmitting region and the mask enhancer portion.

Fourth Embodiment

Hereinafter, a method for producing a photomask according to the fourth embodiment of the invention will be described with reference to the figures. Note that the photomask producing method of the fourth embodiment is a method for producing the photomask of the first embodiment, i.e., a photomask including an isolated light-shielding pattern formed from a light-shielding film region and a mask enhancer on a transparent substrate. In the fourth embodiment, NA is a numerical aperture of a reduction projection optical system of an aligner, λ is a wavelength of exposure light, i.e., a light source, and M is a magnification of the reduction projection optical system of the aligner.

FIGS. 24(a) to (g) are cross-sectional views illustrating the steps of the photomask producing method of the fourth embodiment, respectively. FIGS. 24(h) to (l) are plan views corresponding to FIGS. 24(b), (c), (e), (f) and (g), respectively.

Figure 24A:
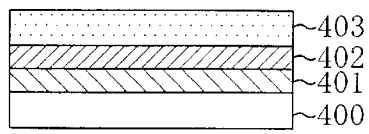
FIGS. 24(a) to (g) are cross-sectional views illustrating the steps of a photomask producing method of a fourth embodiment of the invention, respectively.

First, as shown in FIG. 24(a), a phase shifter layer 401 of, e.g., an SOG (Spin on Glass) film is formed on a transparent substrate 400 of, e.g., quartz glass so as to have such a thickness that provides the light transmitted therethrough with phase inversion of 180 degrees with respect to the exposure light. Then, a light-shielding film 402 of, e.g., a chromium compound is deposited on the phase shifter layer 401, and a resist is applied to the light-shielding film 402 to form a first resist film 403.

Figure 24B:
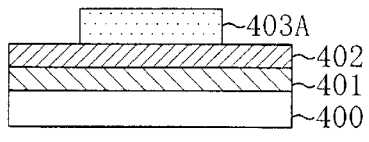
Figure 24H:
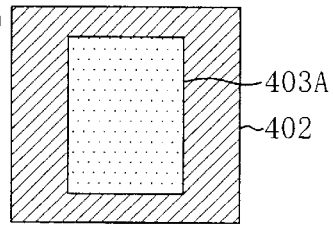
FIGS. 24(h) to (l) are plan views corresponding to FIGS. 24(b), (c), (e), (f) and (g), respectively.

Then, a pattern is written on the first resist film 403 by using a mask writing apparatus. The first resist film 403 is then developed, whereby a first resist pattern 403A covering the mask-pattern formation region is produced as shown in FIG. 24(b) or FIG. 24(h).

Figure 24C:
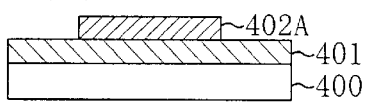
Figure 24I:
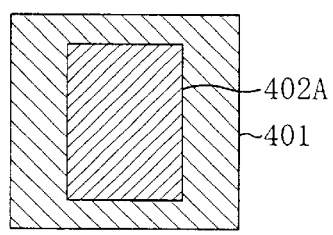

Thereafter, the light-shielding film 402 is etched using the first resist pattern 403A as a mask. As a result, as shown in FIG. 24(c) or FIG. 24(i), a mask pattern 402A of the light-shielding film 402 is formed, and then the first resist pattern 403A is removed.

Figure 24D:
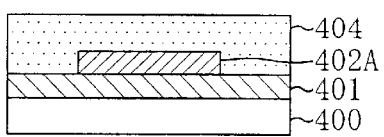

As shown in FIG. 24(d), a resist is applied to the transparent substrate 400 having the mask pattern 402A thereon, thereby forming a second resist film 404.

Figure 24E:
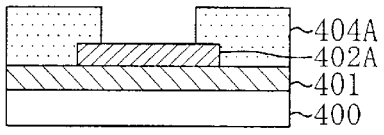
Figure 24J:
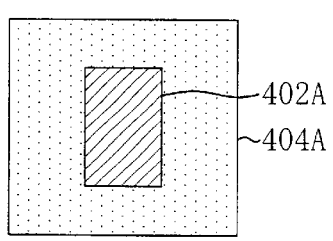

Thereafter, a pattern is written on the second resist film 404 by using the mask writing apparatus. The second resist film 404 is then developed, whereby a second resist pattern 404A having an opening in the mask-enhancer formation region is produced as shown in FIG. 24(e) or FIG. 24(j).

Figure 24F:
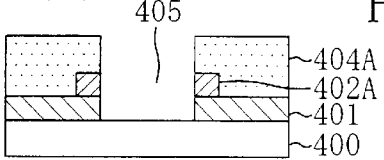
Figure 24K:
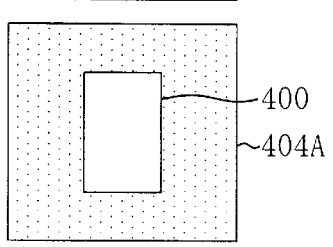
Figure 24G:
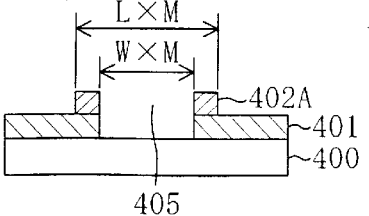
Figure 24L:
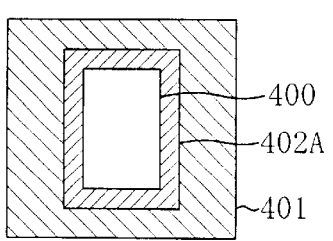

As shown in FIG. 24(f) or FIG. 24(k), the mask pattern 402A and the phase shifter layer 401 are sequentially etched using the second resist pattern 404A as a mask, whereby an opening 405 is formed in the mask pattern 402A, as well as the phase shifter layer 401 located under the opening 405 is removed. The second resist pattern 404A is then removed as shown in FIG. 24(g) or FIG. 24(l).

As has been described above, according to the fourth embodiment, the mask pattern 402A is formed by patterning the light-shielding film 402 on the phase shifter layer 401 formed on the transparent substrate 400. Thereafter, the opening 405 located in the mask-enhancer formation region is formed in the mask pattern 402A, and the phase shifter layer 401 located under the opening 405 is then removed. This enables the phase difference to be provided between the mask enhancer and the transparent substrate 400 located outside the mask pattern 402A, i.e., the light-transmitting region. Therefore, the photomask of the first embodiment can be formed by setting the width of the opening 405, i.e., the width of the mask enhancer, such that the light-shielding property of the mask enhancer becomes at least about the same as that of the light-shielding film having the same width.

Moreover, according to the fourth embodiment, the patterning step for forming the mask pattern 402A is conducted independently of the patterning step for forming the opening 405. This enables accurate dimensional control of the mask pattern 402A including the opening 405, i.e., the light-shielding pattern, as well as the mask enhancer, whereby the photomask of the first embodiment can be reliably produced.

Moreover, according to the fourth embodiment, the phase difference is provided between the light-transmitting region and the mask enhancer by removing the phase shifter layer 401 located under the opening 405. This facilitates management of the etching step as compared to the case where the phase difference is provided by etching the transparent substrate 400. Thus, the phase error is reduced as well as the phase shifter layer 401 with a vertical edge can be easily formed.

Moreover, according to the fourth embodiment, the light-shielding pattern is not necessarily be required for etching the phase shifter layer 401, as opposed to the case of etching the transparent substrate 400. Therefore, no problem will occur even if the light-shielding film region surrounding the opening 405 is eliminated upon forming the opening 405 due to misalignment of the mask writing apparatus.

Advantages of the photomask producing method of the fourth embodiment over the conventional photomask producing method, i.e., advantages obtained by the characteristics of the mask enhancer, are the same as those of the third embodiment.

Note that, although the fourth embodiment uses quartz glass as a material of the transparent substrate 400, the present invention is not limited to this, and calcium fluoride or the like may alternatively be used.

Although the fourth embodiment uses as a material of the phase shifter layer 401 an SOG film that provides the light transmitted therethrough with phase inversion of 180 degrees with respect to the exposure light, the present invention is not limited to this, and any transparent film that provides the light transmitted therethrough with phase inversion of (170+360×n) to (190+360×n) degrees (where n is an integer) with respect to the exposure light may be used.

Although the fourth embodiment uses a chromium compound as a material of the light-shielding film 402, the present invention is not limited to this, and a metal such as chromium, silicon or zirconium, a compound thereof or the like may alternatively be used.

In the fourth embodiment, it is preferable that W·0.4×λ/NA, when the width of the opening 405, i.e., the width of the mask enhancer, is (W×M).

In the fourth embodiment, it is preferable that L·0.8×λ/NA, when the width of the mask pattern 402A including the opening 405, i.e., the width of the light-shielding pattern, is (L×M). In this case, it is preferable that: W·(0.8×λ/NA)−L and W·L or W·L−2E; or 0.5×(((0.8×λ/NA)−L)/2)·W·1.5×(((0.8×λ/NA)−L)/2) and W·L or W·L−2E.

First Modification of Fourth Embodiment

Hereinafter, a method for producing a photomask according to the first modification of the fourth embodiment of the invention will be described with reference to the figures.

Note that the first modification of the fourth embodiment is different from the fourth embodiment in the following point: in the fourth embodiment, the phase shifter layer located under the opening is removed. However, in the first modification of the fourth embodiment, the phase shifter layer located outside the mask pattern is removed.

FIGS. 25(a) to (h) are cross-sectional views illustrating the steps of the photomask producing method of the first modification of the fourth embodiment, respectively. FIGS. 25(i) to (n) are plan views corresponding to FIGS. 25(b), (c), (d), (f), (g) and (h), respectively.

Figure 25A:
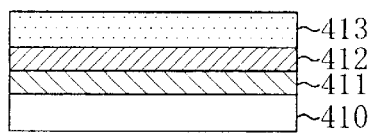
FIGS. 25(a) to (h) are cross-sectional views illustrating the steps of a photomask producing method of a first modification of the fourth embodiment of the invention, respectively.

First, as shown in FIG. 25(a), a phase shifter layer 411 of, e.g., an SOG (Spin on Glass) film is formed on a transparent substrate 410 of, e.g., quartz glass so as to have such a thickness that provides the light transmitted therethrough with phase inversion of 180 degrees with respect to the exposure light. Then, a light-shielding film 412 of, e.g., a chromium compound is deposited on the phase shifter layer 411, and a resist is applied to the light-shielding film 412 to form a first resist film 413.

Figure 25B:
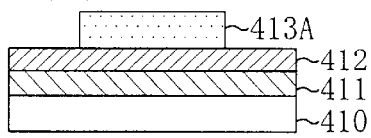
Figure 25C:
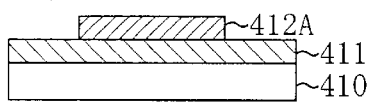

Then, a pattern is written on the first resist film 413 by using a mask writing apparatus. The first resist film 413 is then developed, whereby a first resist pattern 413A covering the mask-pattern formation region is produced as shown in FIG. 25(b) or FIG. 25(i).

Thereafter, the light-shielding film 412 is etched using the first resist pattern 413A as a mask. As a result, as shown in FIG. 25(c) or FIG. 25(j), a mask pattern 412A of the light-shielding film 412 is formed, and then the first resist pattern 413A is removed.

Figure 25D:
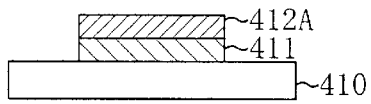
Figure 25E:
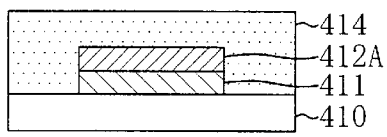
Figure 25F:
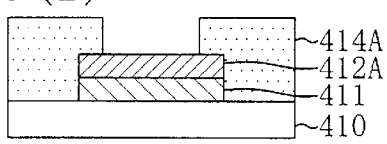
Figure 25G:
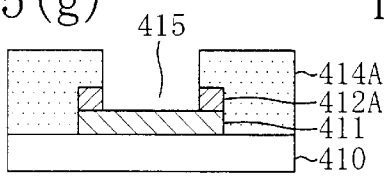
Figure 25H:
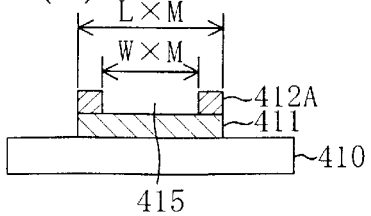
Figure 25I:
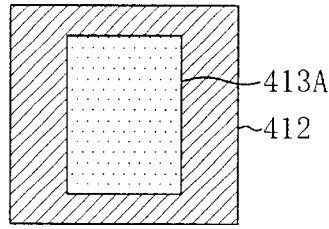
FIGS. 25(i) to (n) are plan views corresponding to FIGS. 25(b), (c), (d), (f), (g) and (h), respectively.
Figure 25J:
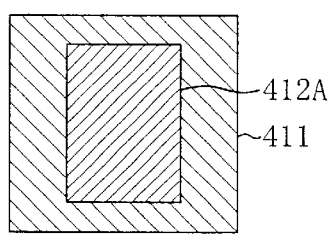
Figure 25K:
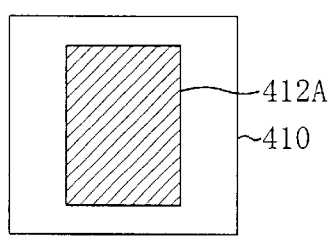

As shown in FIG. 25(d) or FIG. 25(k), the phase shifter layer 411 is then etched using the mask pattern 412A, so that the phase shifter layer 411 located outside the mask pattern 412A is removed.

As shown in FIG. 25(e), a resist is then applied to the transparent substrate 410 including the mask pattern 412A, thereby forming a second resist film 414.

Figure 25L:
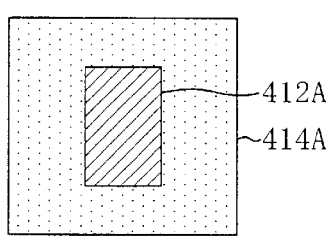

Thereafter, a pattern is written on the second resist film 414 by using the mask writing apparatus. The second resist film 414 is then developed, whereby a second resist pattern 414A having an opening in the mask-enhancer formation region is formed as shown in FIG. 25(f) or FIG. 25(l).

Figure 25M:
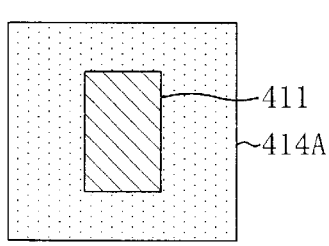
Figure 25N:
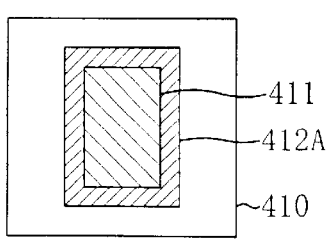

As shown in FIG. 25(g) or FIG. 25(m), the mask pattern 412A is etched using the second resist pattern 414A as a mask, whereby an opening 415 is formed in the mask pattern 412A. The second resist pattern 414A is then removed as shown in FIG. 25(h) or FIG. 25(n).

As has been described above, according to the first modification of the fourth embodiment, the mask pattern 412A is formed by patterning the light-shielding film 412 on the phase shifter layer 411 formed on the transparent substrate 410. Thereafter, the phase shifter layer 411 located outside the mask pattern 412A is removed, and the opening 415 located in the mask enhancer formation region is then formed in the mask pattern 412A. This enables the phase difference to be provided between the mask enhancer and the transparent substrate 410 located outside the mask pattern 412A, i.e., the light-transmitting region. Therefore, the photomask of the first embodiment can be formed by setting the width of the opening 415, i.e., the width of the mask enhancer, such that the light-shielding property of the mask enhancer becomes at least about the same as that of the light-shielding film having the same width.

Moreover, according to the first modification of the fourth embodiment, the patterning step for forming the mask pattern 412A is conducted independently of the patterning step for forming the opening 415. This enables accurate dimensional control of the mask pattern 412A including the opening 415, i.e., the light-shielding pattern, as well as the mask enhancer, whereby the photomask of the first embodiment can be reliably produced.

Moreover, according to the first modification of the fourth embodiment, the phase difference is provided between the light-transmitting region and the mask enhancer by removing the phase shifter layer 411 located outside the mask pattern 412A. This facilitates management of the etching step as compared to the case where the phase difference is provided by etching the transparent substrate 410. Thus, the phase error is reduced as well as the phase shifter layer 411 with a vertical edge can be easily formed. Moreover, production of the photomask of the first embodiment is facilitated as compared to the case where the phase difference is provided by removing the phase shifter layer 411 located under the opening 415 having a small area. Moreover, the phase shifter layer 411 is etched using the mask pattern 412A in which the opening 415 has not yet been formed. This eliminates the need to conduct formation of the mask pattern and etching of the shifter layer successively by using a resist pattern as in the case where the mask pattern is formed after formation of the opening. Accordingly, production of the photomask of the first embodiment is facilitated.

Advantages of the photomask producing method of the first modification of the fourth embodiment over the conventional photomask producing method, i.e., advantages obtained by the characteristics of the mask enhancer, are the same as those of the third embodiment.

Note that, although the first modification of the fourth embodiment uses quartz glass as a material of the transparent substrate 410, the present invention is not limited to this, and calcium fluoride or the like may alternatively be used.

Although the first modification of the fourth embodiment uses as a material of the phase shifter layer 411 an SOG film that provides the light transmitted therethrough with phase inversion of 180 degrees with respect to the exposure light, the present invention is not limited to this, and any transparent film that provides the light transmitted therethrough with phase inversion of (170+360×n) to (190+360×n) degrees (where n is an integer) with respect to the exposure light may be used.

Although the first modification of the fourth embodiment uses a chromium compound as a material of the light-shielding film 412, the present invention is not limited to this, and a metal such as chromium, silicon or zirconium, a compound thereof or the like may alternatively be used.

In the first modification of the fourth embodiment, it is preferable that W·0.4×λ/NA, when the width of the opening 415, i.e., the width of the mask enhancer, is (W×M).

In the first modification of the fourth embodiment, it is preferable that L·0.8×λ/NA, when the width of the mask pattern 412A including the opening 415, i.e., the width of the light-shielding pattern, is (L×M). In this case, it is preferable that: W·(0.8×λ/NA)−L and W·L or W·L 2E; or 0.5×(((0.8× λ/NA)−L)/2)·W·1.5×(((0.8×λ/NA)−L)/2) and W·L or W·L− 2E.

Second Modification of Fourth Embodiment

Hereinafter, a method for producing a photomask according to the second modification of the fourth embodiment of the invention will be described with reference to the figures.

Note that the second modification of the fourth embodiment is different from the fourth embodiment in the following point: in the fourth embodiment, the patterning step for forming the opening is conducted after the patterning step for forming the mask pattern, and the phase shifter layer located under the opening is removed. However, in the second modification of the fourth embodiment, the patterning step for forming the opening is conducted before the patterning step for forming the mask pattern, and the phase shifter layer located outside the mask pattern is removed.

FIGS. 26(a) to (g) are cross-sectional views illustrating the steps of the photomask producing method of the second modification of the fourth embodiment, respectively. FIGS. 26(h) to (k) are plan views corresponding to FIGS. 26(b), (c), (e) and (g), respectively.

Figure 26A:
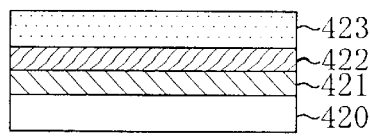
FIGS. 26(a) to (g) are cross-sectional views illustrating the steps of a photomask producing method of a second modification of the fourth embodiment of the invention, respectively.

First, as shown in FIG. 26(a), a phase shifter layer 421 of, e.g., an SOG film is formed on a transparent substrate 420 of, e.g., quartz glass so as to have such a thickness that provides the light transmitted therethrough with phase inversion of 180 degrees with respect to the exposure light. Then, a light-shielding film 422 of, e.g., a chromium compound is deposited on the phase shifter layer 421, and a resist is applied to the light-shielding film 422 to form a first resist film 423.

Figure 26B:
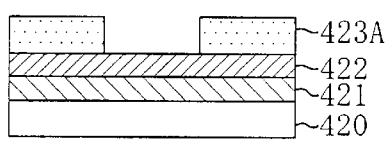
Figure 26H:
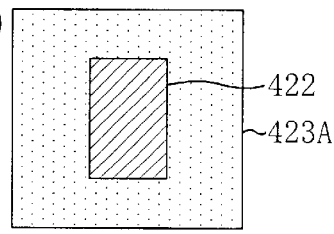
FIGS. 26(h) to (k) are plan views corresponding to FIGS. 26(b), (c), (e) and (g), respectively.

Then, a pattern is written on the first resist film 423 by using a mask writing apparatus. The first resist film 423 is then developed, whereby a first resist pattern 423A having an opening in the mask-enhancer formation region is formed as shown in FIG. 26(b) or FIG. 26(h).

Figure 26C:
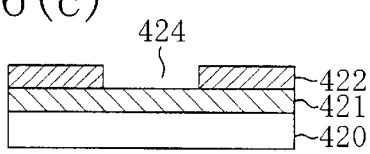
Figure 26I:
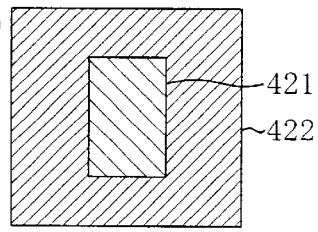

Thereafter, the light-shielding film 422 is etched using the first resist pattern 423A as a mask. As a result, as shown in FIG. 26(c) or FIG. 26(i), an opening 424 is formed in the light-shielding film 422, and then the first resist pattern 423A is removed.

Figure 26D:
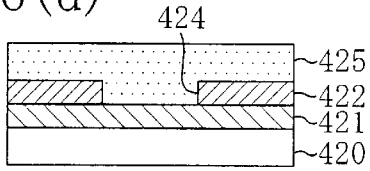

As shown in FIG. 26(d), a resist is then applied to the light-shielding film 422 including the opening 424, thereby forming a second resist film 425.

Figure 26E:
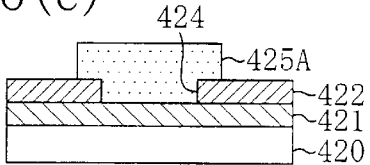
Figure 26J:
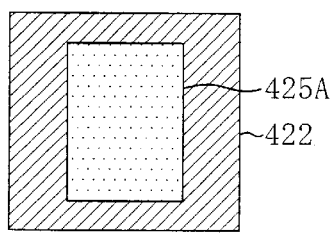

Thereafter, a pattern is written on the second resist film 425 by using the mask writing apparatus. The second resist film 425 is then developed, whereby a second resist pattern 425A covering the mask-pattern formation region is produced as shown in FIG. 26(e) or FIG. 26(j).

Figure 26F:
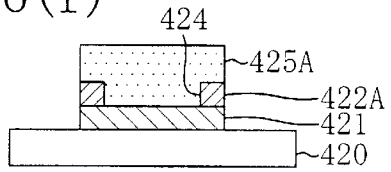
Figure 26G:
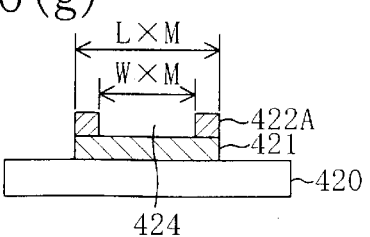
Figure 26K:
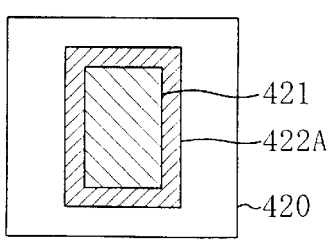

As shown in FIG. 26(f), the light-shielding film 422 and the phase shifter layer 421 are sequentially etched using the second resist pattern 425A as a mask. As a result, a mask pattern 422A formed from the light-shielding film 422 and having the opening 424 is formed, as well as the phase shifter layer 421 located outside the mask pattern 422A is removed. As shown in FIG. 26(g) or FIG. 26(k), the second resist pattern 425A is then removed.

As has been described above, according to the second modification of the fourth embodiment, the opening 424 located in the mask-enhancer formation region is formed in the light-shielding film 422 on the phase shifter layer 421 formed on the transparent substrate 420. Thereafter, the mask pattern 422A having the opening 424 is formed by patterning the light-shielding film 422, and the phase shifter layer 421 located outside the mask pattern 422A is then removed. This enables the phase difference to be provided between the mask enhancer and the transparent substrate 420 located outside the mask pattern 422A, i.e., the light-transmitting region. Therefore, the photomask of the first embodiment can be formed by setting the width of the opening 424, i.e., the width of the mask enhancer, such that the light-shielding property of the mask enhancer becomes at least about the same as that of the light-shielding film having the same width.

Moreover, according to the second modification of the fourth embodiment, the patterning step for forming the mask pattern 422A is conducted independently of the patterning step for forming the opening 424. This enables accurate dimensional control of the mask pattern 422A including the opening 424, i.e., the light-shielding pattern, as well as the mask enhancer, whereby the photomask of the first embodiment can be reliably produced.

Moreover, according to the second modification of the fourth embodiment, the phase difference is provided between the light-transmitting region and the mask enhancer by removing the phase shifter layer 421 located outside the mask pattern 422A. This facilitates management of the etching step as compared to the case where the phase difference is provided by etching the transparent substrate 420. Thus, the phase error is reduced as well as the phase shifter layer 421 with a vertical edge can be easily formed. Moreover, production of the photomask of the first embodiment is facilitated as compared to the case where the phase difference is provided by removing the phase shifter layer 421 located under the opening 424 having a small area.

Moreover, according to the second modification of the fourth embodiment, the light-shielding pattern is not necessarily be required for etching the phase shifter layer 421, as opposed to the case of etching the transparent substrate 420. Therefore, no problem will occur even if the light-shielding film region surrounding the opening 424 is eliminated upon forming the mask pattern 422A due to misalignment of the mask writing apparatus.

Advantages of the photomask producing method of the second modification of the fourth embodiment over the conventional photomask producing method, i.e., advantages obtained by the characteristics of the mask enhancer, are the same-as those of the third embodiment.

Note that, although the second modification of the fourth embodiment uses quartz glass as a material of the transparent substrate 420, the present invention is not limited to this, and calcium fluoride or the like may alternatively be used.

Although the second modification of the fourth embodiment uses as a material of the phase shifter layer 421 an SOG film that provides the light transmitted therethrough with phase inversion of 180 degrees with respect to the exposure light, the present invention is not limited to this, and any transparent film that provides the light transmitted therethrough with phase inversion of (170+360×n) to (190+360×n) degrees (where n is an integer) with respect to the exposure light may be used.

Although the second modification of the fourth embodiment uses a chromium compound as a material of the light-shielding film 422, the present invention is not limited to this, and a metal such as chromium, silicon or zirconium, a compound thereof or the like may alternatively be used.

In the second modification of the fourth embodiment, it is preferable that W·0.4×λ/NA, when the width of the opening 424, i.e., the width of the mask enhancer, is (W×M).

In the second modification of the fourth embodiment, it is preferable that L·0.8×λ/NA, when the width of the mask pattern 422A including the opening 424, i.e., the width of the light-shielding pattern, is (L×M). In this case, it is preferable that: W·(0.8×λ/NA)−L and W·L or W·L 2E; or 0.5×(((0.8×λ/NA)−L)/2)·W·1.5×(((0.8×λ/NA)−L)/2) and W·L or W·L−2E.

Third Modification of Fourth Embodiment

Hereinafter, a method for producing a photomask according to the third modification of the fourth embodiment of the invention will be described with reference to the figures.

Note that the third modification of the fourth embodiment is different from the fourth embodiment in the following point: in the fourth embodiment, the patterning step for forming the opening is conducted after the patterning step for forming the mask pattern. However, in the third modification of the fourth embodiment, the patterning step for forming the opening is conducted before the patterning step for forming the mask pattern.

FIGS. 27(a) to (g) are cross-sectional views illustrating the steps of the photomask producing method of the third modification of the fourth embodiment, respectively. FIGS. 27(h) to (l) are plan views corresponding to FIGS. 27(b), (c), (d), (f) and (g), respectively.

Figure 27A:
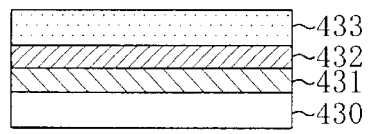
FIGS. 27(a) to (g) are cross-sectional views illustrating the steps of a photomask producing method of a third modification of the fourth embodiment of the invention, respectively.

First, as shown in FIG. 27(a), a phase shifter layer 431 of, e.g., an SOG film is formed on a transparent substrate 430 of, e.g., quartz glass so as to have such a thickness that provides the light transmitted therethrough with phase inversion of 180 degrees with respect to the exposure light. Then, a light-shielding film 432 of, e.g., a chromium compound is deposited on the phase shifter layer 431, and a resist is applied to the light-shielding film 432 to form a first resist film 433.

Figure 27B:
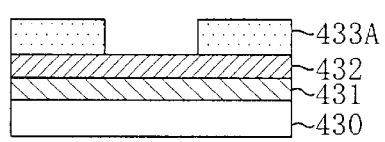
Figure 27H:
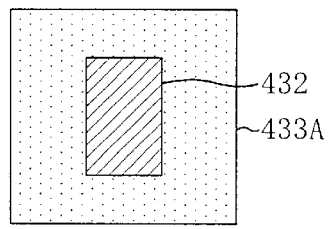
FIGS. 27(h) to (l) are plan views corresponding to FIGS. 27(b), (c), (d), (f) and (g), respectively.

Then, a pattern is written on the first resist film 433 by using a mask writing apparatus. The first resist film 433 is then developed, whereby a first resist pattern 433A having an opening in the mask-enhancer formation region is formed as shown in FIG. 27(b) or FIG. 27(h).

Figure 27C:
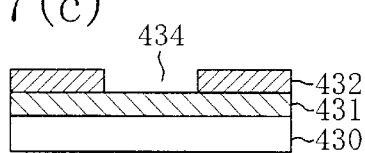
Figure 27I:
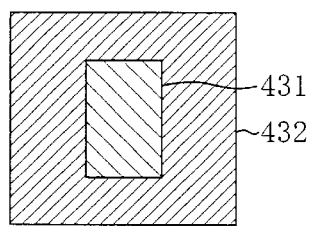

Thereafter, the light-shielding film 432 is etched using the first resist pattern 433A as a mask. As a result, as shown in FIG. 27(c) or FIG. 27(i), an opening 434 is formed in the light-shielding. film 432, and then the first resist pattern 433A is removed.

Figure 27D:
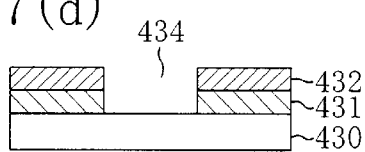
Figure 27J:
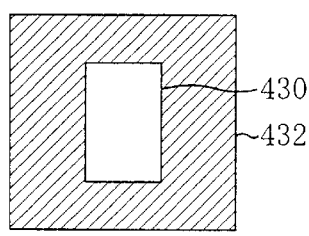

As shown in FIG. 27(d) or FIG. 27(j), the phase shifter layer 431 is then etched using the light-shielding film 432 15 having the opening 434 as a mask, so that the phase shifter layer 431 located outside the opening 434 is removed.

Figure 27E:
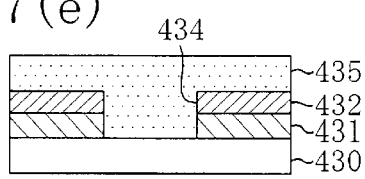

As shown in FIG. 27(e), a resist is then applied to the light-shielding film 432 including the opening 434, thereby forming a second resist film 435.

Figure 27F:
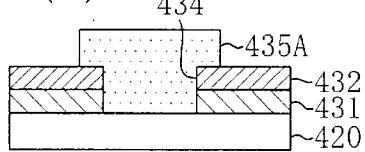
Figure 27K:
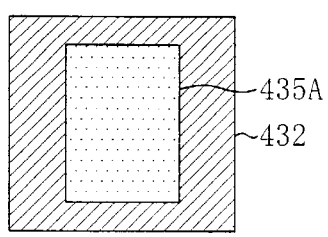

Thereafter, a pattern is written on the second resist film 435 by using the mask writing apparatus. The second resist film 435 is then developed, whereby a second resist pattern 435A covering the mask-pattern formation region is produced as shown in FIG. 27(f) or FIG. 27(k).

Figure 27G:
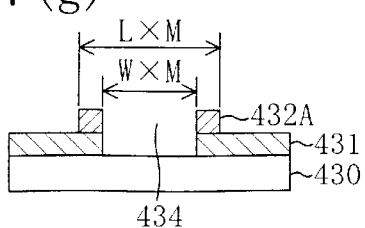
Figure 27L:
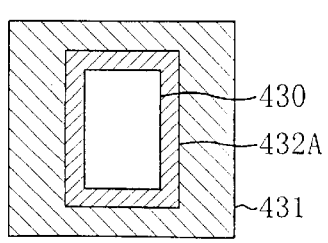
Figure 28A:
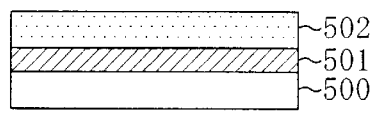
FIGS. 28(a) to (g) are cross-sectional views illustrating the steps of a photomask producing method of a fifth embodiment of the invention, respectively.
Figure 28B:
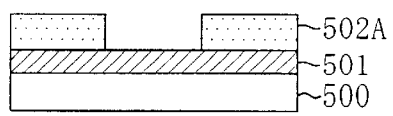
Figure 28H:
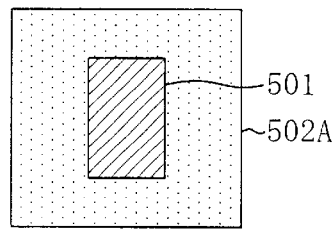
FIGS. 28(h) to (l) are plan views corresponding to FIGS. 28(b), (c), (e), (f) and (g), respectively.
Figure 28C:
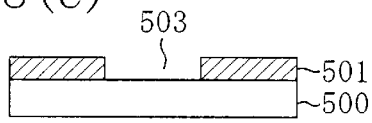
Figure 28I:
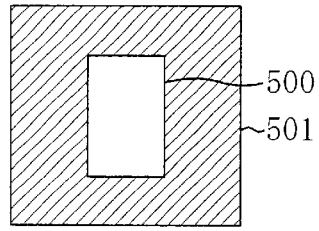
Figure 28D:
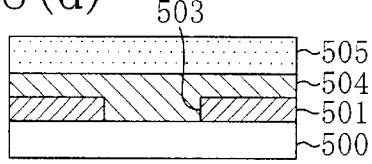
Figure 28E:
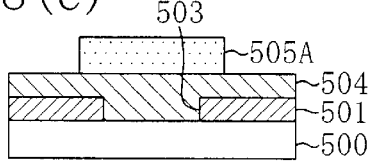
Figure 28J:
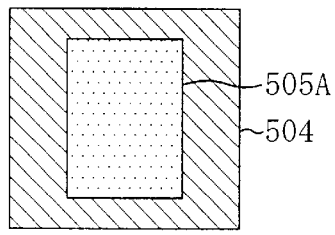
Figure 28F:
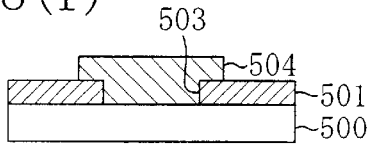
Figure 28K:
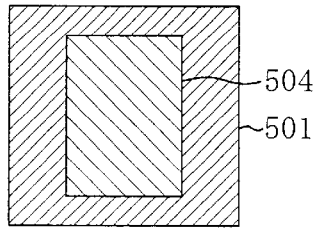
Figure 28G:
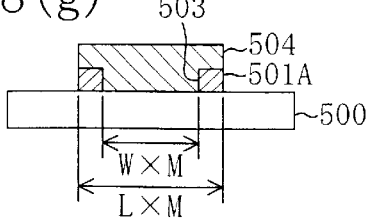
Figure 28L:
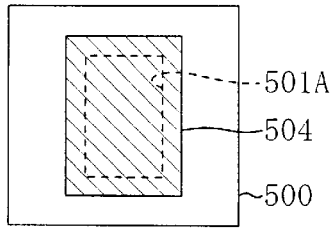

The light-shielding film 432 is then etched using the second resist pattern 435A as a mask. As a result, as shown in FIG. 27(g) or FIG. 27(l), the mask pattern 432A formed from the light-shielding film 432 and having the opening 434 is formed, and then the second resist pattern 435A is removed.

As has been described above, according to the third modification of the fourth embodiment, the opening 434 located in the mask-enhancer formation region is formed in the light-shielding film 432 on the phase shifter layer 431 formed on the transparent substrate 430. Thereafter, the phase shifter layer 431 located under the opening 434 is removed, and the mask pattern 432A having the opening 434 is then formed by patterning the light-shielding film 432. This enables the phase difference to be provided between the mask enhancer and the transparent substrate 430 located outside the mask pattern 432A, i.e., the light-transmitting region. Therefore, the photomask of the first embodiment can be formed by setting the width of the opening 434, i.e., the width of the mask enhancer, such that the light-shielding property of the mask enhancer becomes at least about the same as that of the light-shielding film having the same width.

Moreover, according to the third modification of the fourth embodiment, the patterning step for forming the mask pattern 432A is conducted independently of the patterning step for forming the opening 434. This enables accurate dimensional control of the mask pattern 432A including the opening 434, i.e., the light-shielding pattern, as well as the mask enhancer, whereby the photomask of the first embodiment can be reliably produced.

Moreover, according to the third modification of the fourth embodiment, the phase difference is provided between the light-transmitting region and the mask enhancer by removing the phase shifter layer 431 located outside the opening 434. This facilitates management of the etching step as compared to the case where the phase difference is provided by etching the transparent substrate 430. Thus, the phase error is reduced as well as the phase shifter layer 431 with a vertical edge can be easily formed.

Moreover, according to the third modification of the fourth embodiment, the patterning step for forming the opening 434 is conducted before the patterning step for forming the mask pattern 432A. Therefore, the phase shifter layer 431 can be etched using the light-shielding film 432 having the opening 434 as a mask. This eliminates the need to conduct formation of the opening and etching of the substrate successively by using a resist pattern as in the case where the opening is formed after formation of the mask pattern (e.g., the fourth embodiment). Accordingly, production of the photomask of the first embodiment is facilitated.

Advantages of the photomask producing method of the third modification of the fourth embodiment over the conventional photomask producing method, i.e., advantages obtained by the characteristics of the mask enhancer, are the same as those of the third embodiment.

Note that, although the third modification of the fourth embodiment uses quartz glass as a material of the transparent substrate 430, the present invention is not limited to this, and calcium fluoride or the like may alternatively be used.

Although the third modification of the fourth embodiment uses as a material of the phase shifter layer 431 an SOG film that provides the light transmitted therethrough with phase inversion of 180 degrees with respect to the exposure light, the present invention is not limited to this, and any transparent film that provides the light transmitted therethrough with phase inversion of (170+360×n) to (190+360×n) degrees (where n is an integer) with respect to the exposure light may be used.

Although the third modification of the fourth embodiment uses a chromium compound as a material of the light-shielding film 432, the present invention is not limited to this, and a metal such as chromium, silicon or zirconium, a compound thereof or the like may alternatively be used.

In the third modification of the fourth embodiment, it is preferable that W·0.4×λ/NA, when the width of the opening 434, i.e., the width of the mask enhancer, is (W×M).

In the third modification of the fourth embodiment, it is preferable that L·0.8×λ/NA, when the width of the mask pattern 422A including the opening 434, i.e., the width of the light-shielding pattern, is (L×M). In this case, it is preferable that: W·(0.8×λ/NA)−L and W·L or W·L 2E; or 0.5×(((0.8×λ/NA)−L)/2)·W·1.5×(((0.8×λ/NA)−L)/2) and W·L or W·L−2E.

Fifth Embodiment

Hereinafter, a method for producing a photomask according to the fifth embodiment of the invention will be described with reference to the figures. Note that the photomask producing method of the fifth embodiment is a method for producing the photomask of the first embodiment, i.e., a photomask including an isolated light-shielding pattern formed from a light-shielding film region and a mask enhancer on a transparent substrate. In the fifth embodiment, NA is a numerical aperture of a reduction projection optical system of an aligner, λ is a wavelength of exposure light, i.e., a light source, and M is a magnification of the reduction projection optical system of the aligner.

FIGS. 28(*a*) to (*g*) are cross-sectional views illustrating the steps of the photomask producing method of the fifth embodiment, respectively. FIGS. 28(*h*) to (*l*) are plan views corresponding to FIGS. 28(*b*), (*c*), (*e*), (*f*) and (*g*), respectively.

First, as shown in FIG. 28(*a*), a light-shielding film 501 of, e.g., a chromium compound is deposited on a transparent substrate 500 of, e.g., quartz glass. Then, a resist is applied to the light-shielding film 501 to form a first resist film 502.

Then, a pattern is written on the first resist film 502 by using a mask writing apparatus. The first resist film 502 is then developed, whereby a first resist pattern 502A having an opening in the mask-enhancer formation region is formed as shown in FIG. 28(*b*) or FIG. 28(*h*).

Thereafter, the light-shielding film 501 is etched using the first resist pattern 502A as a mask. As a result, as shown in FIG. 28(*c*) or FIG. 28(*i*), an opening 503 is formed in the light-shielding film 501, and then the first resist pattern 502A is removed.

As shown in FIG. 28(*d*), a phase shifter layer 504 of, e.g., an SOG film is formed on the light-shielding film 501 including the opening 503 so as to have such a thickness that provides the light transmitted therethrough with phase inversion of 180 degrees with respect to the exposure light. Then, a resist is applied to the phase shifter layer 504 to form a second resist film 505.

Then, a pattern is written on the second resist film 505 by using a mask writing apparatus. The second resist film 505 is then developed, whereby a second resist pattern 505A covering the mask-pattern formation region is produced as shown in FIG. 28(*e*) or FIG. 28(*j*).

Thereafter, the phase shifter layer 504 is etched using the second resist pattern 505A as a mask. As a result, as shown in FIG. 28(*f*) or FIG. 28(*k*), the phase shifter layer 504 located outside the mask-pattern formation region is removed, and then the second resist pattern 505A is removed.

As shown in FIG. 28(*g*) or FIG. 28(*l*), the light-shielding film 501 is etched using the patterned phase shifter layer 504 as a mask, whereby a mask pattern 501A formed from the light-shielding film 501 and having the opening 503 is formed. At this time, the mask pattern 501A including the opening 503 is covered with the phase shifter layer 504.

As has been described above, according to the fifth embodiment, the opening 503 located in the mask-enhancer formation region is formed in the light-shielding film 501 on the transparent substrate 500, and then the phase shifter layer 504 is formed on the transparent substrate 500. Thereafter, the phase shifter layer 504 located outside the mask-pattern formation region is removed. The light-shielding film 501 is then patterned so as to form the mask pattern 501A having the opening 503 and covered with the phase shifter layer 504. This enables the phase difference to be provided between the mask enhancer and the transparent substrate 500 located outside the mask pattern 501A, i.e., the light-transmitting region. Therefore, the photomask of the first embodiment can be formed by setting the width of the opening 503, i.e., the width of the mask enhancer, such that the light-shielding property of the mask enhancer becomes at least about the same as that of the light-shielding film having the same width.

Moreover, according to the fifth embodiment, the patterning step for forming the mask pattern 501A is conducted independently of the patterning step for forming the opening 503. This enables accurate dimensional control of the mask pattern 501A including the opening 503, i.e., the light-shielding pattern, as well as the mask enhancer, whereby the photomask of the first embodiment can be reliably produced.

Moreover, according to the fifth embodiment, the phase difference is provided between the light-transmitting region and the mask enhancer by removing the phase shifter layer 504 located outside the mask pattern 501A. This facilitates management of the etching step as compared to the case where the phase difference is provided by etching the transparent substrate 500. Thus, the phase error is reduced as well as the phase shifter layer 504 with a vertical edge can be easily formed.

Moreover, according to the fifth embodiment, if defects are produced in the step of patterning the phase shifter layer 504, it is possible to repair the defects by forming the phase shifter layer 504 again. Therefore, the steps earlier than the step of forming the phase shifter layer need not be repeated, improving the throughput.

Advantages of the photomask producing method of the fifth embodiment over the conventional photomask producing method, i.e., advantages obtained by the characteristics of the mask enhancer, are the same as those of the third embodiment.

Note that, although the fifth embodiment uses quartz glass as a material of the transparent substrate 500, the present invention is not limited to this, and calcium fluoride or the like may alternatively be used.

Although the fifth embodiment uses a chromium compound as a material of the light-shielding film 501, the present invention is not limited to this, and a metal such as chromium, silicon or zirconium, a compound thereof or the like may alternatively be used.

Although the fifth embodiment uses as a material of the phase shifter layer 504 an SOG film that provides the light transmitted therethrough with phase inversion of 180 degrees with respect to the exposure light, the present invention is not limited to this, and any transparent film that provides the light transmitted therethrough with phase inversion of (170+360×n) to (190+360×n) degrees (where n is an integer) with respect to the exposure light may be used.

In the fifth embodiment, it is preferable that W·0.4×λ/NA, when the width of the opening 503, i.e., the width of the mask enhancer, is (W×M).

In the fifth embodiment, it is preferable that L·0.8 ×λ/NA, when the width of the mask pattern 501A including the opening 503, i.e., the width of the light-shielding pattern, is (L×M). In this case, it is preferable that: W·(0.8×λ/NA)−L and W·L or W·L−2E; or 0.5×(((0.8×λ/NA) L)/2)·W·1.5× (((0.8×λ/NA)−L)/2) and W·L or W·L 2E.

Modification of Fifth Embodiment

Hereinafter, a method for producing a photomask according to a modification of the fifth embodiment of the invention will be described with reference to the figures.

Note that the modification of the fifth embodiment is different from the fifth embodiment in the following point: in the fifth embodiment, the patterning step for forming the opening is conducted before the patterning step for forming the mask pattern, and the phase shifter layer located outside the mask pattern is removed. However, in the first modification of the fifth embodiment, the patterning step for forming the opening is conducted after the patterning step for forming the mask pattern, and the phase shifter layer located under the opening is removed.

FIGS. 29(a) to (g) are cross-sectional views illustrating the steps of the photomask producing method of the modification of the fifth embodiment, respectively. FIGS. 29(h) to (l) are plan views corresponding to FIGS. 29(b), (c), (e), (f) and (g), respectively.

Figure 29A:
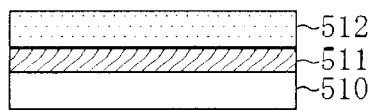
FIGS. 29(a) to (g) are cross-sectional views illustrating the steps of a photomask producing method of a modification of the fifth embodiment of the invention, respectively.

First, as shown in FIG. 29(a), a light-shielding film 511 of, e.g., a chromium compound is deposited on a transparent substrate 510 of, e.g., quartz glass. Then, a resist is applied to the light-shielding film 511 to form a first resist film 512.

Figure 29B:
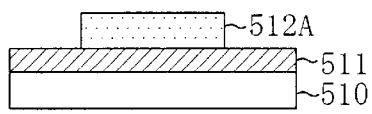
Figure 29H:
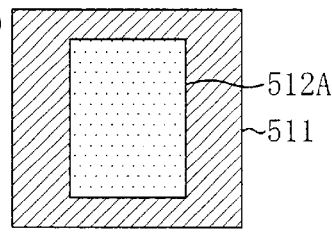
FIGS. 29(h) to (l) are plan views corresponding to FIGS. 29(b), (c), (e), (f) and (g), respectively.

Then, a pattern is written on the first resist film 512 by using a mask writing apparatus. The first resist film 512 is then developed, whereby a first resist pattern 512A covering the mask-pattern formation region is produced as shown in FIG. 29(b) or FIG. 29(h).

Figure 29C:
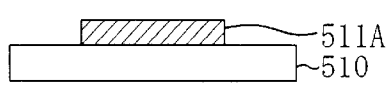
Figure 29I:
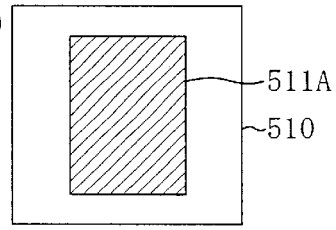

Thereafter, the light-shielding film 511 is etched using the first resist pattern 512A as a mask. As a result, as shown in FIG. 29(c) or FIG. 29(i), the mask pattern 511A of the light-shielding film 511 is formed, and then the first resist pattern 512A is removed.

Figure 29D:
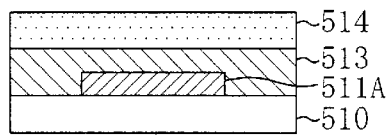

As shown in FIG. 29(d), a phase. shifter layer 513 of, e.g., an SOG film is formed on the transparent substrate 510 including the mask pattern 511A so as to have such a thickness that provides the light transmitted therethrough with phase inversion of 180 degrees with respect to the exposure light. Then, a resist is applied to the phase shifter layer 513 to form a second resist film 514.

Figure 29E:
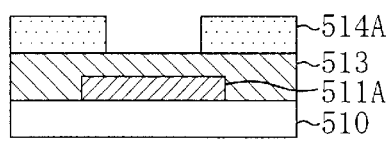
Figure 29J:
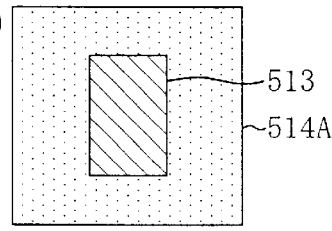

Then, a pattern is written on the second resist film 514 by using a mask writing apparatus. The second resist film 514 is then developed, whereby a second resist pattern 514A having an opening in the mask-enhancer formation region is formed as shown in FIG. 29(e) or FIG. 29(j).

Figure 29F:
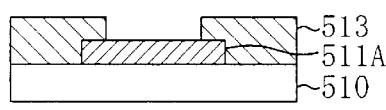
Figure 29K:
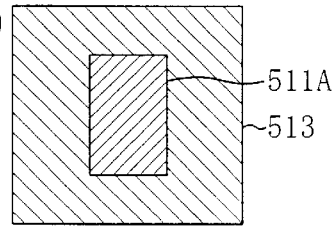

Thereafter, the phase shifter layer 513 is etched using the second resist pattern 514A as a mask. As a result, as shown in FIG. 29(f) or FIG. 29(k), the phase shifter layer 513 located in the mask-enhancer formation region is removed, and then the second resist pattern 514A is removed.

Figure 29G:
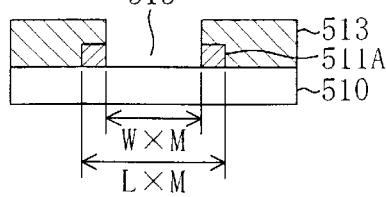
Figure 29L:
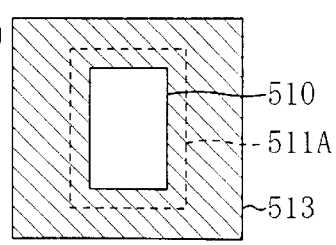

As shown in FIG. 29(g) or FIG. 29(l), the mask pattern 511A is etched using the patterned phase shifter layer 513 as a mask, whereby an opening 515 is formed in the mask pattern 511A.

As has been described above, according to the modification of the fifth embodiment, the light-shielding film 511 on the transparent substrate 510 is patterned so as to form the mask pattern 511A. Thereafter, the phase shifter layer 513 is formed on the transparent substrate 510, and then the phase shifter layer 513 located in the mask-enhancer formation region is removed. Then, the opening 515 located in the mask-enhancer formation region is formed in the mask pattern 511A. This enables the phase difference to be provided between the mask enhancer and the transparent substrate 510 located outside the mask pattern 511A, i.e., the light-transmitting region. Therefore, the photomask of the first embodiment can be formed by setting the width of the opening 515, i.e., the width of the mask enhancer, such that the light-shielding property of the mask enhancer becomes at least about the same as that of the light-shielding film having the same width.

Moreover, according to the modification of the fifth embodiment, the patterning step for forming the mask pattern 511A is conducted independently of the patterning step for forming the opening 515. This enables accurate dimensional control of the mask pattern 511A including the opening 515, i.e., the light-shielding pattern, as well as the mask enhancer, whereby the photomask of the first embodiment can be reliably produced.

Moreover, according to the modification of the fifth embodiment, the phase difference is provided between the light-transmitting region and the mask enhancer by removing the phase shifter layer 513 located in the mask-enhancer formation region. This facilitates management of the etching step as compared to the case where the phase difference is provided by etching the transparent substrate 510. Thus, the phase error is reduced as well as the phase shifter layer 513 with a vertical edge can be easily formed.

Moreover, according to the modification of the fifth embodiment, if defects are produced in the step of patterning the phase shifter layer 513, it is possible to repair the defects by forming the phase shifter layer 513 again. Therefore, the steps earlier than the step of forming the phase shifter layer need not be repeated, improving the throughput.

Advantages of the photomask producing method of the modification of the fifth embodiment over the conventional photomask producing method, i.e., advantages obtained by the characteristics of the mask enhancer, are the same as those of the third embodiment.

Note that, although the modification of the fifth embodiment uses quartz glass as a material of the transparent substrate 510, the present invention is not limited to this, and calcium fluoride or the like may alternatively be used.

Although the modification of the fifth embodiment uses a chromium compound as a material of the light-shielding film 511, the present invention is not limited to this, and a metal such as chromium, silicon or. zirconium, a compound thereof or the like may alternatively be used.

Although the modification of the fifth embodiment uses as a material of the phase shifter layer 513 an SOG film that provides the light transmitted therethrough with phase inversion of 180 degrees with respect to the exposure light, the present invention is not limited to this, and any transparent film that provides the light transmitted therethrough with phase inversion of (170+360×n) to (190+360×n) degrees (where n is an integer) with respect to the exposure light may be used.

In the modification of the fifth embodiment, it is preferable that W·0.4×λ/NA, when the width of the opening 515, i.e., the width of the mask enhancer, is (W×M).

In the modification of the fifth embodiment, it is preferable that L·0.8×λ/NA, when the width of the mask pattern 511A including the opening 515, i.e., the width of the light-shielding pattern, is (L×M). In this case, it is preferable that: W·(0.8×λ/NA)–L and W·L or W·L2E; or 0.5×(((0.8×λ/NA)–L)/2) W·1.5×(((0.8×λ/NA)–L)/2) and W·L or W·L–2E.

Sixth Embodiment

Hereinafter, a method for producing pattern layout and a method for producing mask-writing data according to the sixth embodiment of the invention will be described with reference to the figures. Note that the pattern-layout producing method and the mask-writing data producing method of the sixth embodiment are the pattern-layout producing method and mask-writing data producing method for producing a photomask having a mask-enhancer structure on the assumption that the patterning method using the photomask of the first embodiment, i.e., a photomask having the mask-enhancer structure (the patterning method of the second embodiment) is used. In the sixth embodiment, NA is a numerical aperture of a reduction projection optical system of an aligner, λ is a wavelength of exposure light, i.e., a light source, and M is a magnification of the reduction projection optical system of the aligner.

Figure 30:
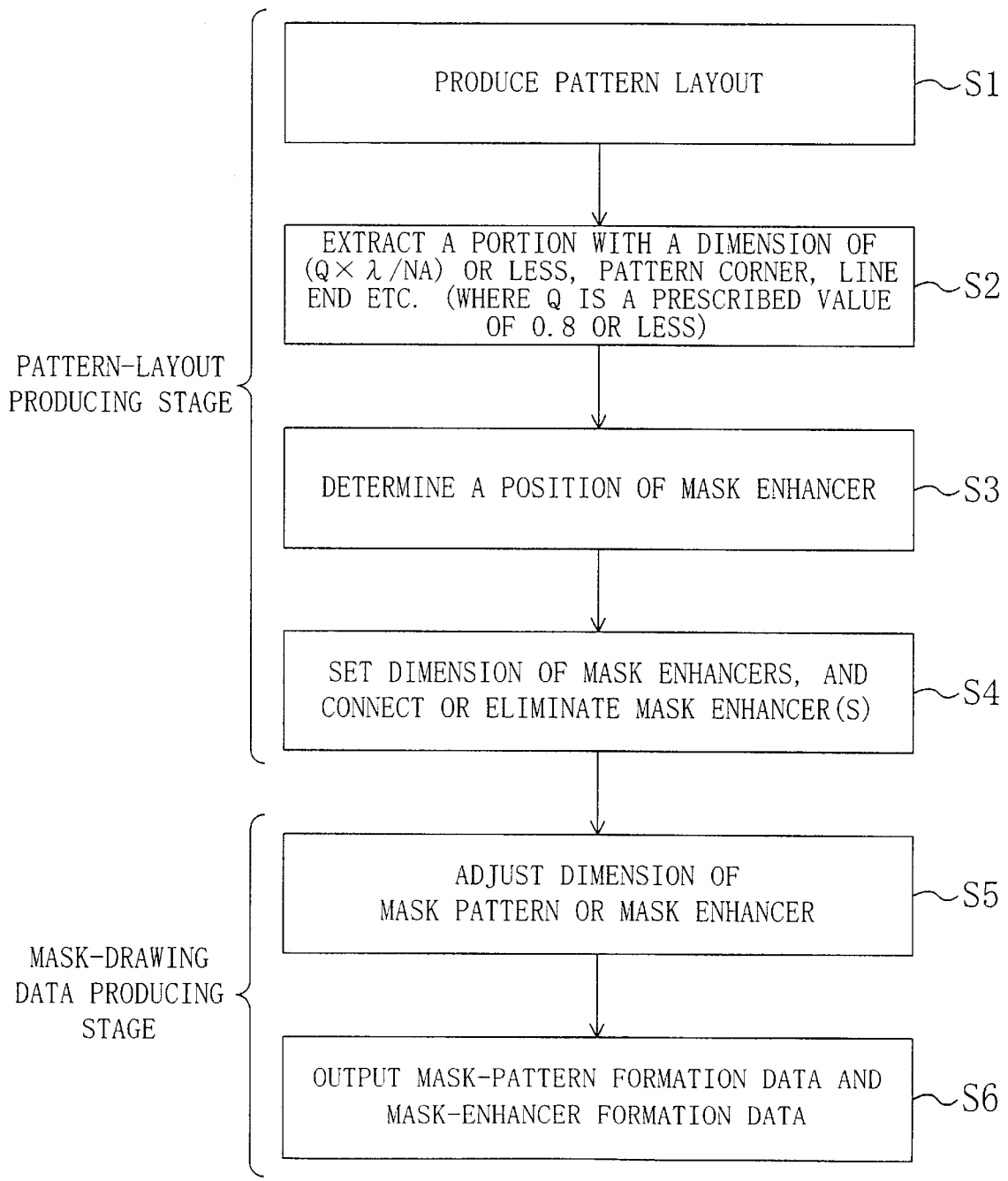
FIG. 30 is a flowchart illustrating a pattern-layout producing method and a mask-writing data producing method of a sixth embodiment of the invention.

FIG. 30 is a flowchart illustrating the pattern-layout producing method and the mask-writing data producing method of the sixth embodiment.

First, the pattern-layout producing method will be described.

In step S1, the pattern layout of a mask pattern (light-shielding pattern) to be formed on a photomask is produced.

In step S2, a line pattern having a width L×M equal to or smaller than (Q×λ/NA)×M (where Q is a prescribed value equal to or smaller than 0.8) is extracted from the pattern layout produced in step S1. At this time, a pattern end, pattern corner or another required portion may additionally be extracted from the pattern layout.

In step S3, the inside of the line pattern, pattern end, pattern corner or the like thus extracted in step S2 is determined as a position where a pattern representing a mask enhancer (hereinafter, sometimes simply referred to as a mask enhancer) is to be provided.

In step S4, the dimension of each mask enhancer to be provided at the corresponding position determined in step S3 is set based on the dimension of the line pattern or the like containing the corresponding mask enhancer. Provided that the line pattern of interest has a width L×M and the mask enhancer provided inside this line pattern has a width W×M, the value W is set to ((0.8×λ/NA)–L)/2 (where L·(0.8×λ/NA)). For example, when the distance between the mask enhancers is smaller than a prescribed value (e.g., the minimum distance required to form adjacent mask enhancers separately from each other), or when the mask enhancers overlap each other, the mask enhancers are connected together. Moreover, the mask enhancer that is smaller than a prescribed dimension (e.g., the resolution of a mask writing apparatus) is eliminated.

Hereinafter, the mask-writing data producing method will be described.

In step S5, the dimension of the mask enhancers is adjusted so that a pattern having a desired dimension can be formed by exposure using a mask pattern having the pattern layout with the mask-enhancer arrangement of step S4.

In step S6, mask-pattern formation data corresponding to the mask pattern, mask-enhancer formation data corresponding to the pattern representing the mask enhancers, and light-shielding film region formation data corresponding to the remaining pattern, i.e., the mask pattern excluding the patterns representing the mask enhancers, are output based on the pattern layout dimensionally adjusted in step S5.

Hereinafter, steps S1 to S4 (the pattern-layout producing stage) will be specifically described with reference to FIGS. 31(a) to (d).

Figure 31A:
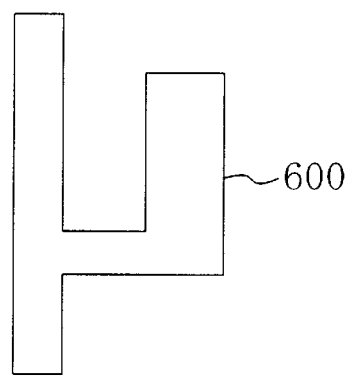
FIG. 31(a) is a diagram showing an example of pattern layout produced in step S1' of the pattern-layout producing method of the sixth embodiment of the invention.

FIG. 31(a) shows an example of the pattern layout produced in step S1.

Figure 31D:
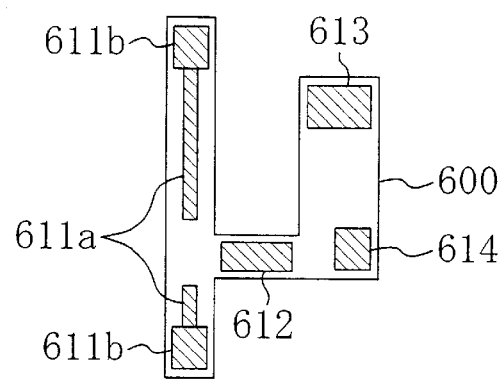
FIG. 31(d) is a diagram showing the pattern layout in which the mask enhancers are arranged with a dimension as determined based on the dimension of the line patterns and the like shown in FIG. 31(c) in step S4 of the pattern-layout producing method of the sixth embodiment of the invention.
Figure 31B:
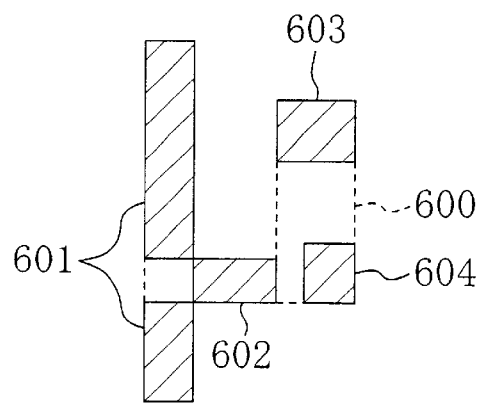
FIG. 31(b) is a diagram showing line patterns, pattern end and pattern corner extracted from the pattern layout of (a) in step S2 of the pattern-layout producing method of the sixth embodiment of the invention.

FIG. 31(b) shows the line patterns, pattern end and pattern corner extracted from the pattern layout of FIG. 31(a) in step S2. As shown in FIG. 31(b), line patterns 601 and 602 having a width L×M equal to or smaller than (0.8×λ/NA)×M, a pattern end 603, and a pattern corner 604 are extracted from the pattern layout 600.

Figure 31E:
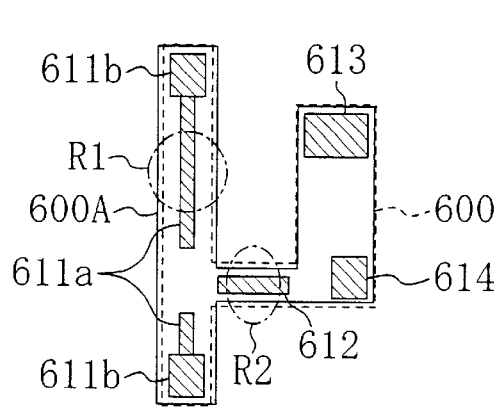
FIG. 31(e) is a diagram showing the pattern layout after dimensional adjustment of the mask enhancers of FIG. 31(d) in step S5 of the mask-writing data producing method of the sixth embodiment of the invention.
Figure 31C:
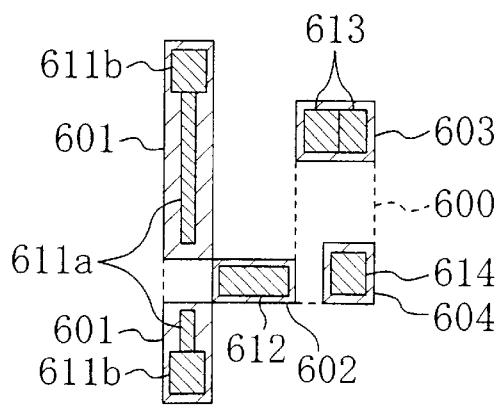
FIG. 31(c) is a diagram showing mask enhancers that are provided inside the line patterns and the like of FIG. 31(b) in step S3 of the pattern-layout producing method of the sixth embodiment of the invention.

FIG. 31(c) shows the mask enhancers that are provided inside the line patterns and the like of FIG. 31(b) in step S3. As shown in FIG. 31(c), line mask enhancers 611a are provided in the center of the line pattern 601, as well as end mask enhancers 611b are respectively provided at the ends of the line pattern 601. Moreover, a line mask enhancer 612 is provided in the center of the line pattern 602, end mask enhancers 613 are provided at the pattern end 603, and a corner mask enhancer 614 is provided in the pattern corner 604.

FIG. 31(d) shows the pattern layout in which the mask enhancers are arranged with a dimension as determined in step S4 based on the dimension of the line patterns and the like shown in FIG. 31(c).

More specifically, the line mask enhancers 611a and 612 having a width W×M defined by, e.g., W=((0.8×λ/NA)–L)/2 are respectively provided in the center of the line patterns 601 and 602 of the pattern layout 600 which have a width L×M equal to or smaller than (0.8×λ/NA)×M. It should be noted that, in the case where L is smaller than (0.8×λ/NA)/3, or in the case where a mask enhancer, i.e., an opening, having a width defined by W=((0.8×λ/NA)–L)/2 is to be produced but the line width of a light-shielding film region surrounding the opening would become smaller than a prescribed minimum possible line width to be produced by the mask writing apparatus, the line width of the light-shielding film region surrounding the mask enhancer is set to the aforementioned prescribed minimum possible line width, and the width of the mask enhancer is determined by subtracting the prescribed minimum possible line width from the width of the line pattern. In the case where the width of the mask enhancer is smaller than the minimum dimension required to produce the mask enhancer inside the light-shielding region, i.e., the aforementioned prescribed minimum possible line width, that mask enhancer is eliminated.

Note that, in the case of using the photomask producing methods of the third to fifth embodiments (including the modifications thereof), the aforementioned prescribed minimum possible line width corresponds to about an alignment margin of the mask writing apparatus.

In the case of using the photomask producing methods of the first and second modifications of the third embodiment, the line pattern of L<(0.8×λ/NA)/3 would provide the same effect as that of the line pattern having the mask enhancer structure, even if it is formed only from the phase shifter without any light-shielding film region.

In the ends of the line pattern 601, pattern end 603 and pattern corner 604 of the pattern layout 600, the end mask enhancers 611b, 613 and the corner mask enhancer 614 with four sides of (0.8×λ/NA)/3 ×M are provided such that each mask enhancer is surrounded by a light-shielding film region having at least the aforementioned minimum possible line width. In the case where the mask enhancers thus provided overlap each other, or in the case where the gap between the mask enhancers is smaller than the minimum distance required to form the mask enhancers separately from each other, the mask enhancers are connected together. If the dimension of the resultant mask enhancer becomes larger than (0.5×λ/NA)×M, the mask enhancer is reconfigured so as to have a dimension of (0.5×λ/NA)×M or less.

As has been described above, steps S1 to S4 enables production of the pattern layout in which a mask enhancer maximizing the light-shielding property is provided in the center of a line pattern having a degraded light-shielding property and also a mask enhancer is provided in a pattern corner and pattern end. Thus, approximately the same light-shielding property can be realized at least by the portion of the pattern layout having a width of about (0.8×λ/NA)/3×M or more.

Hereinafter, steps 55 and S6 (the mask-writing data producing stage) which are conducted after the mask enhancers and the pattern layout containing the same are produced in step S1 to S4 will be specifically described with reference to FIGS. 31(e) to 31(g).

FIG. 31(e) shows the pattern layout after dimensional adjustment of the mask enhancers of FIG. 31(d) in step S5.

More specifically, as shown in FIG. 31(e), in a portion having a pattern width smaller than the design value as a result of the test exposure (e.g., region R1), the width of a corresponding mask enhancer (e.g., the line mask enhancers 611a) is increased. On the other hand, in a portion having a pattern width larger than the design value as a result of the test exposure (e.g., region R2), the width of a corresponding mask enhancer (e.g., the line mask enhancer 612) is reduced. At this time, in addition to the dimension of the mask enhancers, the outer dimension of the pattern layout, i.e., the dimension of the mask pattern, may also be adjusted simultaneously. Note that, in FIG. 31(e), the dashed line represents the contour of the original pattern layout 600, and the solid line represents the contour of the dimensionally adjusted pattern layout 600A.

Figures 31F, 31G:
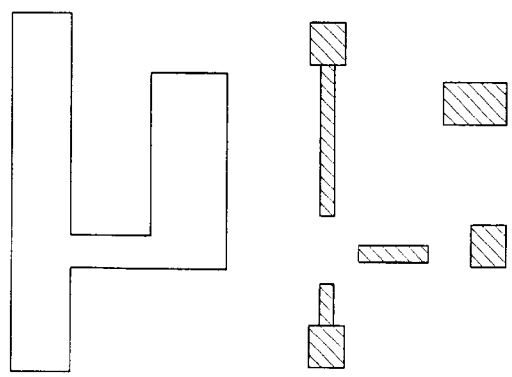
FIG. 31(f) is a diagram showing the mask-pattern formation data determined based on the dimensionally adjusted pattern layout of FIG. 31(e) in step S6 of the mask-writing data producing method of the sixth embodiment of the invention.
FIG. 31(g) shows the mask-enhancer formation data determined based on the dimensionally adjusted pattern layout of FIG. 31(e) in step S6 of the mask-writing data producing method of the sixth embodiment of the invention.
Figure 32A:
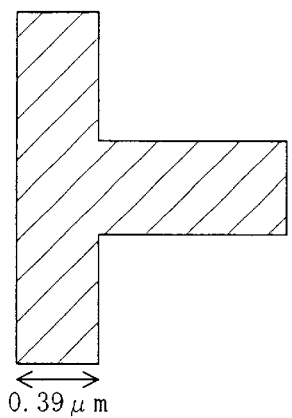
FIG. 32(a) is a diagram showing an example of a pattern hose minimum dimension is sufficiently larger than the resolution.
Figure 32B:
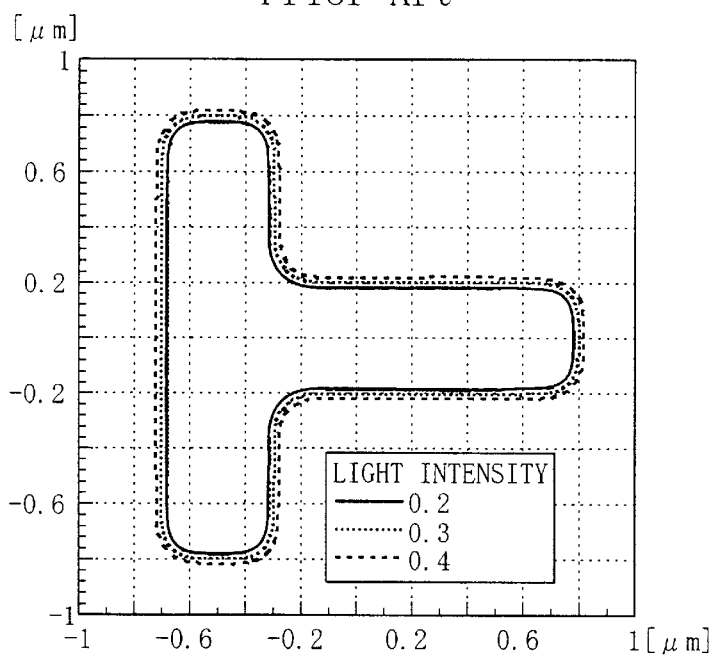
FIG. 32(b) is a diagram showing the simulation result of light intensity distribution projected upon forming the pattern of FIG. 32(a) using a conventional photomask.
Figure 33A:
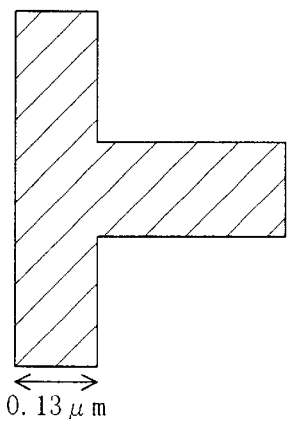
FIG. 33(a) is a diagram showing an example of a pattern whose minimum dimension corresponds to about the resolution.
Figure 33B:
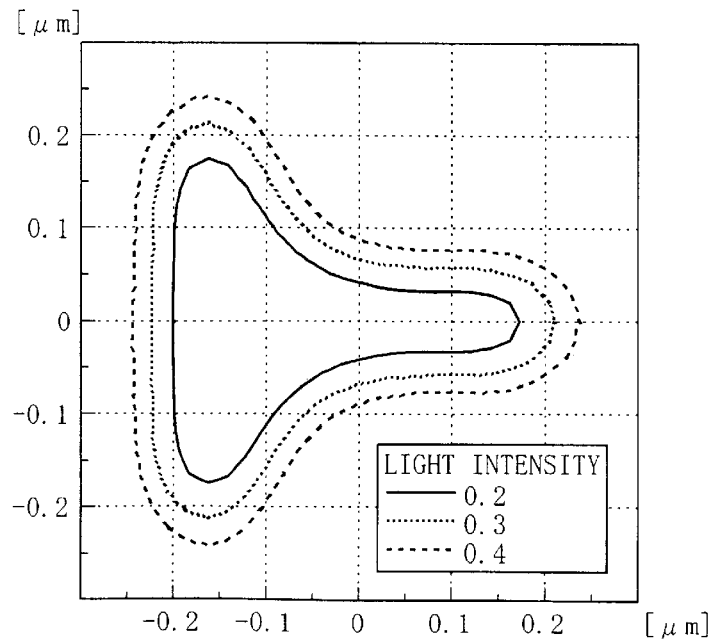
FIG. 33(b) is a diagram showing the simulation result of light intensity distribution projected upon forming the pattern of FIG. 33(a) using a conventional photomask.
Figure 34A:
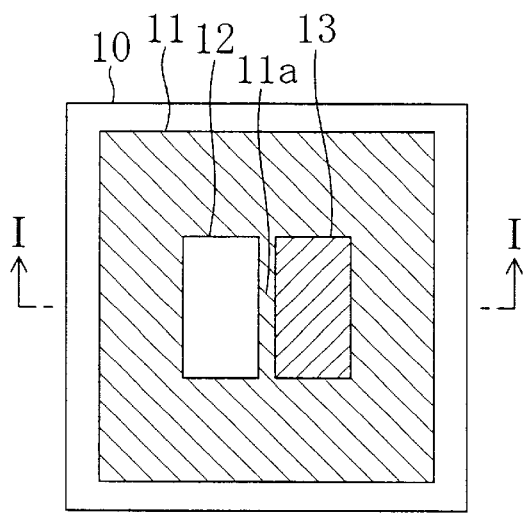
FIG. 34(a) is a plan view of a first photomask used in a patterning method of a first conventional example.
Figure 34C:
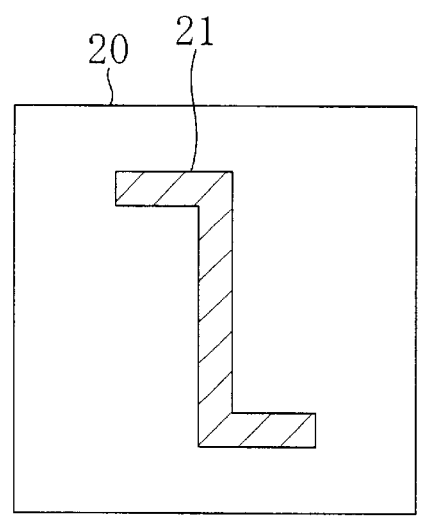
FIG. 34(c) is a plan view of a second photomask used in the patterning method of the first conventional example.
Figure 34B:
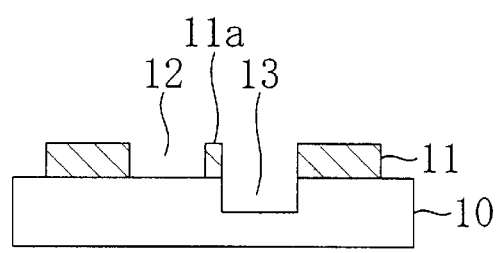
FIG. 34(b) is a cross-sectional view taken along line I—I of FIG. 34(a)
Figure 34D:
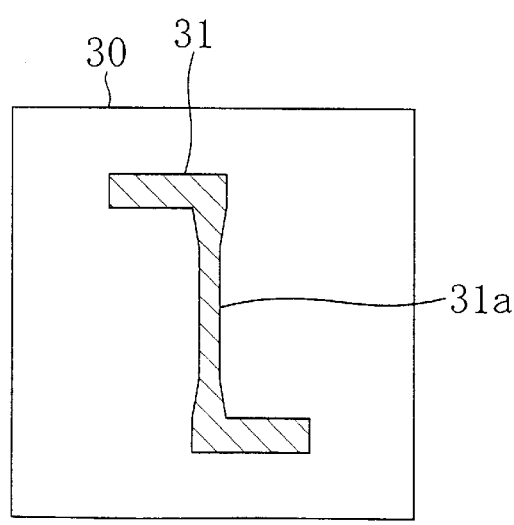
FIG. 34(d) is a diagram showing a resist pattern formed by the patterning method using the first and second photomasks of FIGS. 34(a) and 34(c)
Figure 35:
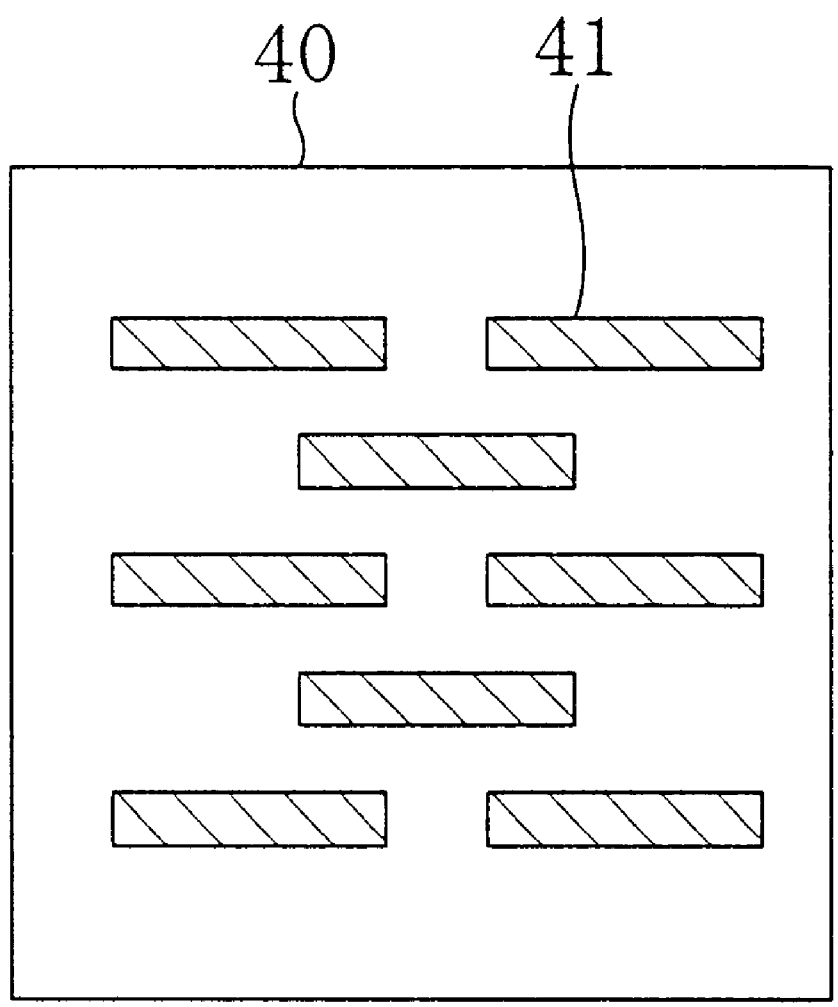
FIG. 35 is a plan view of a photomask used in a patterning method of a second conventional example.

FIG. 31(f) shows the mask-pattern formation data determined based on the dimensionally adjusted pattern layout of FIG. 31(e) in step S6, and FIG. 31(g) shows the mask-enhancer formation data determined based on the dimensionally adjusted pattern layout of FIG. 31(e) in step S6.

Note that, in the final photomask, the mask pattern excluding the patterns representing the mask enhancers corresponds to the light-shielding film region, and the patterns representing the mask enhancers correspond to the openings formed in the light-shielding film.

As has been described above, according to the pattern-layout producing method of the sixth embodiment, a line pattern having a width L×M equal to or smaller than (0.8×λ/NA)×M is extracted from the pattern layout 600 corresponding to the light-shielding pattern, and then a mask enhancer having a width W×M equal to or smaller than ((0.8×λ/NA)−L)×M is provided inside the line pattern. Therefore, the mask enhancer capable of enhancing the light-shielding effect can be provided in the portion of the light-shielding pattern having a degraded light-shielding effect, whereby the light intensity distribution can be projected onto the wafer with a less distorted profile with respect to the pattern layout. This enables production of the pattern layout of the photomask capable of forming any pattern feature with any dimension including a dimension equal to or smaller than about the resolution.

Moreover, according to the pattern-layout producing method of the sixth embodiment, provided that the mask enhancer has a width W×M, the value W is set to W=((0.8× λ/NA)−L)/2. Therefore, the light-shielding effect of the mask enhancer is maximized.

Moreover, according to the pattern-layout producing method of the sixth embodiment, a pattern end and pattern corner are also extracted upon extracting a line pattern, and a mask enhancer with four sides of (0.5×λ/NA)×M or less is provided inside the pattern end and pattern corner. Accordingly, the transmitted light reaching the backside of the pattern end or pattern corner of the light-shielding pattern due to the diffraction phenomenon can be reliably cancelled by the light transmitted through the mask enhancer.

Moreover, according to the mask-writing data producing method of the sixth embodiment, the dimension of the mask enhancer is adjusted based on the test exposure result after the mask enhancer is provided so as to maximize the light-shielding effect of the light-shielding pattern, that is, after the pattern-layout producing method of the sixth embodiment is conducted. Therefore, the dimension of the mask enhancer can be adjusted so that the dimension of the pattern resulting from exposure becomes equal to the design value. Accordingly, mask-writing data capable of preventing withdrawal of the pattern and the like can be produced, whereby a fine pattern can be accurately formed by exposure with the photomask formed according to the mask-writing data.

Moreover, according to the mask-writing data producing method of the sixth embodiment, the width of a mask enhancer corresponding to a portion having a pattern width larger than the design value as a result of the exposure is reduced, whereas the width of a mask enhancer corresponding to a portion having a pattern width smaller than the design value as a result of exposure is increased. This ensures that the pattern resulting from exposure has a width equal to the design value.

Note that, in the pattern-layout producing method of the sixth embodiment, provided that the width of the line pattern is L×M and the width of the mask enhancer is W×M, the light-shielding effect of the line pattern including the mask enhancer is maximized by using W=((0.8×λ/NA)−L)/2. However, the mask enhancer has a sufficient effect of improving the light-shielding property even when 0.5× ((0.8×λ/NA)−L)/2·W·1.5×((0.8×λ/NA)−L)/2) (where W×L or W·L−2E; (E×M) is the minimum possible dimension to be implemented on the photomask). The mask enhancer has the effect of improving the light-shielding property at least when W·(0.8×λ/NA)−L (where W·L or W·L−2E).

Moreover, in the mask-writing data producing method of the sixth embodiment, the dimension of the mask enhancer is adjusted based on the test exposure result. Alternatively, the dimension of the mask enhancer may be adjusted based on the exposure simulation result.

What is claimed is:

1. A photomask including an isolated light-shield pattern formed on a transparent substrate that is transparent to an exposure light, characterized in that the light-shielding pattern is formed from a light-shielding film region formed from a light-shielding film, and a phase shift region having an opposite phase with respect to a light-transmitting region of the transparent substrate which has no light-shielding pattern, the light-shielding pattern includes at least a first light-shielding pattern having a first width and a second light-shielding pattern having a second width larger than the first width, a first phase region, which is part of the phase shift region and is surrounded by the light-shielding film region, is provided in a portion of the first light-shielding pattern, and only the light-shielding film region is provided in the second light-shielding pattern.

2. The photomask according to claim 1, characterized in that a contour of the light-shielding film region is the same as a feature of the light-shielding pattern.

3. The photomask according to claim 1, characterized in that the light-shielding pattern further includes a third light-shielding pattern having a corner or an end, and a second phase shift region, which is part of the phase shift region, is provided at or inside the corner of the third light-shielding pattern, or at or inside the end of the third light-shielding pattern.

4. The photomask according to claim 1, characterized in that, provided that the first phase shift region has a width Wm, $Wm \leq (0.4 \times \lambda/NA) \times M$, where $\lambda$ is a wavelength of the exposure light, NA is a numerical aperture of a reduction projection optical system of an aligner, and M is a magnification of the reduction projection optical system.

5. The photomask according to claim 1, characterized in that, provided that the first light-shielding pattern has the first width Lm, $Lm \leq (0.8 \times \lambda/NA) \times M$.

6. The photomask according to claim 5, character in that, provided that the first phase shift region has a width Wm, $Wm \leq ((0.8 \times \lambda/NA) \times M) - Lm$ and $Wm \leq Lm$.

7. The photomask according to claim 5, characterized in that, provided that the first phase shift region has a width Wm, $\leq 0.5 \times ((((0.8 \times \lambda/NA) \times M) - Lm)/2) \leq Wm - \leq 1.5 \times ((((0.8 \times \lambda/NA) \times M) - Lm)/2$ and $Wm \leq Lm$.

8. The photomask according to claim 5, characterized in that, provided that the second light-shielding pattern has the second width Lm2, $Lm2 > (0.8 \times \lambda/NA) \times M$.

9. The photomask according to claim 1, characterized in that the phase difference of the phase shift region with respect to the light-transmitting region is $(170+360 \times n)$ to $(190+360 \times n)$ degrees, where n is an integer with respect to a wavelength of the exposure light.

10. The photomask according to claim 1, characterized in that the phase difference of the phase shift region with respect to the light-transmitting region is provided by etching the phase-shift region in the transparent substrate.

11. The photomask according to claim 1, characterized in that the phase difference of the phase shift region with respect to the light-transmitting region is provided by forming a phase shifter layer on a portion other than the light-transmitting region in the transparent substrate, and the phase shifter layer is formed under the light-shielding film region.

12. The photomask according to claim 1, characterized in that the difference of the phase shift region with respect to the light-transmitting region is provided by forming a phase shifter layer on a portion other than the light-transmitting region in the transparent substrate, and the phase shifter layer is formed above the light-shielding film region.

13. The photomask according to claim 1, characterized in that the difference of the phase shift region with respect to the light-transmitting region is provided by etching the light-transmitting region in the parent substrate.

14. A photomask including an isolated light-shielding pattern formed on a transparent substrate that is transparent to an exposure light, characterized in that the light-shielding pattern is formed from a light-shielding film region formed from a light-shielding film, and a phase shift region having an opposite phase with respect to a light-transmitting region of the transparent substrate which has no light-shielding pattern, the light-shielding pattern includes a first light-shielding pattern having a width Lm equal to or smaller than $0.18 \times M$, where the unit is $\mu m$: M is a magnification of the reduction projection optical system of an aligner, a first phase shift region, which is part of the phase shift region and is surrounded by the light-shielding film region, is provided in a portion of the first light-shielding pattern.

15. The photomask according to claim 14, characterized in that a contour of the light-shielding film region is the same as a feature of the light-shielding pattern.

16. The photomask according to claim 14, characterized in that the light-shielding pattern further includes a second light-shielding pattern having a corner or an end, and a second phase shift region, which is part of the phase shift region, is provided at or inside the corner of the second light-shielding pattern, or at or inside the end of the second light-shielding pattern.

17. The photomask according to claim 14, characterized in that, provided that the first phase shift region has a width Wm, $Wm \leq ((0.8 \times \lambda/NA) \times M) - Lm$ and $Wm \leq Lm$, where $\lambda$ is a wavelength of the exposure light, NA is a numerical aperture of a reduction projection optical system of an aligner, and M is a magnification of the reduction projection optical system.

18. The photomask according to claim 14, characterized in that, provided that the first phase shift region has a width Wm, $0.5 \times ((((0.8 \times \lambda/NA) \times M) - Lm)/2) \leq Wm \leq 1.5 \times (((0.8 \times \lambda/NA) \times M) - Lm)/2)$ and $Wm \leq Lm$.

19. The photomask according to claim 14, characterized in that the phase difference of the phase shift region with respect to the light-transmitting region is $(170+360 \times n)$ to $(190+360 \times n)$ degrees, where n is an integer, with respect to a wavelength of the exposure light.

20. The photomask according to claim 14, characterized in that the phase difference of the phase shift region with respect to the light-transmitting region is provided by etching the phase-shift region in the transparent substrate.

21. The photomask according to claim 14, characterized in that the phase difference of the phase shift region with respect to the light-transmitting region is provided by etching the light-transmitting region in the transparent substrate.

22. The photomask according to claim 14, characterized in that the phase difference of the phase shift region with respect to the light-transmitting region is provided by forming a phase shifter layer on a portion other than the light-transmitting region in the transparent substrate, and the phase shifter layer is formed under the light-shielding film region.

23. The photomask according to claim 14, characterized in that the phase difference of the phase shift region with respect to the light-transmitting region is provided by forming a phase shifter layer on a portion other than the light-transmitting region in the transparent substrate, and the phase shifter layer is formed above the light-shielding film region.

* * * * *

UNITED STATES PATENT AND TRADEMARK OFFICE
CERTIFICATE OF CORRECTION

PATENT NO. : 6,703,168 B1
DATED : March 9, 2004
INVENTOR(S) : Misaka, Akio

It is certified that error appears in the above-identified patent and that said Letters Patent is hereby corrected as shown below:

Title page,
Item [56], References Cited, U.S. PATENT DOCUMENTS, insert:
-- 5,354,632    8/1994  Dao et al.
5,908,718    6/1999  Ishida et al. --
FOREIGN PATENT DOCUMENTS, insert:
-- EP 0 401 795 A    12/1990 --
OTHER PUBLICATIONS, insert:
-- European Search Report dated December 18, 2002
H.Y. Liu et al. "The Application of Alternating Phase-shifting Masks to 140nm Gate Patterning (II): Mask Design and Manufacturing Tolerances", Proceedings of SPIE, Vol. 3334, pp. 2-14, February 1998 --.

H. Watanabe et al., "Transparent Phase Mask", The 51th Annual Technical Meeting of The Japan Society of Applied Physics, 27p-ZG-1, p. 490, September 1990, along with an English Translation thereof --

Column 49,
Line 50 and 51, change "$Wm, \leq 0.5x\ ((((0.8x\lambda/NA)xM)-Lm)/2) \leq Wm - \leq 1.5x((((0.8x\lambda/NA)xM)-LM)/2$ and $Wm \leq Lm$" to -- $Wm, 0.5x\ ((((0.8x\lambda/NA)xM)-Lm)/2) \leq Wm \leq 1.5x\ ((((0.8x\lambda/NA)xM)-LM)/2$ and $Wm \leq Lm$. --

Column 50,
Line 8, change "the difference of" to -- the phase difference of --

Signed and Sealed this

Twenty-fifth Day of January, 2005

JON W. DUDAS
*Director of the United States Patent and Trademark Office*